US012740061B2

(12) United States Patent
Rashidi et al.

(10) Patent No.: US 12,740,061 B2
(45) Date of Patent: Sep. 15, 2026

(54) THREE-DIMENSIONAL MEMORY DEVICE CONTAINING MULTI-LEVEL SUPPORT BRIDGE STRUCTURES AND METHODS FOR FORMING THE SAME

(71) Applicant: SANDISK TECHNOLOGIES LLC, Addison, TX (US)

(72) Inventors: Seyyed Ehsan Esfahani Rashidi, San Jose, CA (US); Yanli Zhang, San Jose, CA (US); Koichi Matsuno, Fremont, CA (US); James Kai, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 415 days.

(21) Appl. No.: 18/450,791

(22) Filed: Aug. 16, 2023

(65) Prior Publication Data

US 2024/0155841 A1 May 9, 2024

Related U.S. Application Data

(60) Provisional application No. 63/383,001, filed on Nov. 9, 2022.

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 43/27; H10B 41/27; H10B 41/10; H10B 41/50; H10B 43/40; H10B 43/50; H10B 43/10
See application file for complete search history.

(56) References Cited

U.S. PATENT DOCUMENTS 9,679,906 B2 6/2017 Lu et al.
11,380,707 B2 7/2022 Matsuno et al.
(Continued)

FOREIGN PATENT DOCUMENTS

KR 10-2022-0114917 8/2022
KR 20220114917 A 8/2022

OTHER PUBLICATIONS

IPRP-WO—Notification Concerning Transmittal of International Preliminary Report on Patentability and Written Opinion of the International Searching Authority for International Patent Application No. PCT/US2023/076931, mailed May 22, 2025, 6 pages.
(Continued)

*Primary Examiner* — Mark W Tornow
(74) *Attorney, Agent, or Firm* — THE MARBURY LAW GROUP PLLC

(57) ABSTRACT

A semiconductor structure includes alternating stacks of insulating layers and electrically conductive layers which are located over a substrate and are laterally spaced apart from each other by first backside trenches and second backside trenches that are interlaced along a horizontal direction, first backside trench fill structures located in the first backside trenches, and second backside trench fill structures located in the second backside trenches. Each of the first backside trench fill structures includes a respective set of first backside support bridge structures located at a first vertical spacing from the substrate, and each of the second backside trench fill structures includes a respective set of second backside support bridge structures located at a second vertical spacing from the substrate that is different from the first vertical spacing.

7 Claims, 80 Drawing Sheets

(56) References Cited

U.S. PATENT DOCUMENTS

| | | | | |
|---|---|---|---|---|
| 11,450,685 | B2 | 9/2022 | Yoshida | |
| 11,532,570 | B2 | 12/2022 | Mizuno et al. | |
| 2017/0047334 | A1* | 2/2017 | Lu | H10B 41/27 |
| 2019/0115356 | A1* | 4/2019 | Lee | H10B 43/27 |
| 2021/0202324 | A1 | 7/2021 | Scarbrough et al. | |
| 2021/0233801 | A1 | 7/2021 | Billingsley et al. | |
| 2022/0165747 | A1* | 5/2022 | Yang | H10B 41/10 |
| 2022/0223614 | A1 | 7/2022 | Takuma et al. | |
| 2022/0254728 | A1 | 8/2022 | Matsuno et al. | |
| 2022/0254733 | A1 | 8/2022 | Mizuno et al. | |
| 2022/0328512 | A1 | 10/2022 | Tanaka et al. | |
| 2023/0013984 | A1 | 1/2023 | Otsu | |
| 2023/0055230 | A1 | 2/2023 | Itou et al. | |
| 2023/0057885 | A1 | 2/2023 | Itou et al. | |

OTHER PUBLICATIONS

ISR—Notification of Transmittal of The International Search Report and Written Opinion of the International Searching Authority for International Patent Application No. PCT/US2023/076931, mailed Feb. 15, 2024, 7 pages.

Endoh et al., "Novel Ultra High-Density Memory with a Stacked-Surrounding Gate Transistor (S-SGT) Structured Cell," IEDM Proc. (2001) 33-36.

U.S. Appl. No. 17/819,081, filed Aug. 11, 2022, SanDisk Technologies LLC.

U.S. Appl. No. 17/819,097, filed Aug. 11, 2022, SanDisk Technologies LLC.

U.S. Appl. No. 17/936,479, filed Sep. 29, 2022, SanDisk Technologies LLC.

* cited by examiner

THREE-DIMENSIONAL MEMORY DEVICE CONTAINING MULTI-LEVEL SUPPORT BRIDGE STRUCTURES AND METHODS FOR FORMING THE SAME

FIELD

The present disclosure relates generally to the field of semiconductor devices, and particularly to a three-dimensional memory device including multi-level support bridge structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprises alternating stacks of insulating layers and electrically conductive layers located over a substrate, wherein each of the alternating stacks laterally extends along a first horizontal direction, wherein the alternating stacks are laterally spaced apart from each other along a second horizontal direction by backside trenches that laterally extend along the first horizontal direction, and wherein the backside trenches comprise first backside trenches and second backside trenches that are interlaced along the second horizontal direction perpendicular to the first horizontal direction; first backside trench fill structures located in the first backside trenches, wherein each of the first backside trench fill structures comprises a respective set of first backside support bridge structures located at a first vertical spacing from the substrate; and second backside trench fill structures located in the second backside trenches, wherein each of the second backside trench fill structures comprises a respective set of second backside support bridge structures located at a second vertical spacing from the substrate that is different from the first vertical spacing, and wherein the second backside trenches do not include the first backside support trench fill structures located at the first vertical spacing from the substrate.

According to another aspect of the present disclosure, a method of forming a semiconductor structure comprises: forming at least one vertically alternating sequence of continuous insulating layers and continuous sacrificial material layers; forming lower-level backside trenches through the at least one vertically alternating sequence, wherein remaining portions of the at least one vertically alternating sequence comprise lower alternating stacks of insulating layers and sacrificial material layers; forming first backside bridge support structures in a first subset of the lower-level backside trenches without forming any backside bridge support structure in a second subset of the lower-level backside trenches; forming an additional alternating sequence of additional continuous insulating layers and additional continuous sacrificial material layers; forming upper-level backside trenches through the additional vertically alternating sequence, wherein remaining portions of the additional vertically alternating sequence comprise upper alternating stacks of additional insulating layers and additional sacrificial material layers; and forming second backside bridge support structures in a second subset of the upper-level backside trenches.

DETAILED DESCRIPTION

Figure 1:
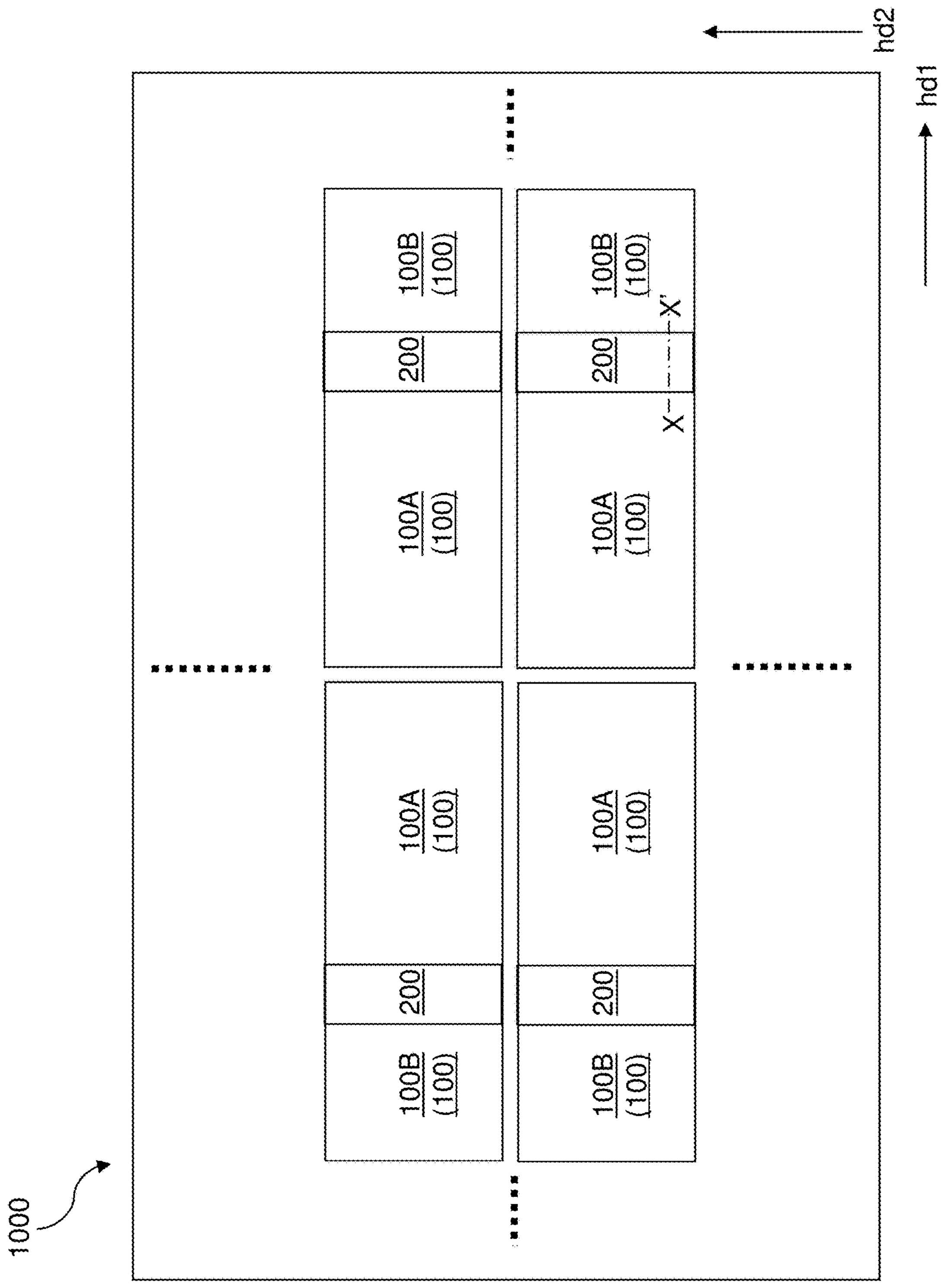
FIG. 1 is a plan view of an exemplary semiconductor die including multiple three-dimensional memory array regions according to an embodiment of the present disclosure.

As discussed above, the embodiments of the present disclosure are directed to a three-dimensional memory device including multi-level support bridge structures and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or from each other, the two elements are “disjoined from” each other or “disjoined among” one another. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, a first element is “electrically connected to” a second element if there exists a conductive path consisting of at least one conductive material between the first element and the second element. As used herein, a “prototype” structure or an “in-process” structure refers to a transient structure that is subsequently modified in the shape or composition of at least one component therein.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are “vertically coincident” with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a “memory level” or a “memory array level” refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a “through-stack” element refers to an element that vertically extends through a memory level.

As used herein, a “semiconducting material” refers to a material having electrical conductivity in the range from $1.0\times10^{-5}$ S/m to $1.0\times10^{5}$ S/m. As used herein, a “semiconductor material” refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an “electrical dopant” refers to a p-type dopant that adds a hole to a valence band within a band structure, or an n-type dopant that adds an electron to a conduction band within a band structure. As used herein, a “conductive material” refers to a material having electrical conductivity greater than $1.0\times10^{5}$ S/m. As used herein, an “insulator material” or a “dielectric material” refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a plan view of an exemplary semiconductor die 1000 according to an embodiment of the present disclosure is illustrated. The exemplary semiconductor die 1000 includes multiple three-dimensional memory array regions and multiple inter-array regions. The first exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Figure 2:
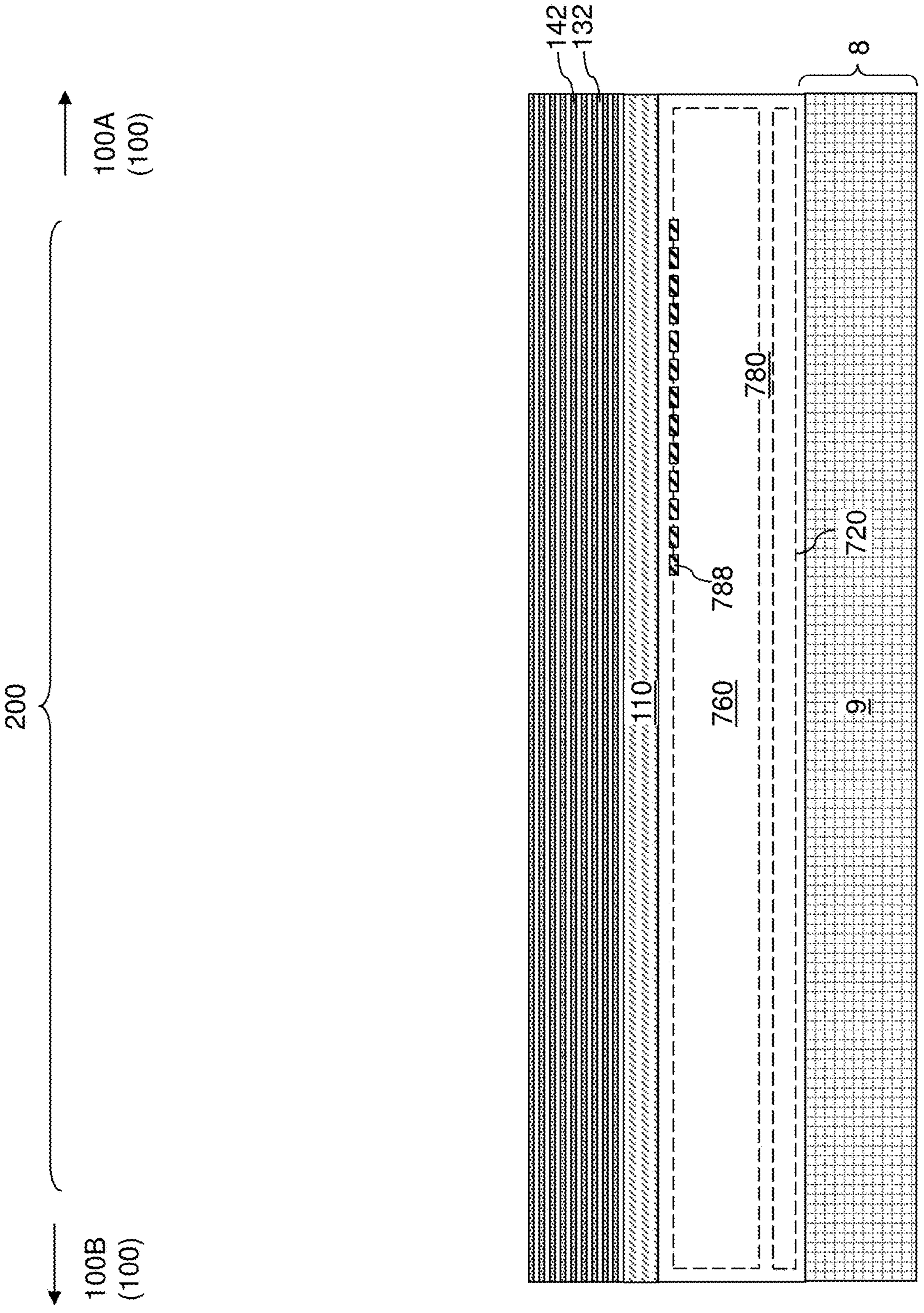
FIG. 2 is a vertical cross-sectional view of an exemplary structure after formation of optional semiconductor devices, optional lower level dielectric layers, optional lower metal interconnect structures, a semiconductor material layer, and a first vertically alternating sequence of first continuous insulating layers and first continuous sacrificial material layers according to an embodiment of the present disclosure.

Referring to FIG. 2, a vertical cross-sectional view of an exemplary structure is illustrated. The cut plane of the vertical cross-sectional view of FIG. 2 corresponds to the vertical plane X-X' in FIG. 1. The exemplary structure comprises a substrate 8 (e.g., silicon wafer or another substrate) including a substrate semiconductor layer 9 (e.g., doped well in the silicon wafer or a silicon layer located on the substrate 8). Semiconductor devices 720 can be formed on the substrate semiconductor layer 9. In one embodiment, the semiconductor devices 720 may comprise a peripheral circuit configured to control operation of a three-dimensional memory device to be subsequently formed. Lower-level dielectric material layer 760 embedding lower-level metal interconnect structures 780 (not individually shown) may be formed over the semiconductor devices 720. In some embodiments, the lower-level metal interconnect structures 780 may comprise metal pads 788 configured to be subsequently connected to connection via structures and electrically connected to a respective node of the semiconductor devices 720 through a subset of the lower-level metal interconnect structures 780.

In an alternative embodiment, the peripheral circuit containing the semiconductor devices 720 may be formed on a separate substrate that is part of a logic die. The logic may be subsequently bonded to a memory die containing a three-dimensional memory device formed over the substrate 8.

A semiconductor material layer 110 can be formed over the lower-level dielectric material layers 760 by deposition of a semiconductor material or by transfer of the semiconductor material layer 110 employing a carrier substrate (not shown). The semiconductor material layer 110 may comprise a polycrystalline semiconductor material layer or a single crystalline semiconductor material layer. The thickness of the semiconductor material layer 110 may be in a range from 100 nm to 2,000 nm, although lesser and greater thicknesses may also be employed.

A first vertically alternating sequence of first insulating layers 132 and first sacrificial material layers 142 can be formed over the semiconductor material layer 110. Each of the first insulating layers 132 may be formed as single continuous material layer, and thus, may be referred to as a first continuous insulating layer. Each of the first sacrificial material layers 142 may be formed as a single continuous material layer, and thus, may be formed as a first continuous sacrificial material layer. Each of the first insulating layers 132 and the first sacrificial material layers 142 may have a thickness in a range from 20 nm to 80 nm, although lesser and greater thicknesses may also be employed. In one embodiment, the first vertically alternating sequence of first insulating layers 132 and first sacrificial material layers 142 may include a periodic repetition of a unit layer stack including a first insulating layer 132 and a first sacrificial material layer 142. The total number of repetitions of the unit layer stack may be in a range from 4 to 1,024, such as from 16 to 256, although lesser and greater numbers of repetition may also be employed. The first insulating layers 132 may comprise, and/or may consist essentially of, an insulating material such as undoped silicate glass or a doped silicate glass. The first sacrificial material layers 142 may comprise, and/or may consist essentially of, a sacrificial material such as silicon nitride, a silicon-germanium alloy, organosilicate glass, or a polymer material. Generally, the first sacrificial material layers 142 comprise a material that may be removed selective to the materials of the first insulating layers 132 and the semiconductor material layer 110.

Figure 3A:
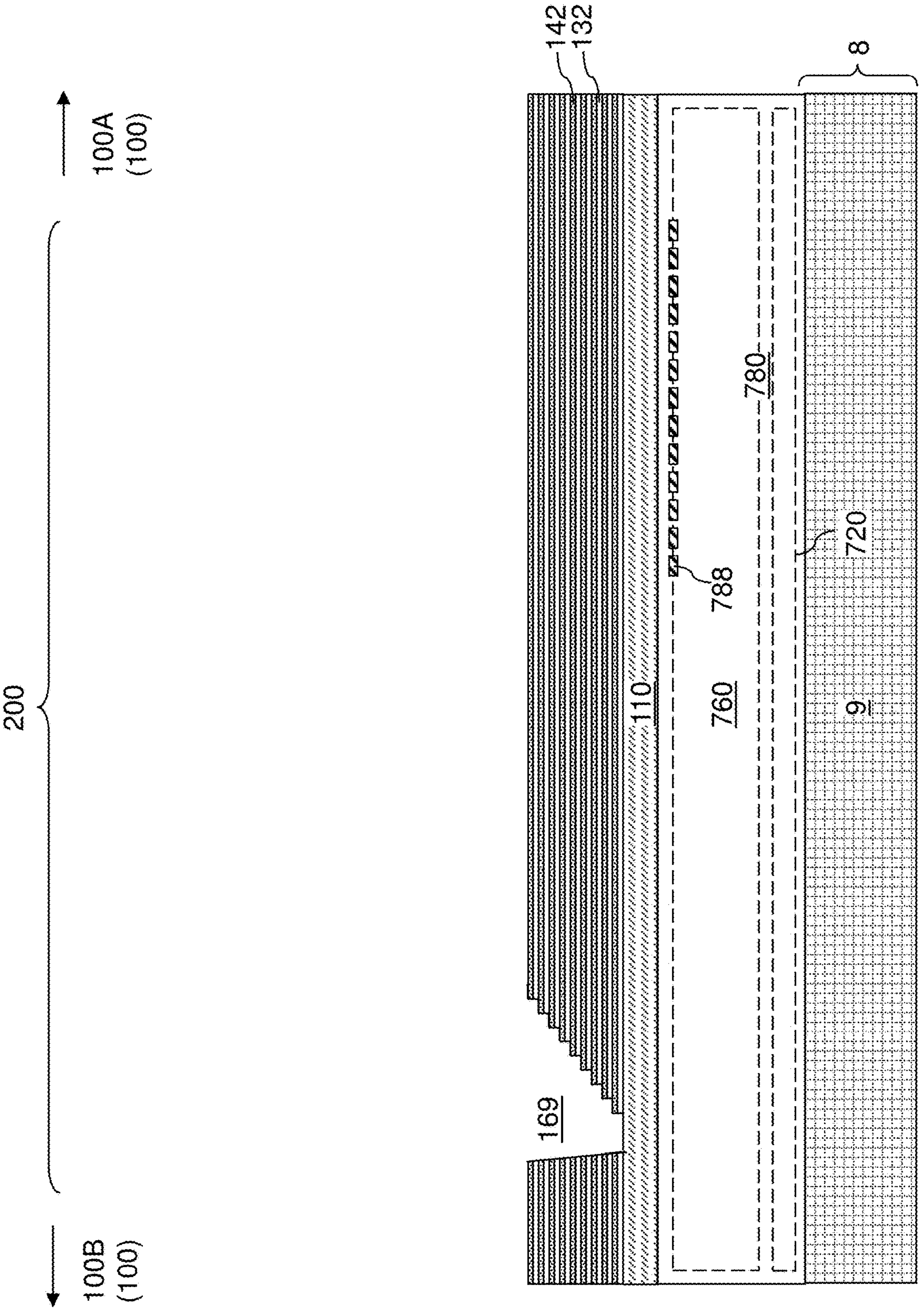
FIG. 3A is a vertical cross-sectional view of the exemplary structure along the first horizontal direction after formation of first stepped surfaces according to an embodiment of the present disclosure.
Figure 3B:
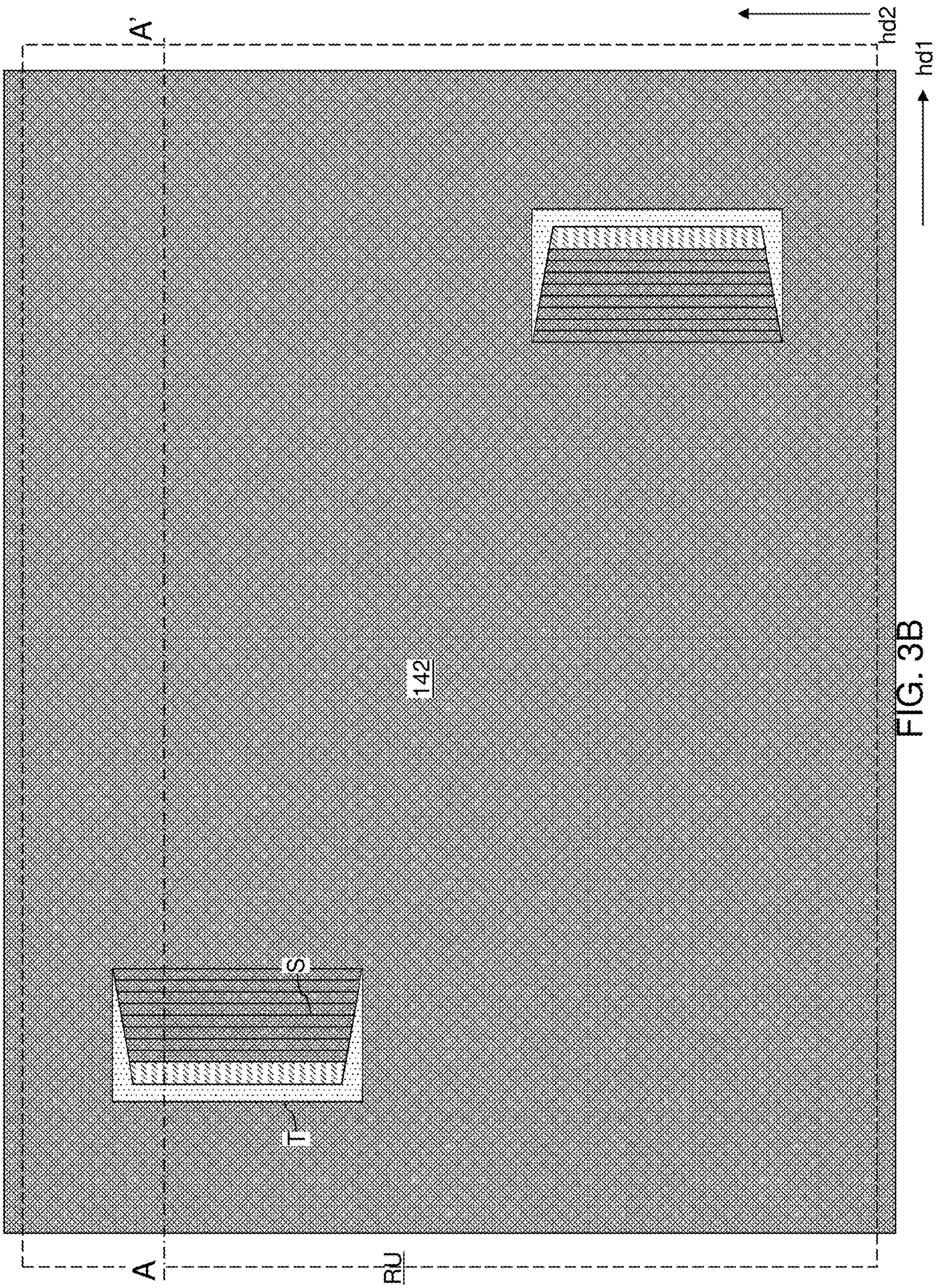
FIG. 3B is a top-down view of the exemplary structure of FIG. 3A. The vertical plane A-A' is the plane of the vertical cross-sectional view of FIG. 3A.

Referring to FIGS. 3A and 3B, a first patterned hard mask layer (not shown) may be formed over the first vertically alternating sequence (132, 142) to define areas in which first stepped surfaces are to be subsequently formed. A first trimmable etch mask layer (not shown) can be formed over the first patterned hard mask layer, and can be lithographically patterned to form slit-shaped openings over peripheral regions of the openings in the first patterned hard mask layer. A unit processing sequence can be repeated performed to form first stepped surfaces in the first vertically alternating sequence (132, 142) within the areas of openings in the first patterned hard mask layer. For example, the unit processing sequence may comprise an anisotropic etch process that etches a pair of a first insulating layer 132 and a first sacrificial material layer 142 and a trimming process that isotropically trims the first trimmable etch mask layer. The number of repetitions of the unit processing sequence may be the same as the total number of first sacrificial material layers 142 in the first vertically alternating sequence (132, 142). A first stepped cavity 169 overlying a respective set of first stepped surfaces of the first vertically alternating sequence (132, 142) can be formed within each patterned area of the first vertically alternating sequence (132, 142).

In one embodiment, the first stepped cavities 169 may be arranged along the second horizontal direction (e.g., bit line direction) hd2 with a stagger along the first horizontal direction (e.g., word line direction) hd1. In one embodiment, upon sequentially numbering the first stepped cavities 169 from one side to another along the second horizontal direction hd2 with positive integers beginning with 1 and incrementing by 1, each odd-numbered first stepped cavity 169 may be laterally offset along the first horizontal direction hd1 relative to the even-numbered first stepped cavities 169. In one embodiment, each pattern for odd-numbered first stepped cavity 169 may be a mirror image pattern of an even-numbered first stepped cavity 169 in a top-down view. In one embodiment shown in FIG. 3B, the exemplary structure may include multiple instances of a repetition unit RU that is repeated along the second horizontal direction hd2.

In one embodiment, the lateral extent of the layers of the first alternating sequence (132, 142) along a first horizontal direction hd1 may decreases with a vertical distance from the substrate 8 within each region including a respective set of first stepped surfaces. In one embodiment, each opening in the topmost layer of the first vertically alternating sequence (132, 142) may have a rectangular shape having a pair of lengthwise sides laterally extending along the first horizontal direction hd1 and a pair of widthwise sides laterally extending along a second horizontal direction hd2 that is perpendicular to the first horizontal direction hd1. Each set of first stepped surface may comprise vertical steps S. Tapered surfaces T may be formed around each first stepped cavity between the stepped surfaces and the topmost horizontal surface of the first vertically alternating sequence (132, 142). Alternative schemes employing repetition of an etch step and a trimming step may be employed to pattern portions of the first vertically alternating sequence (132, 142) that are not masked by the first patterned hard mask layer. The first trimmable etch mask layer and the first patterned hard mask layer can be subsequently removed.

Figure 4A:
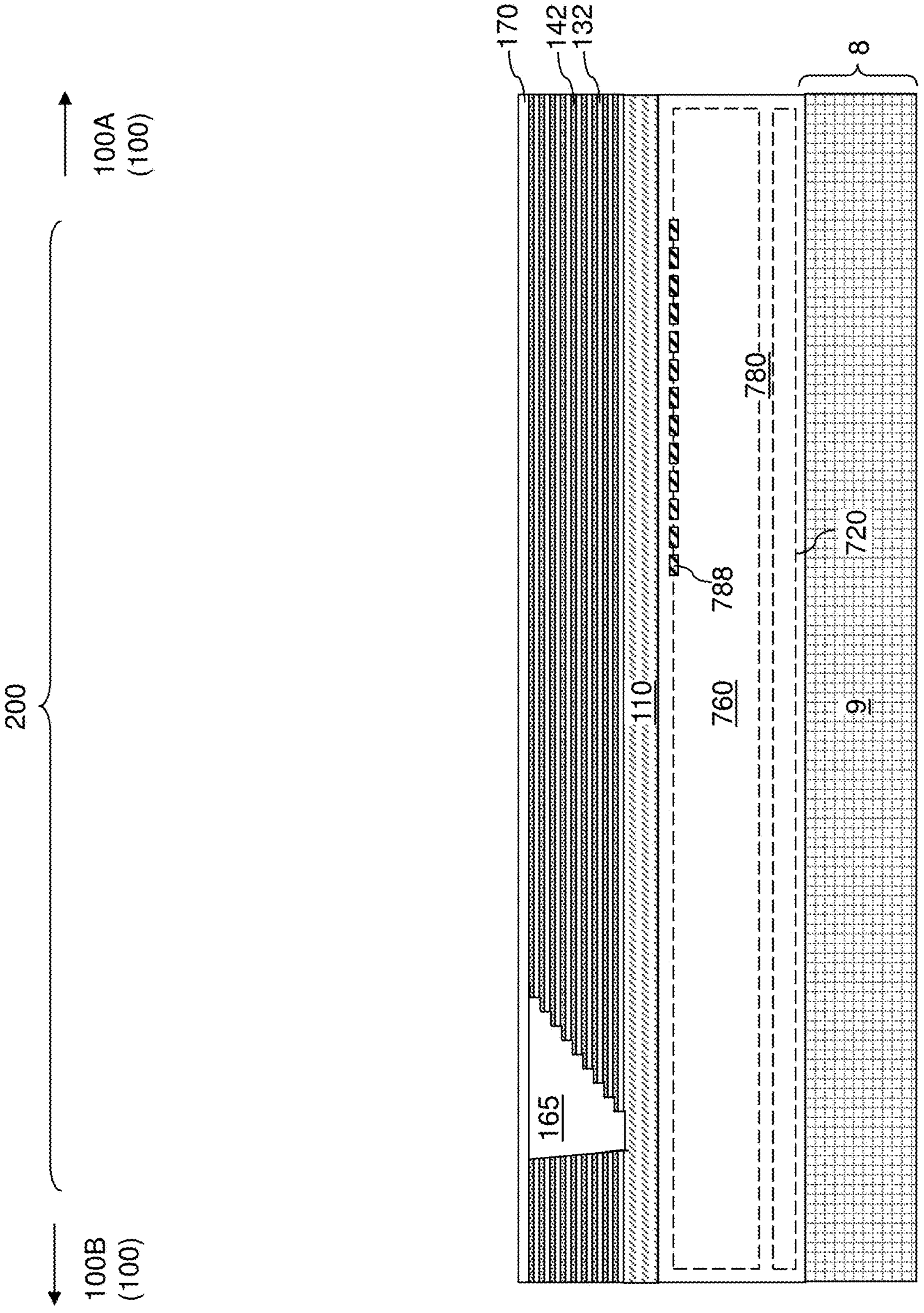
FIG. 4A is a vertical cross-sectional view of the exemplary structure along the first horizontal direction after formation of first retro-stepped dielectric material portions and a first insulating cap layer according to an embodiment of the present disclosure.
Figure 4B:
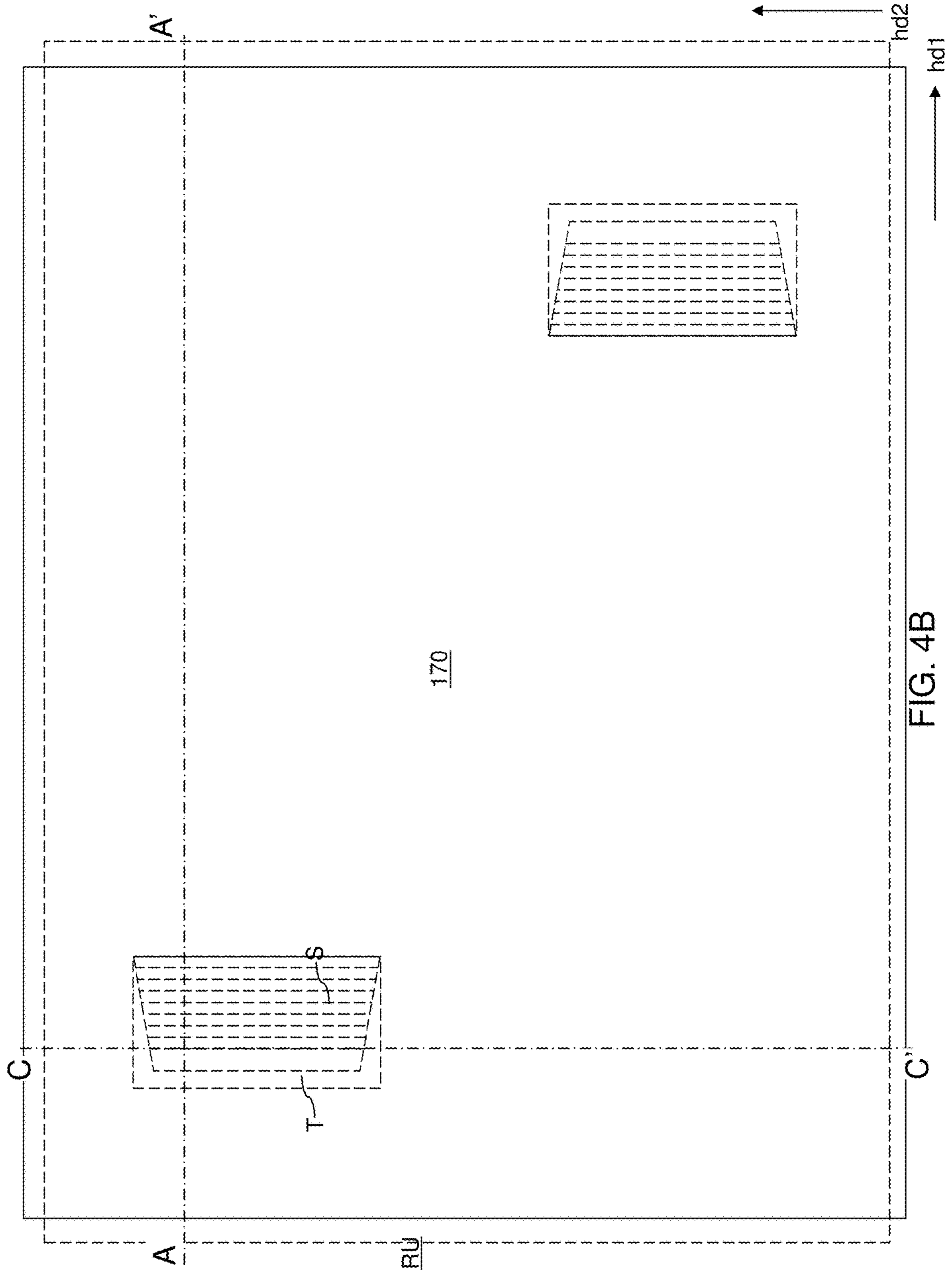
FIG. 4B is a top-down view of the exemplary structure of FIG. 4A. The vertical plane A-A' is the plane of the vertical cross-sectional view of FIG. 4A.
Figure 4C:
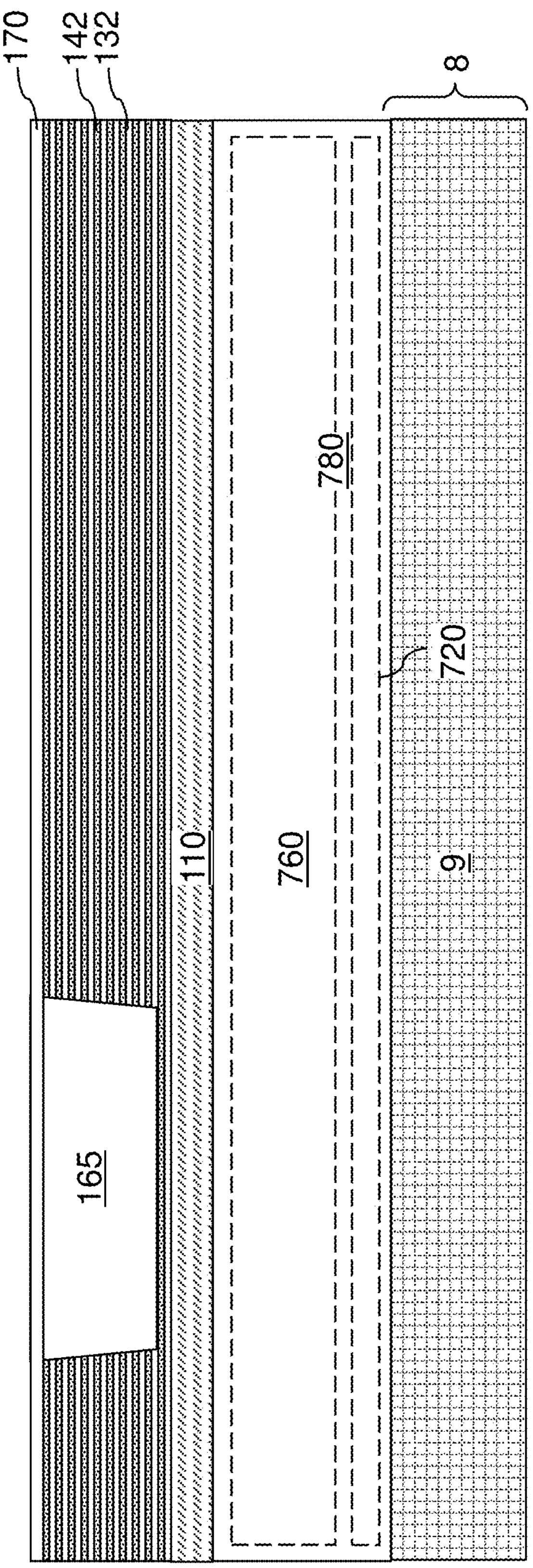
FIG. 4C is a vertical cross-sectional view of the exemplary structure along the vertical plane C-C' of FIG. 4B.

Referring to FIGS. 4A-4C, a dielectric fill material can be deposited within each of the first stepped cavities 169 to form first retro-stepped dielectric material portions 165. An insulating capping material can be deposited over the first vertically alternating sequence (132, 142) and the first retro-stepped dielectric material portions 165 to form a first insulating cap layer 170. A first-tier structure is formed, which comprises the first vertically alternating sequence (132, 142), the first retro-stepped dielectric material portions 165, and the first insulating cap layer 170.

Figure 5A:
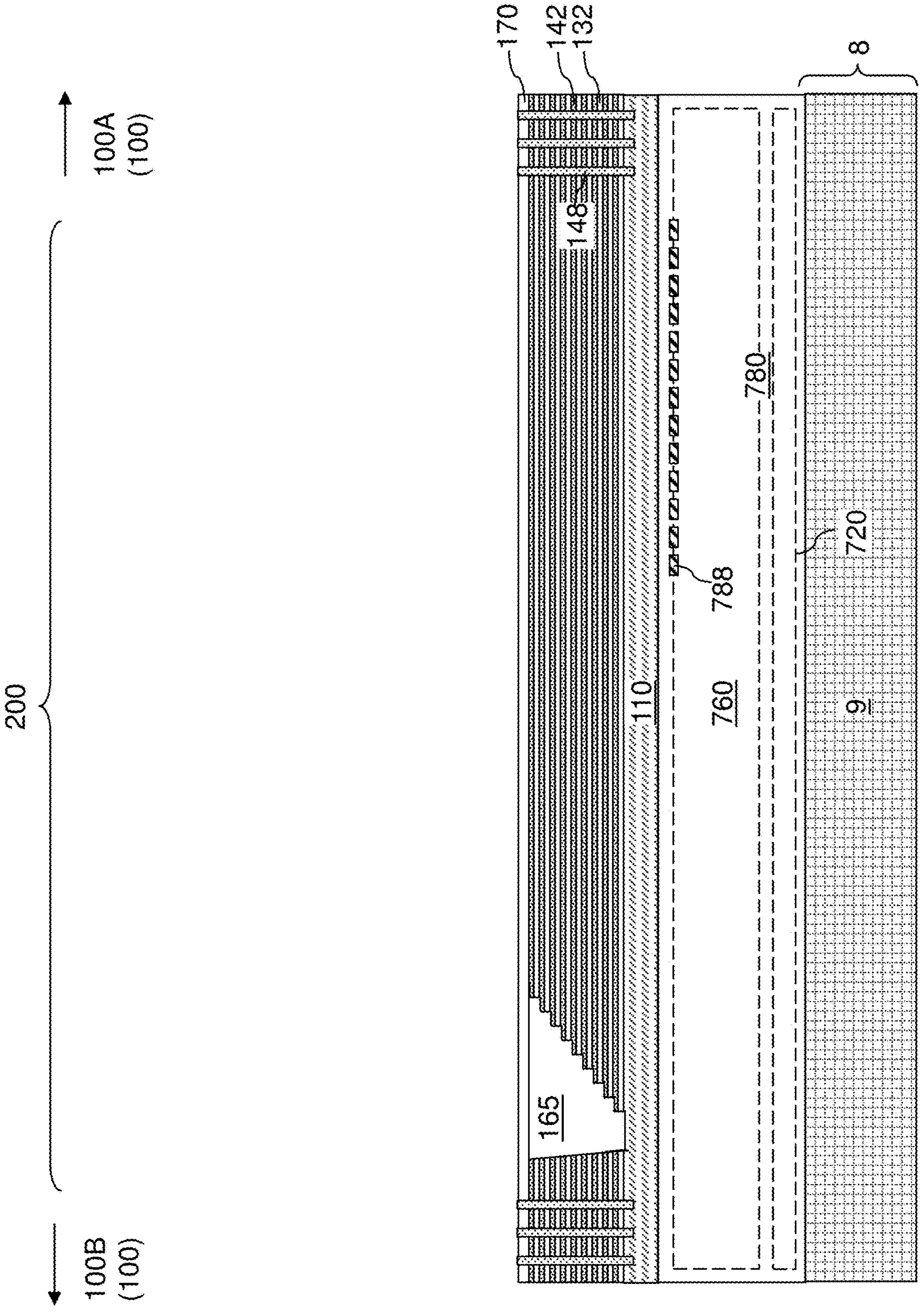
FIG. 5A is a vertical cross-sectional view of the exemplary structure after formation of first-tier openings and sacrificial first-tier opening fill material portions according to an embodiment of the present disclosure.
Figure 5B:
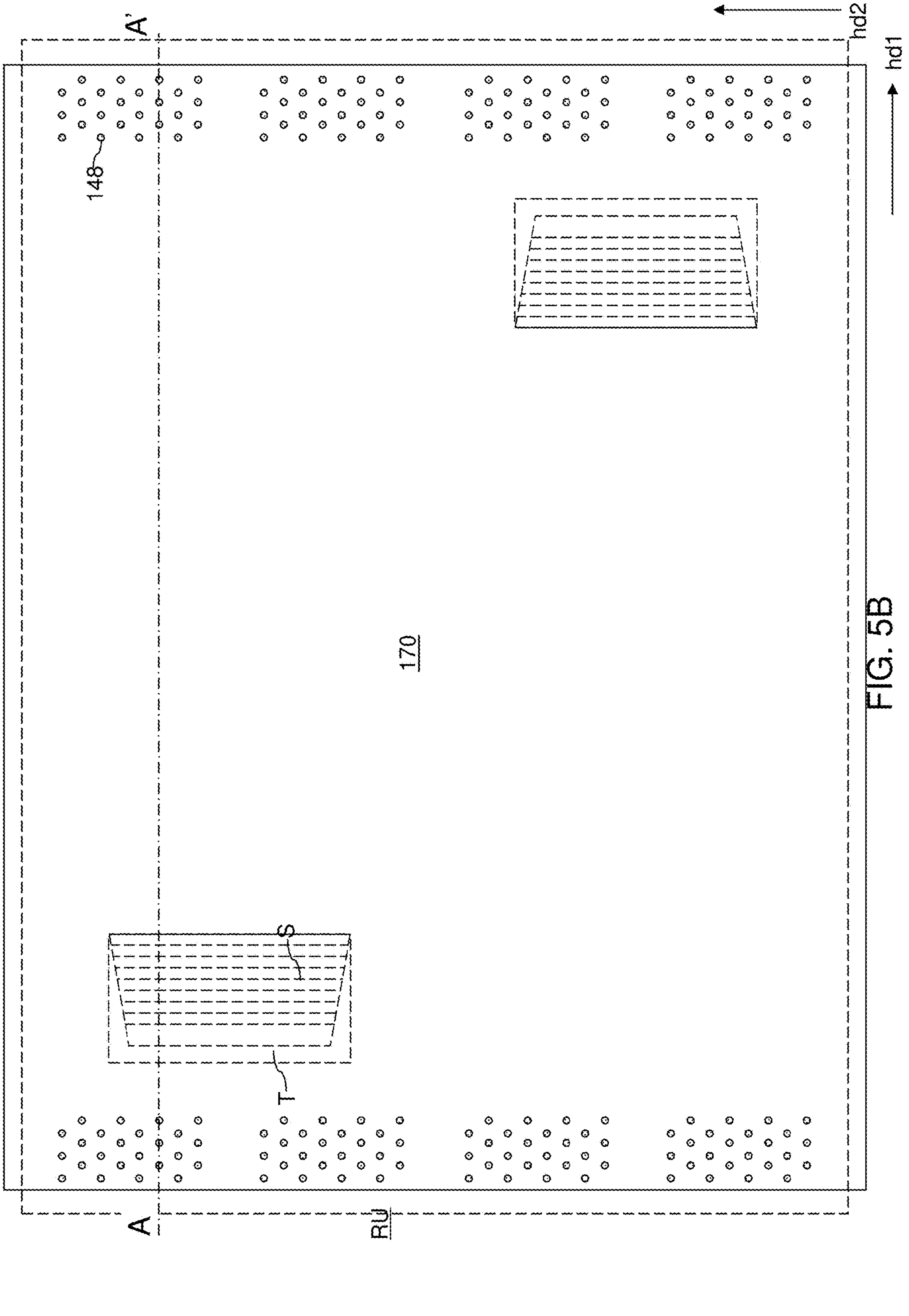
FIG. 5B is a top-down view of the exemplary structure of FIG. 5A. The vertical plane A-A' is the plane of the vertical cross-sectional view of FIG. 5A.

Referring to FIGS. 5A and 5B, various first-tier openings can be formed through the first-tier structure (132, 142, 165, 170) and into an upper portion of the semiconductor material layer 110. A photoresist layer (not shown) can be applied over the first insulating cap layer 170, and can be lithographically patterned to form various openings therethrough. The pattern of openings in the photoresist layer can be transferred through the first-tier structure (132, 142, 165, 170) and into an upper portion of the semiconductor material layer 110 by a first anisotropic etch process to form the various first-tier openings concurrently. The various first-tier openings can include first-tier memory openings, first-tier support openings (not shown), and additional first-tier openings (not shown).

The first-tier memory openings are openings that are formed in the memory array regions 100 through each layer within the first vertically alternating sequence (132, 142) and are subsequently employed to form memory stack structures therein. The first-tier memory openings can be formed in clusters that are laterally spaced apart along the second horizontal direction hd2. Each cluster of first-tier memory openings can be formed as a two-dimensional array of first-tier memory openings.

A sacrificial fill material can be deposited in the various first-tier openings to form various sacrificial first-tier opening fill material portions. The various sacrificial first-tier opening fill material portions comprise sacrificial first-tier memory opening fill material portions 148 that are formed in the first-tier memory openings. The sacrificial fill material in the various sacrificial first-tier opening fill material portions comprise a material than the materials of the first insulating layers 132 and the first sacrificial material layers 142. For example, the sacrificial fill material in the various sacrificial first-tier opening fill material portions may comprise a carbon-based material (such as amorphous carbon or diamond-like carbon), a semiconductor material (such as amorphous silicon or a silicon-germanium alloy), a dielectric material (such as organosilicate glass), or a polymer material.

Figure 6:
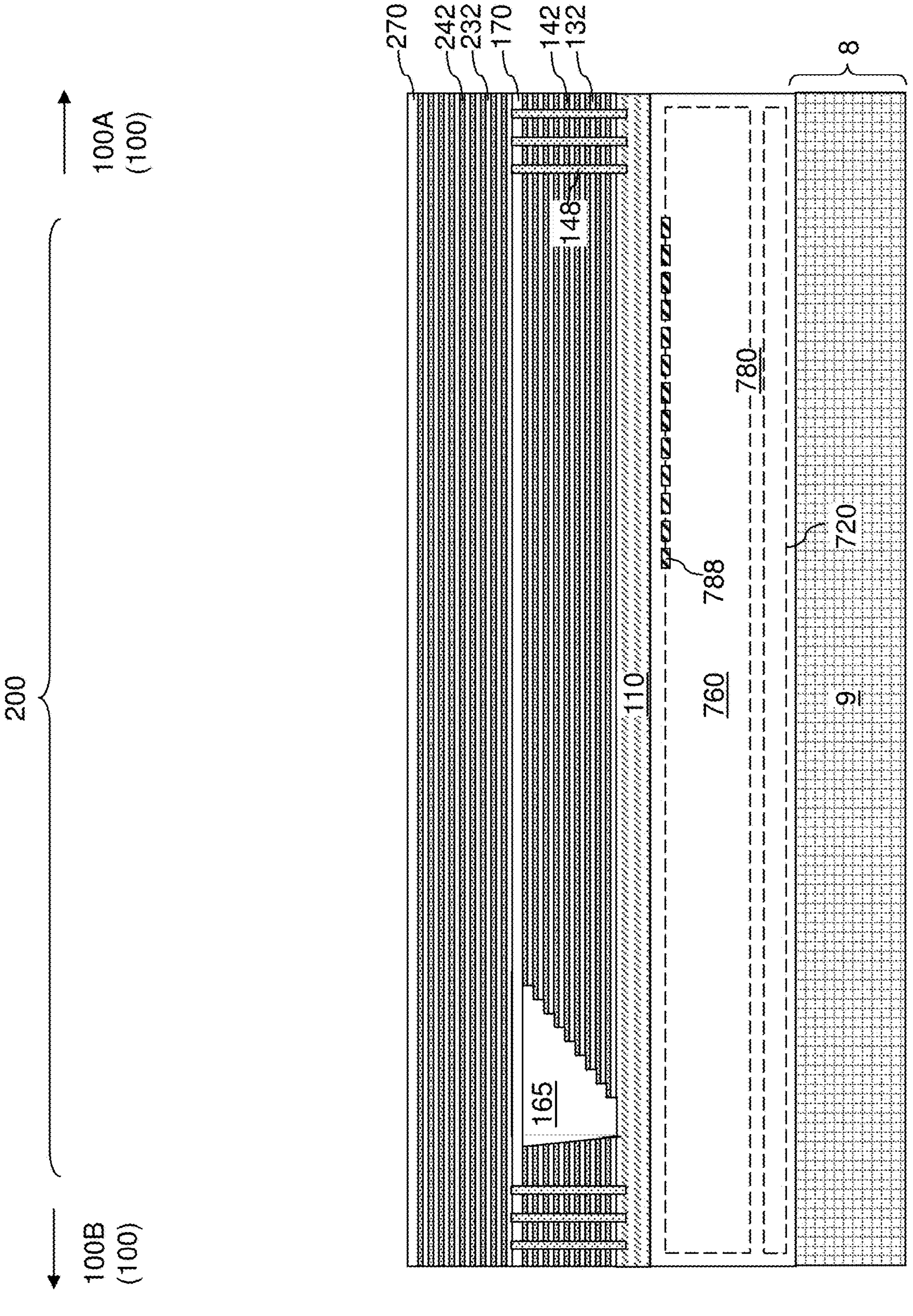
FIG. 6 is a vertical cross-sectional view of the exemplary structure after formation of a second vertically alternating sequence of second continuous insulating layers and second continuous sacrificial material layers according to an embodiment of the present disclosure.

Referring to FIG. 6, a second vertically alternating sequence of second insulating layers 232 and second sacrificial material layers 242 can be formed over the first-tier structure (132, 142, 165, 170, 148). Each of the second insulating layers 232 may be formed as single continuous material layer, and thus, may be referred to as a second continuous insulating layer. Each of the second sacrificial material layers 242 may be formed as a single continuous material layer, and thus, may be formed as a second continuous sacrificial material layer. Each of the second insulating layers 232 and the second sacrificial material layers 242 may have a thickness in a range from 20 nm to 80 nm, although lesser and greater thicknesses may also be employed. In one embodiment, the second vertically alternating sequence of second insulating layers 232 and second sacrificial material layers 242 may include a periodic repetition of a unit layer stack including a second insulating layer 232 and a second sacrificial material layer 242. The total number of repetitions of the unit layer stack may be in a range from 4 to 1,024, such as from 16 to 256, although lesser and greater numbers of repetition may also be employed. The second insulating layers 232 may comprise, and/or may consist essentially of, an insulating material such as undoped silicate glass or a doped silicate glass. The second sacrificial material layers 242 may comprise, and/or may consist essentially of, a sacrificial material such as silicon nitride, a silicon-germanium alloy, organosilicate glass, or a polymer material. Generally, the second sacrificial material layers 242 comprise a material that may be removed selective to the materials of the second insulating layers 232.

Figure 7A:
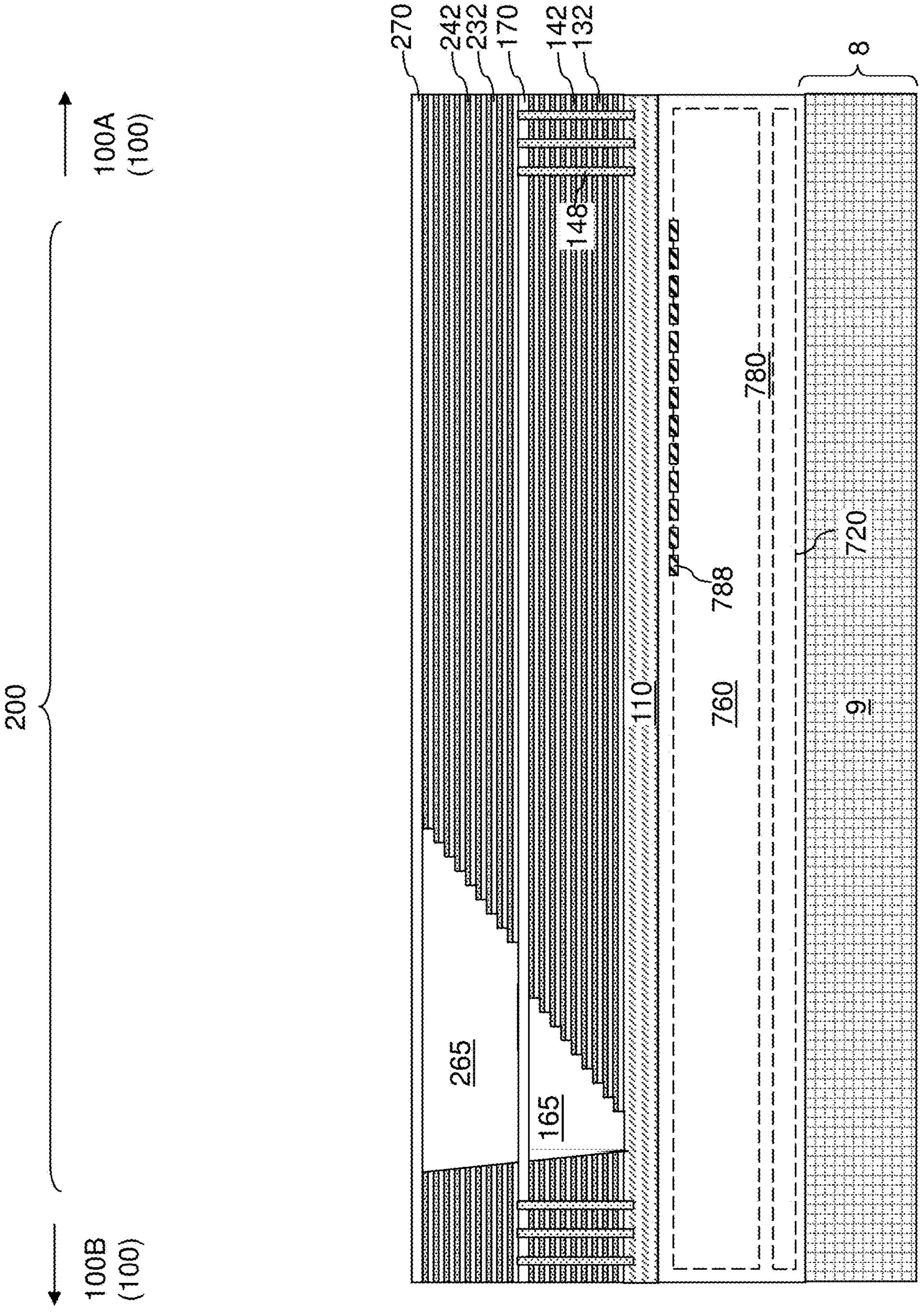
FIG. 7A is a vertical cross-sectional view of the exemplary structure along the first horizontal direction after formation of second-tier retro-stepped dielectric material portions according to an embodiment of the present disclosure.
Figure 7B:
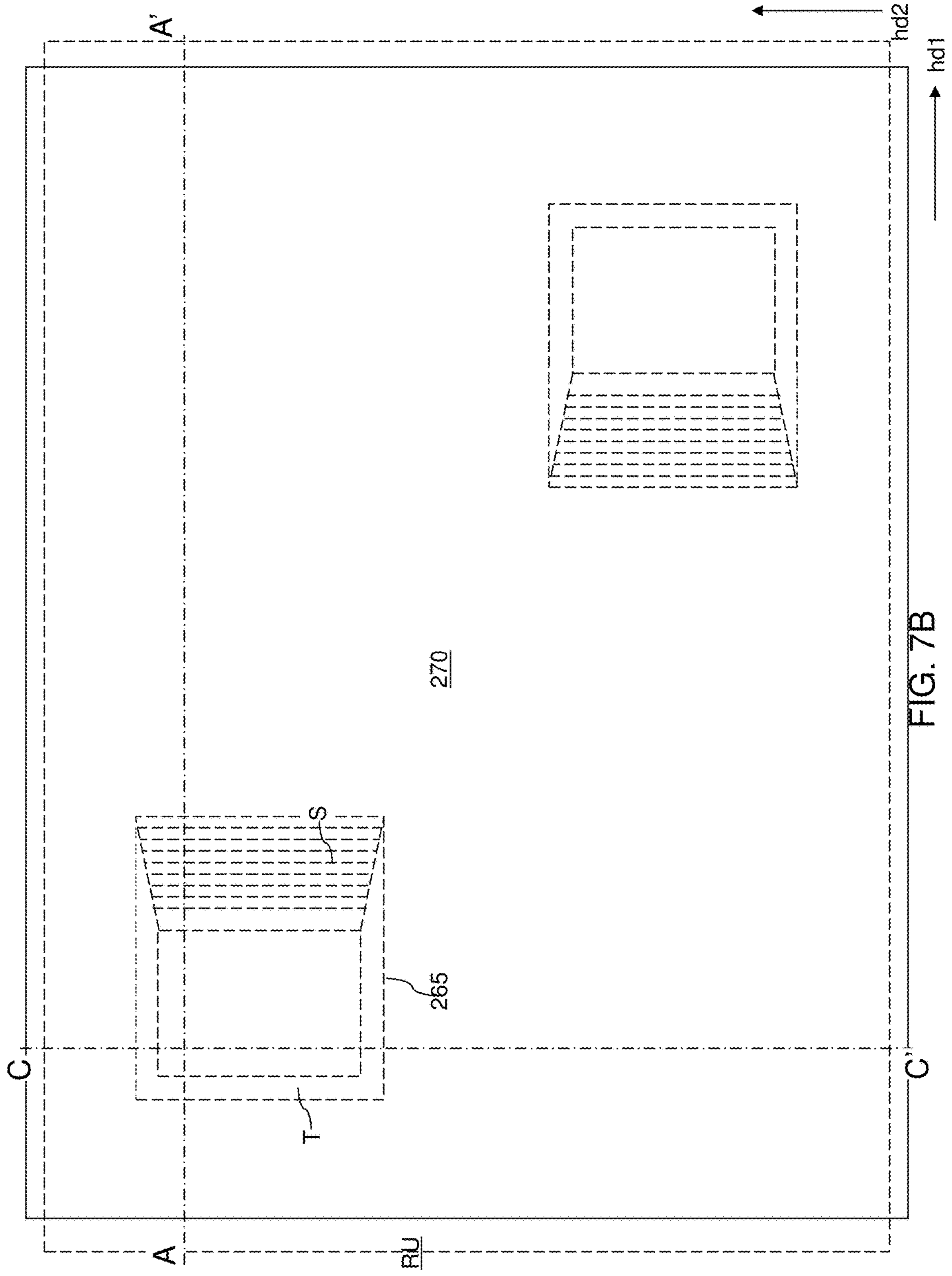
FIG. 7B is a top-down view of the exemplary structure of FIG. 7A. The vertical plane A-A' is the plane of the vertical cross-sectional view of FIG. 7A.
Figure 7C:
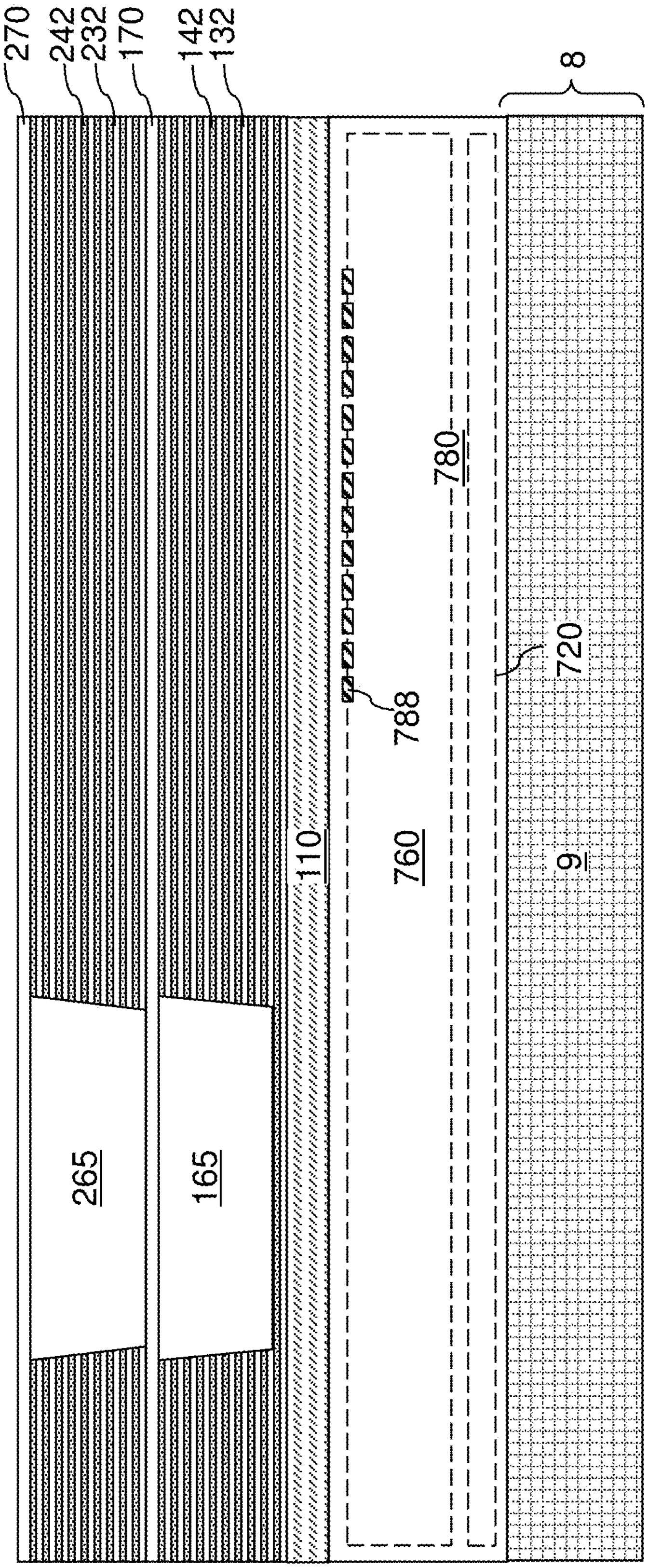
FIG. 7C is a vertical cross-sectional view of the exemplary structure along a vertical plane C-C' of FIG. 7B.

Referring to FIGS. 7A-7C, the processing steps described with reference to FIGS. 3A and 3B may be performed again with a change in the pattern of openings in masking layers. A set of second stepped surfaces may be formed adjacent to each set of first stepped surfaces. In one embodiment, the set of second stepped surfaces may be laterally offset from a most proximal set of first stepped surfaces along the first horizontal direction hd1. Further, portions of the second vertically alternating sequence (232, 242) that overlie areas of the first retro-stepped dielectric material portions 165 can be removed. A dielectric fill material can be deposited in the second stepped cavities to form second retro-stepped dielectric material portions 265. A second insulating cap layer 270 can be formed over the second vertically alternating sequence (232, 242) and the second retro-stepped dielectric material portions 265. In one embodiment, the second insulating cap layer 270 comprises an insulating material such as silicon oxide, and has a thickness in a range from 100 nm to 600 nm, such as from 200 nm to 500 nm, and/or from 300 nm to 400 nm, although lesser and greater thicknesses may also be employed.

Figure 8A:
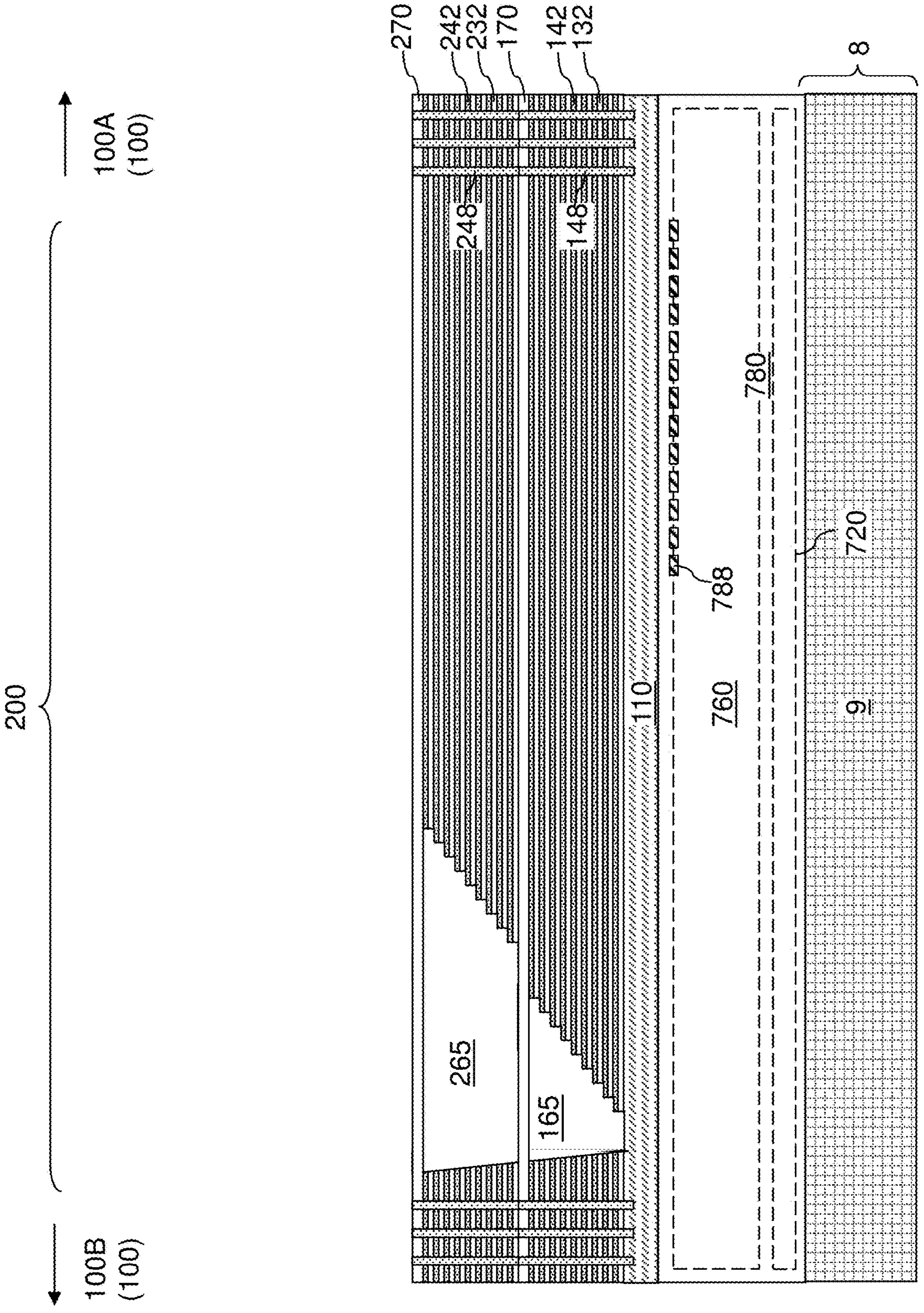
FIG. 8A is a vertical cross-sectional view of the exemplary structure after formation of second-tier openings and sacrificial second-tier opening fill material portions according to an embodiment of the present disclosure.
Figure 8B:
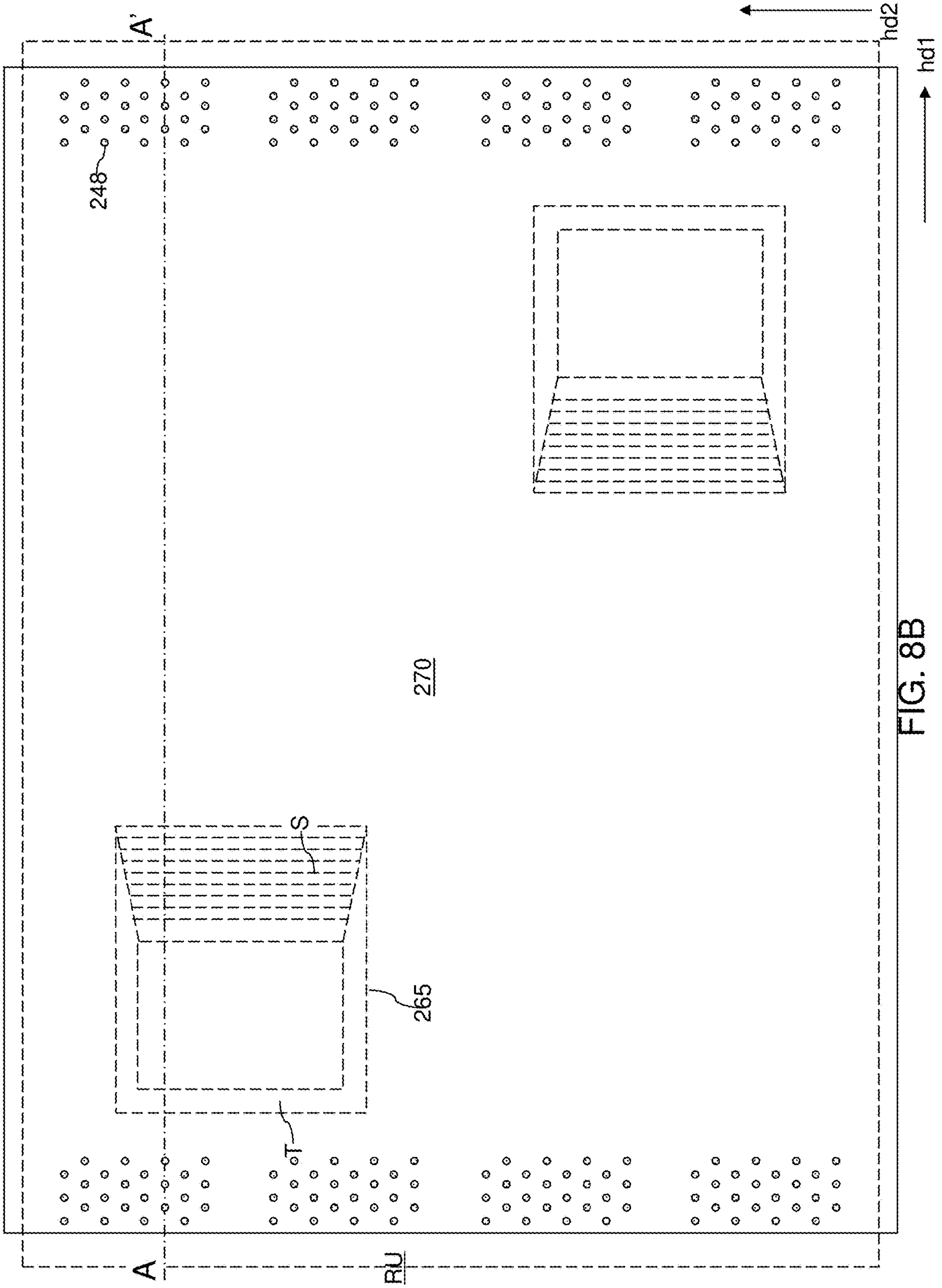
FIG. 8B is a top-down view of the exemplary structure of FIG. 8A. The vertical plane A-A' is the plane of the vertical cross-sectional view of FIG. 8A.
Figure 9A:
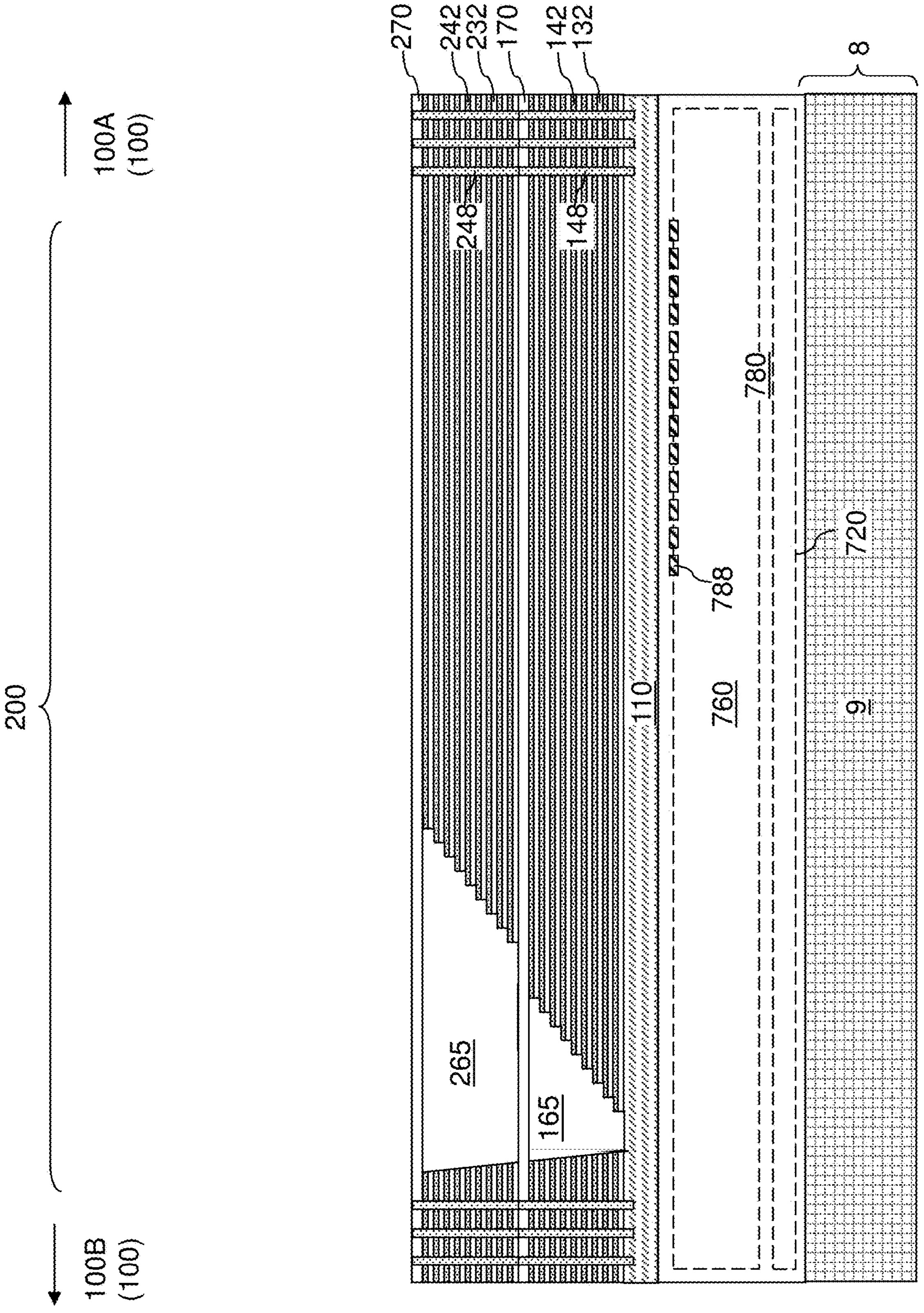
FIG. 9A is a vertical cross-sectional view of the exemplary structure after formation of lower-level backside trenches according to an embodiment of the present disclosure.
Figure 9B:
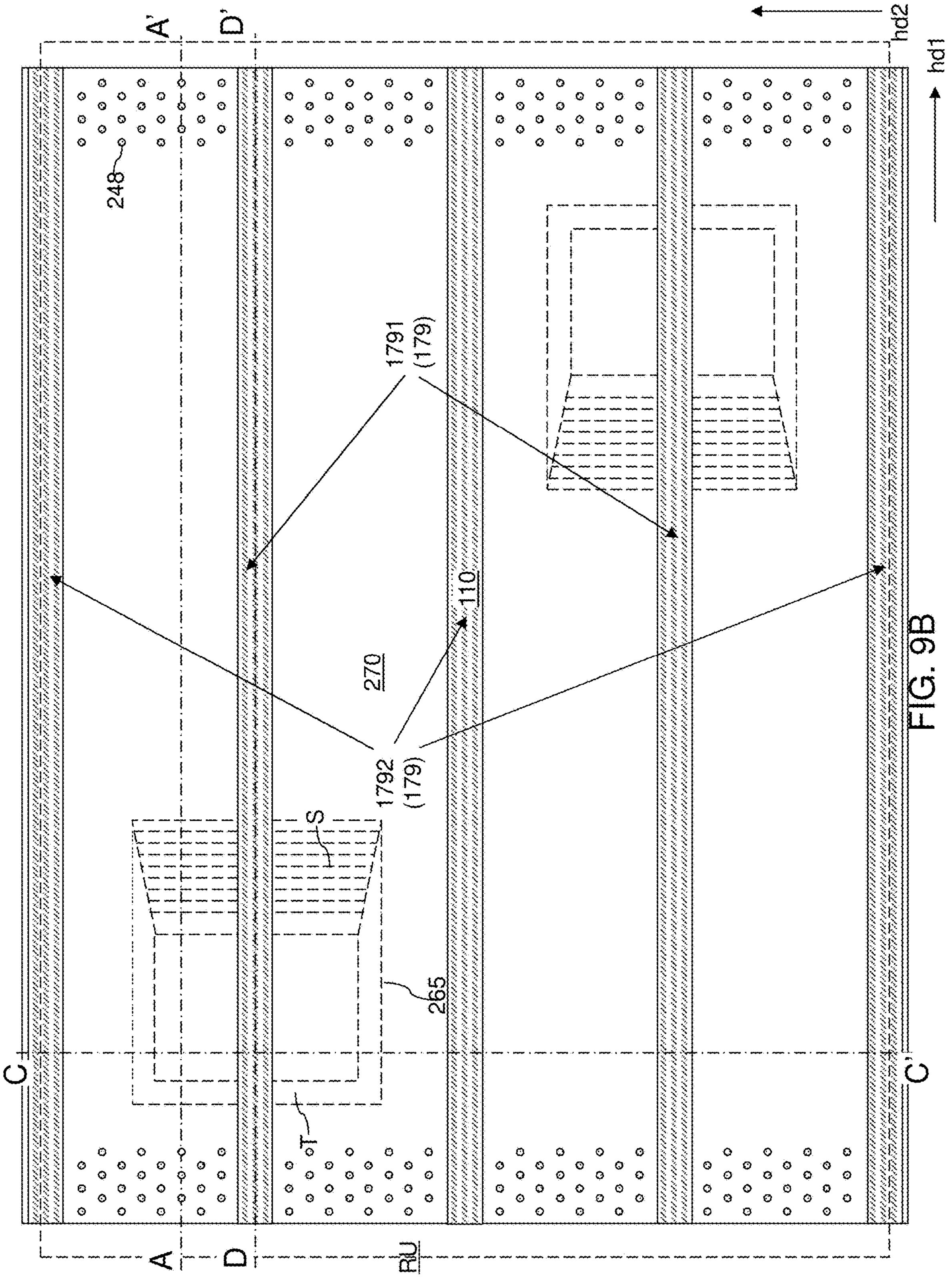
FIG. 9B is a top-down view of the exemplary structure of FIG. 9A. The vertical plane A-A' is the plane of the vertical cross-sectional view of FIG. 9A.
Figure 9C:
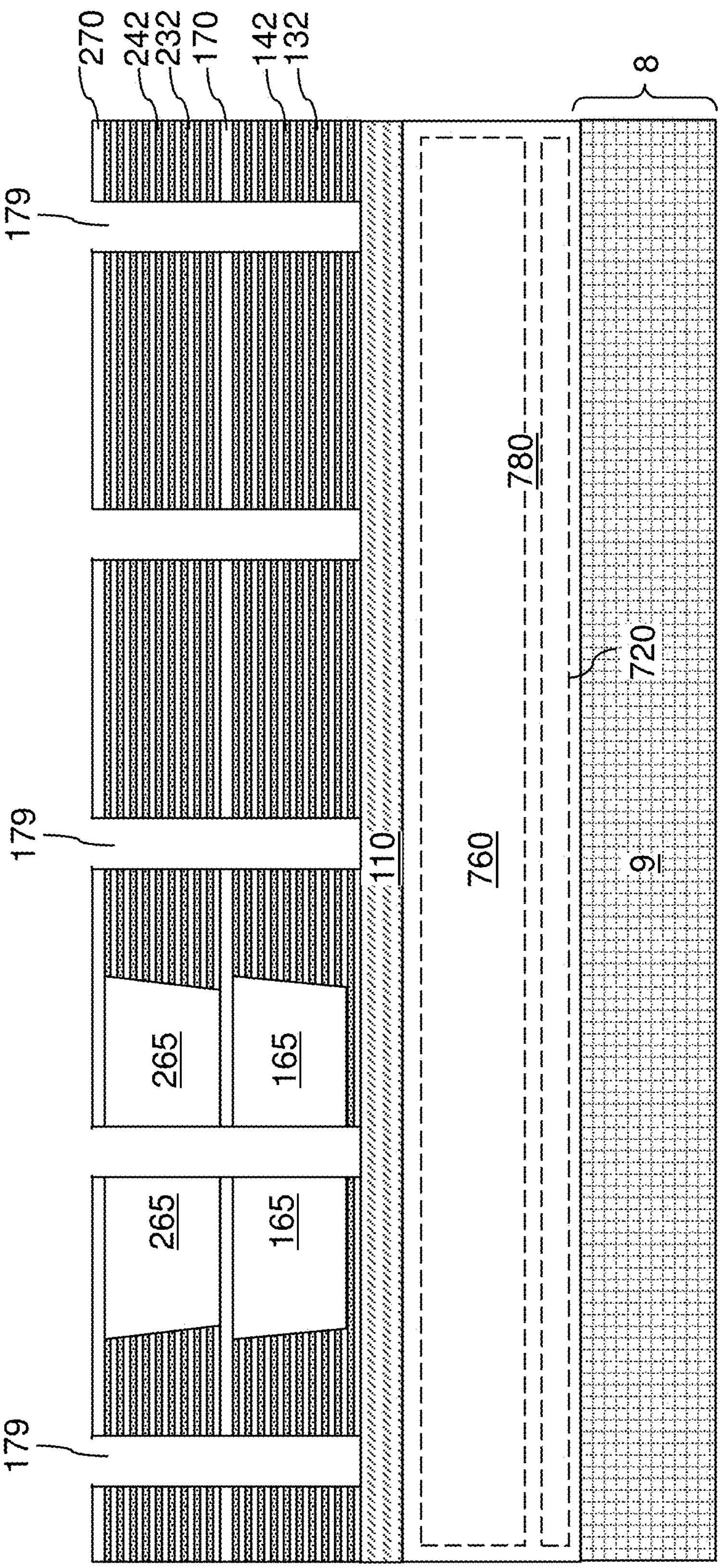
FIG. 9C is a vertical cross-sectional view of the exemplary structure along the vertical plane C-C' of FIG. 9B.
Figure 9D:
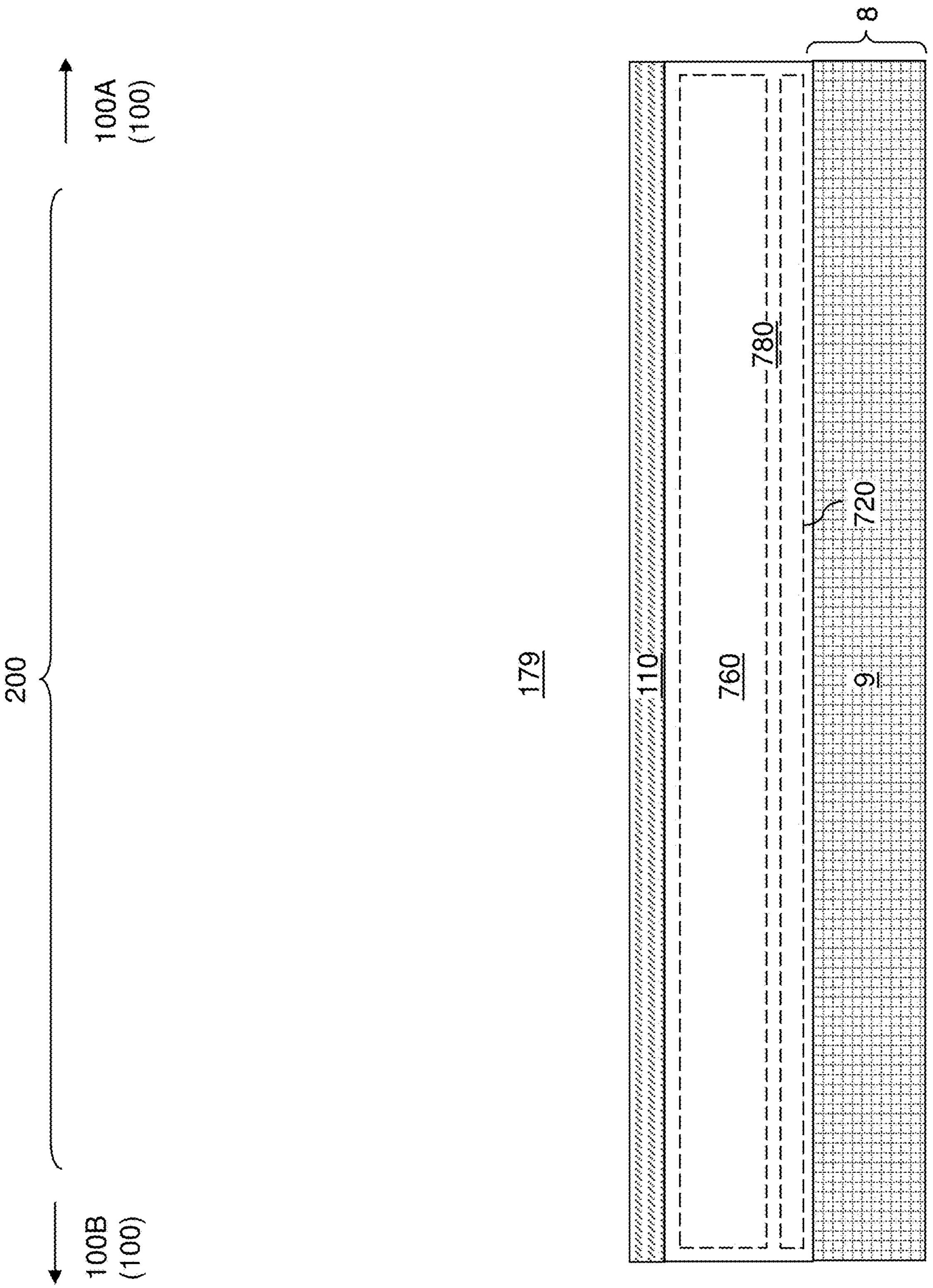
FIG. 9D is a vertical cross-sectional view of the exemplary structure along the vertical plane D-D' of FIG. 9B.
Figure 10A:
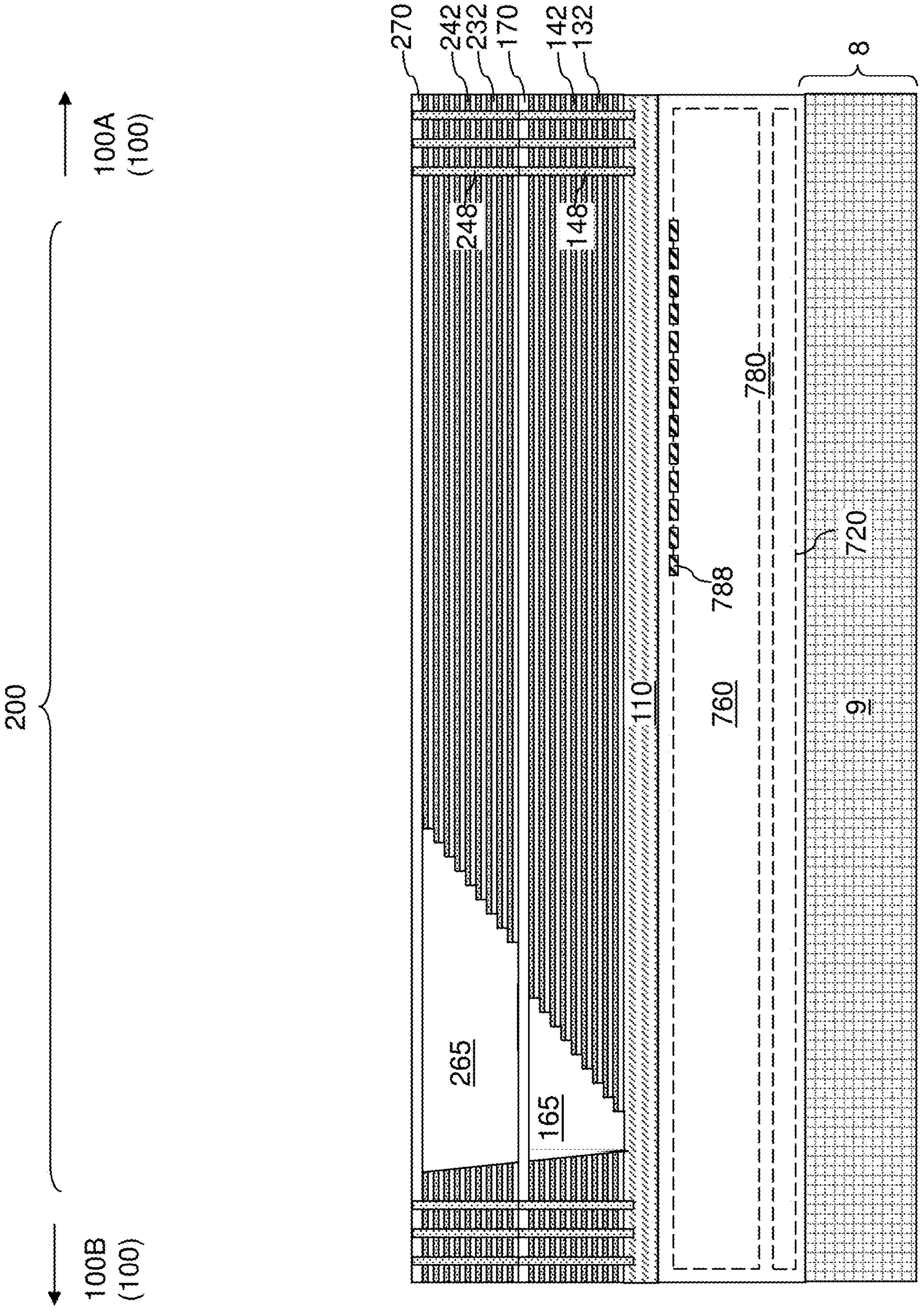
FIG. 10A is a vertical cross-sectional view of the exemplary structure after formation of first sacrificial trench fill structures in the lower-level backside trenches according to an embodiment of the present disclosure.
Figure 10B:
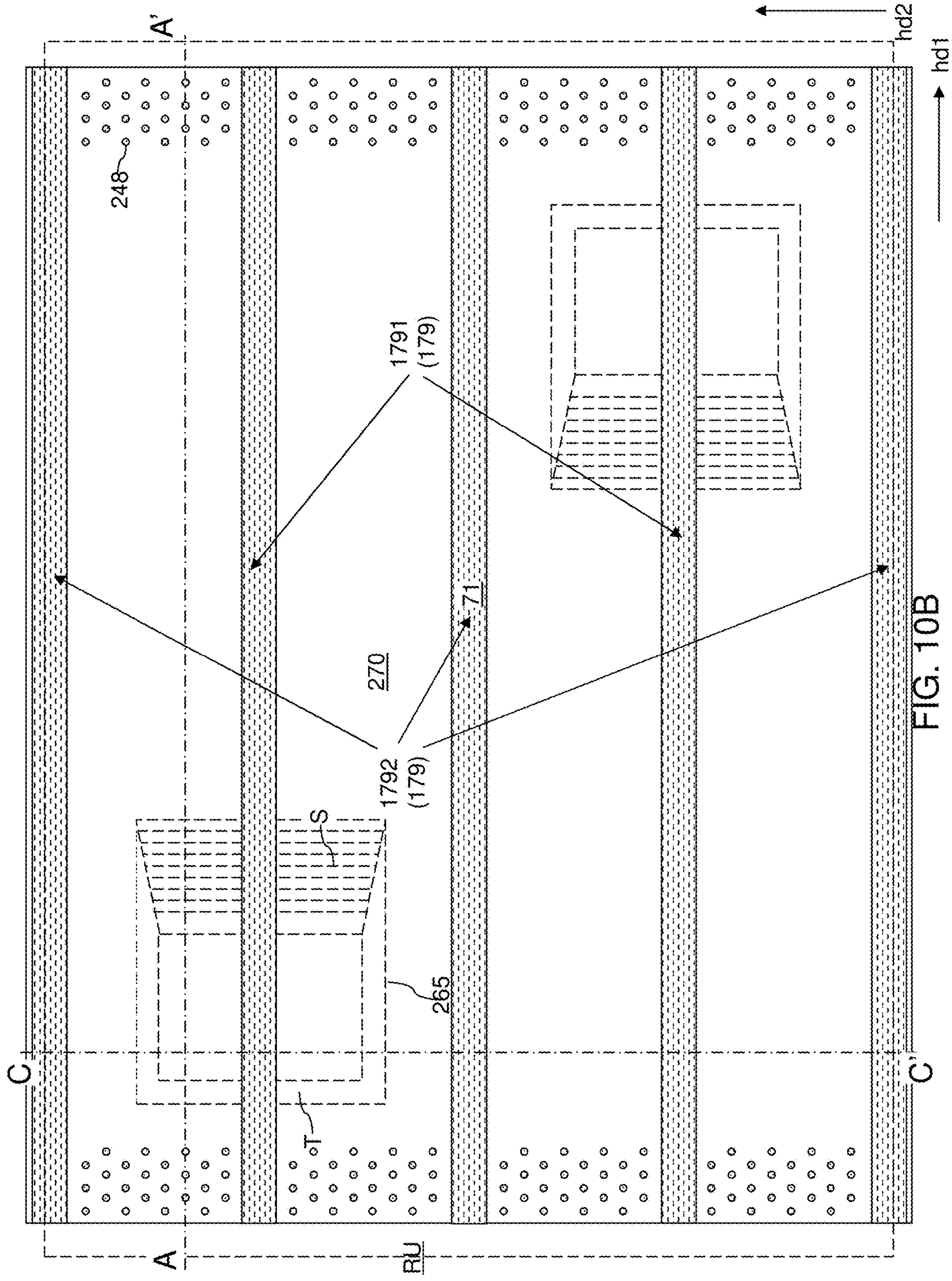
FIG. 10B is a top-down view of the exemplary structure of FIG. 10A. The vertical plane A-A' is the plane of the vertical cross-sectional view of FIG. 10A.
Figure 10C:
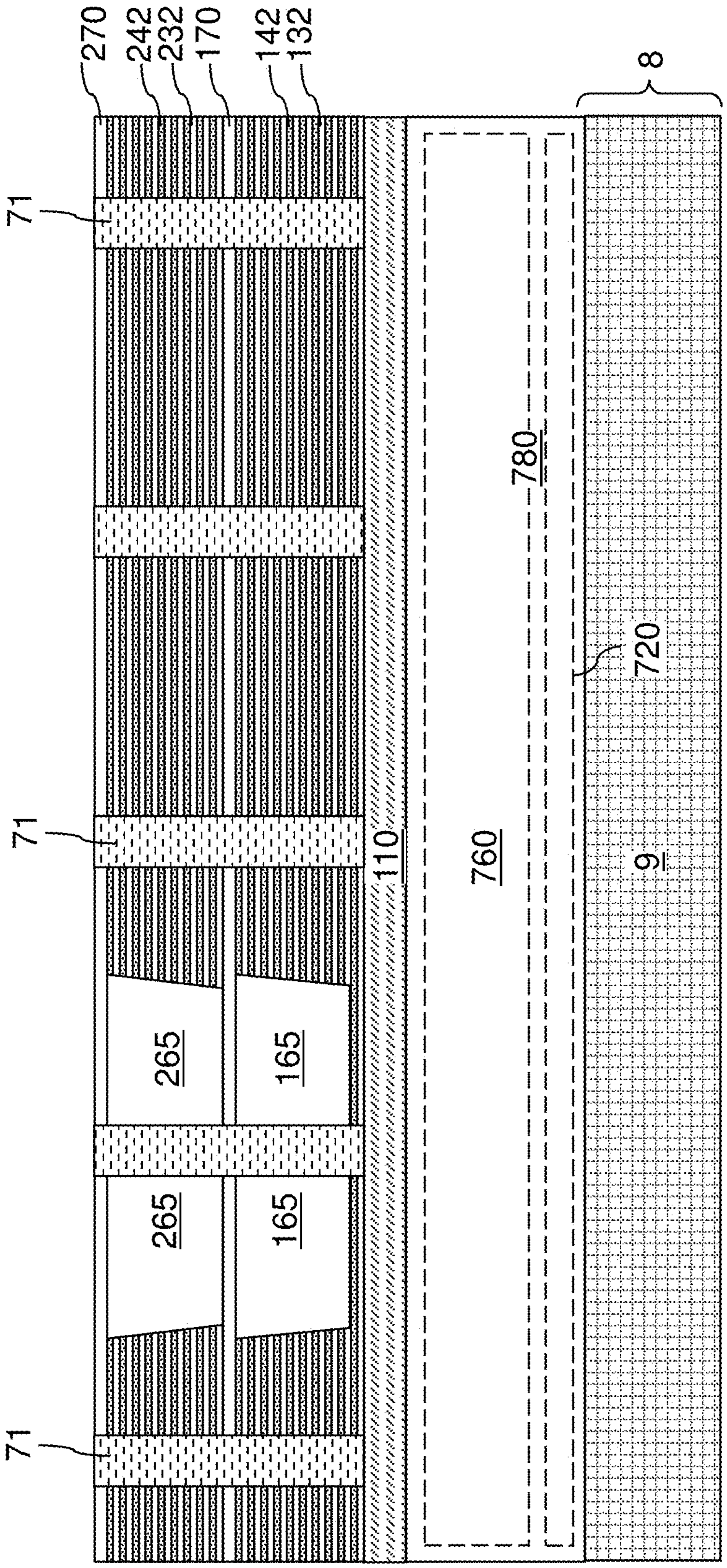
FIG. 10C is a vertical cross-sectional view of the exemplary structure along the vertical plane C-C' of FIG. 10B.
Figure 10D:
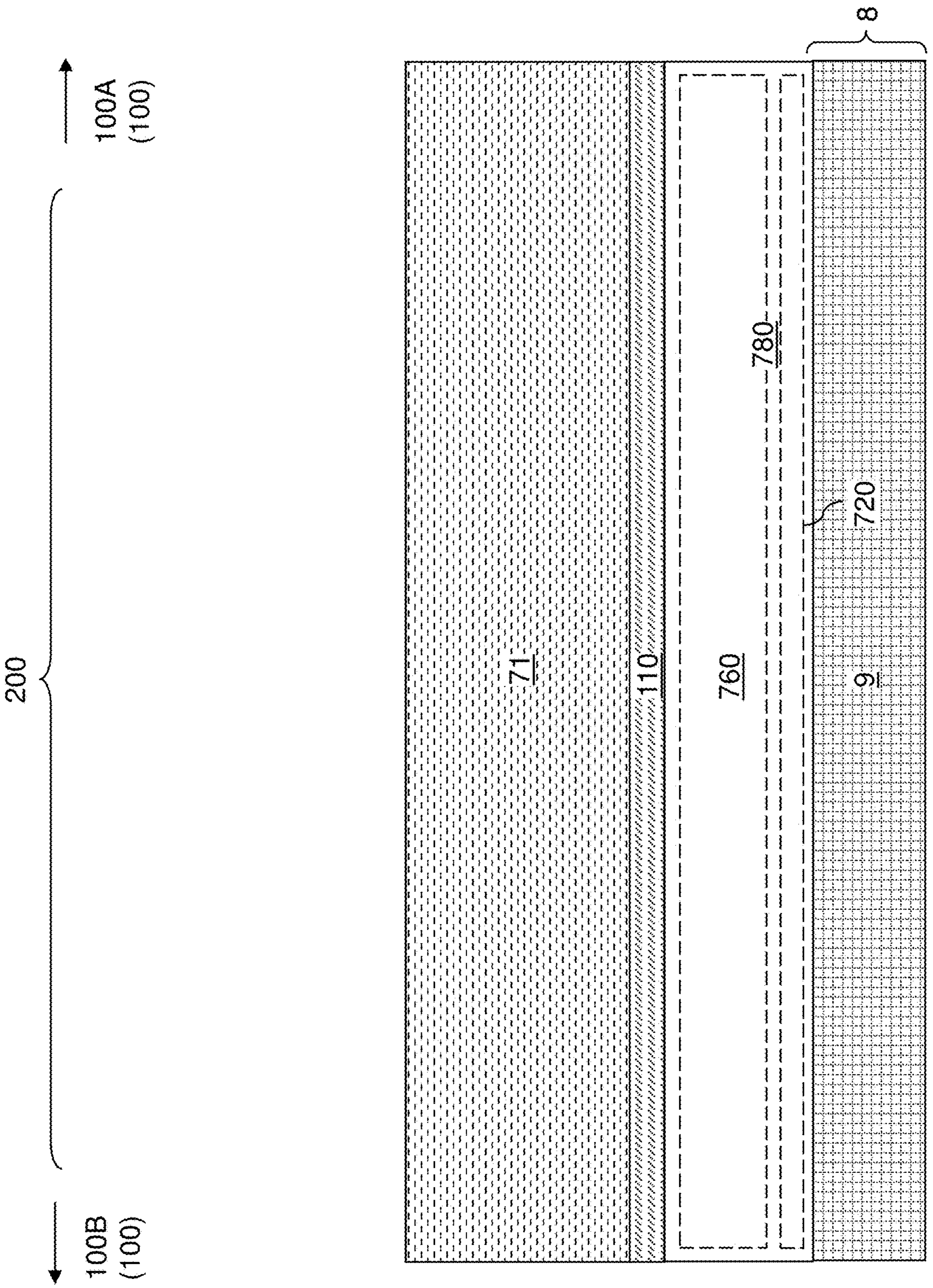
FIG. 10D is a vertical cross-sectional view of the exemplary structure along the vertical plane D-D' of FIG. 10B.
Figure 11A:
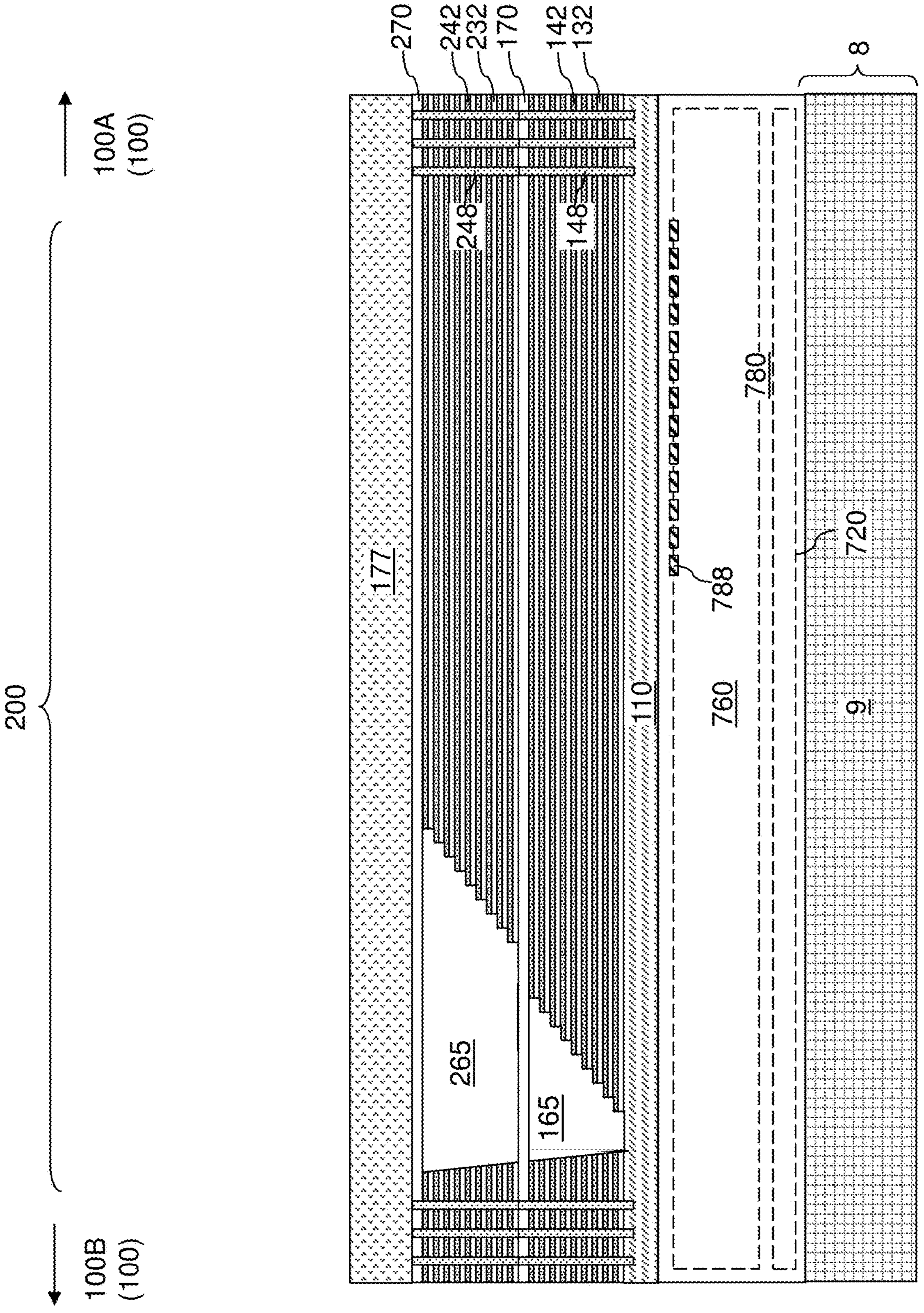
FIG. 11A is a vertical cross-sectional view of the exemplary structure after formation of first backside bridge support structures within a first subset of the first sacrificial trench fill structures according to an embodiment of the present disclosure.
Figure 11B:
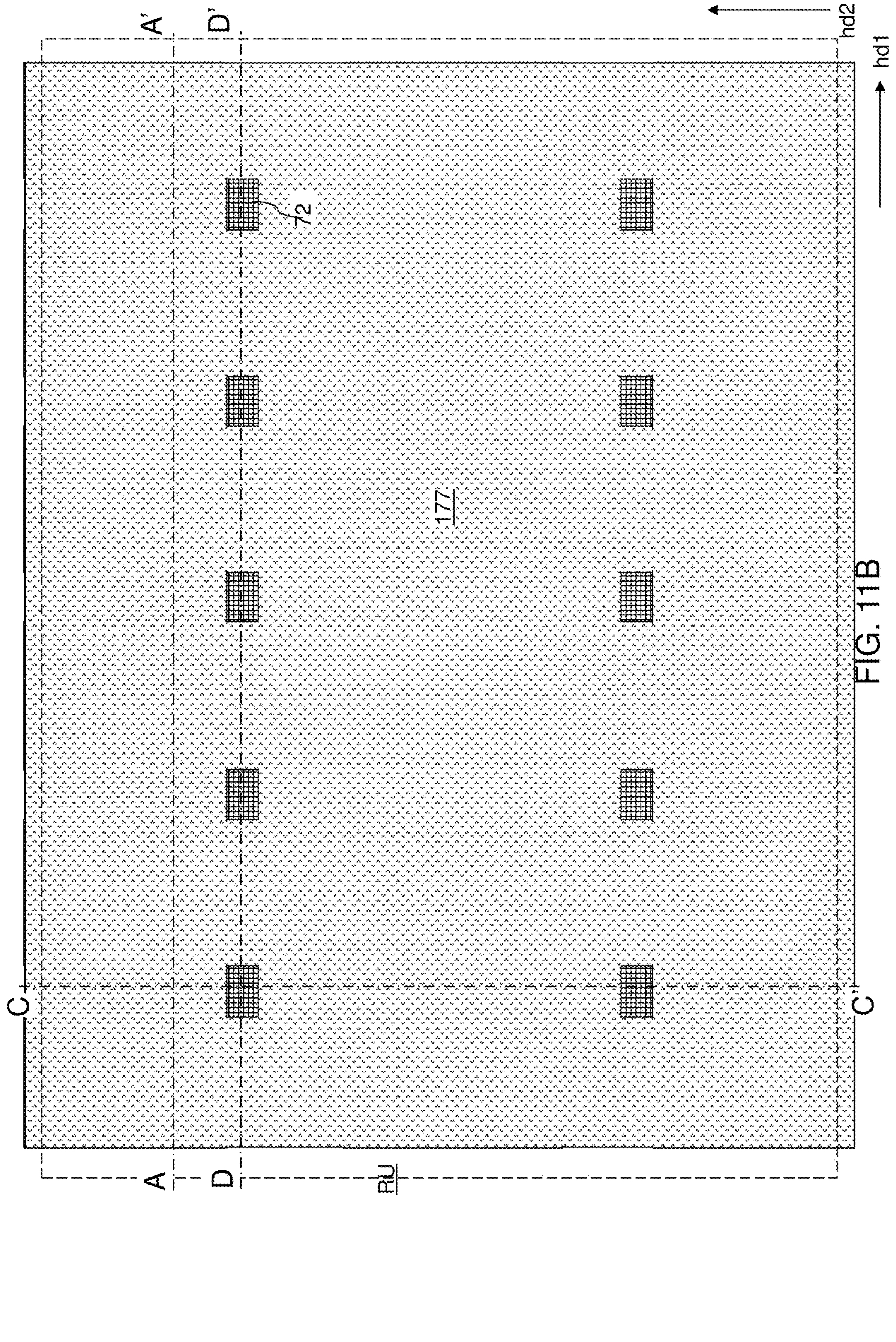
FIG. 11B is a top-down view of the exemplary structure of FIG. 11A. The vertical plane A-A' is the plane of the vertical cross-sectional view of FIG. 11A.
Figure 11C:
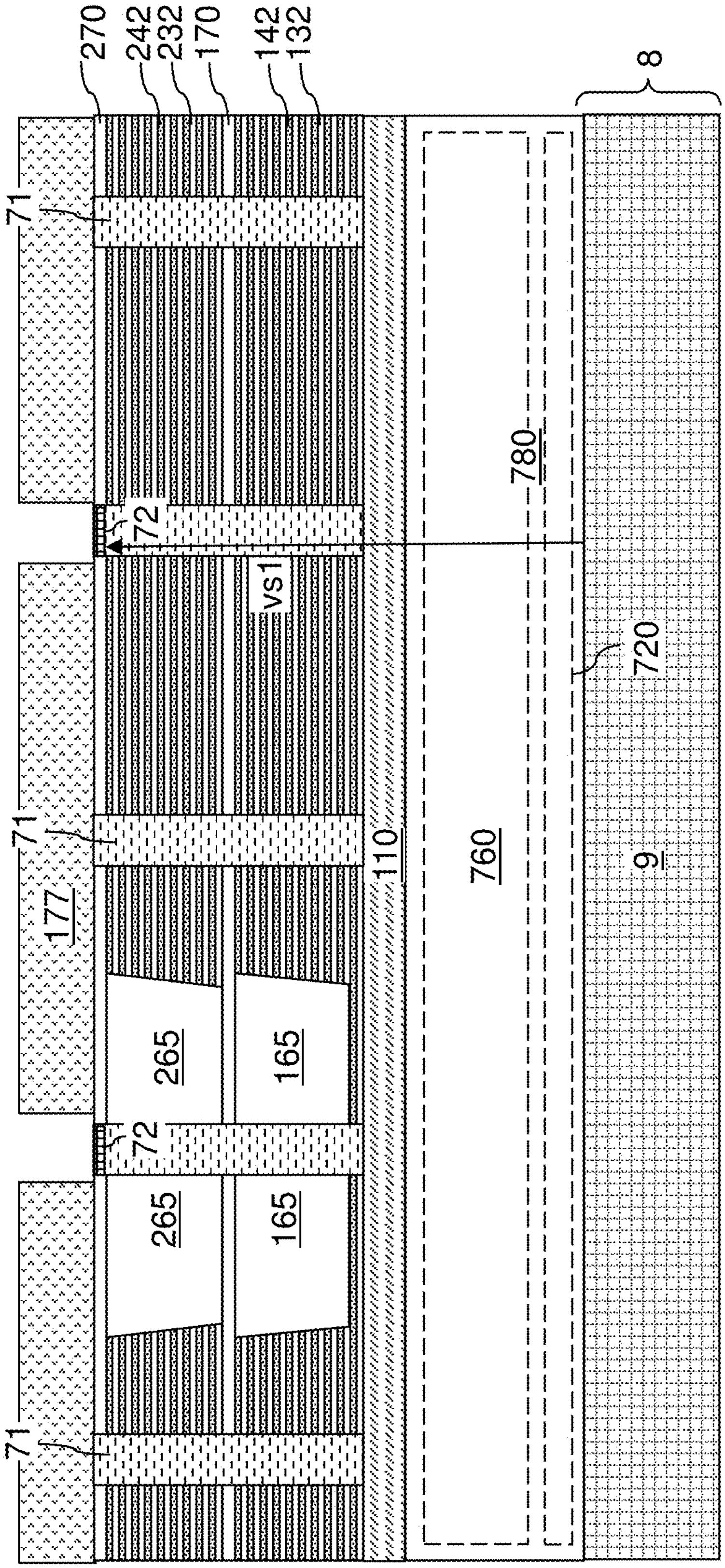
FIG. 11C is a vertical cross-sectional view of the exemplary structure along the vertical plane C-C' of FIG. 11B.
Figure 11D:
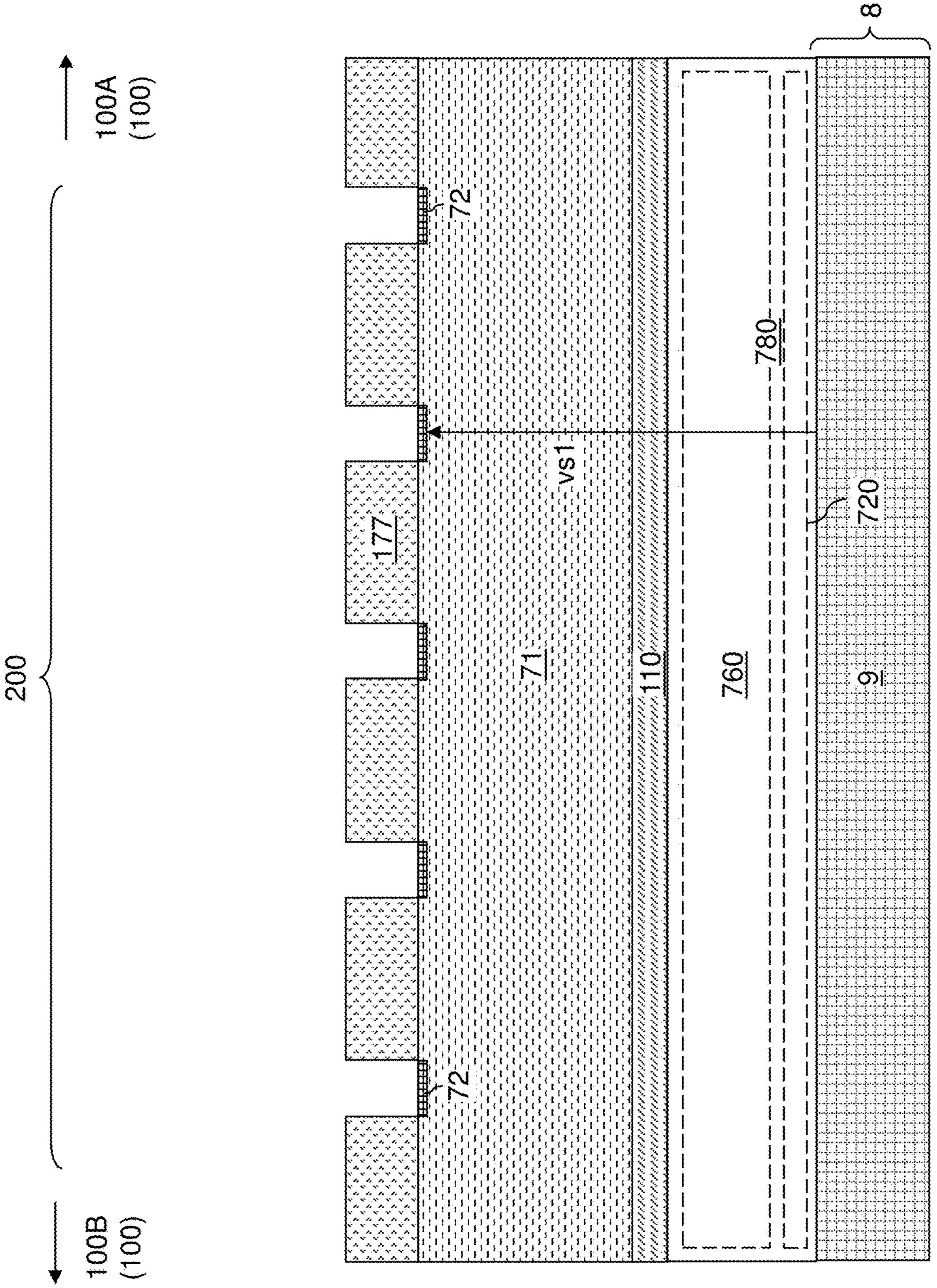
FIG. 11D is a vertical cross-sectional view of the exemplary structure along the vertical plane D-D' of FIG. 11B.

Referring to FIGS. 8A and 8B, various second-tier openings can be formed through the second-tier structure (232, 242, 265, 270). A photoresist layer (not shown) can be applied over the second insulating cap layer 270, and can be lithographically patterned to form various openings therethrough. The pattern of the openings in the photoresist layer may be the same as the pattern of the sacrificial first-tier opening fill material portions within the first-tier structure (132, 142, 165, 170, 148). The pattern of openings in the photoresist layer can be transferred through the second-tier structure (232, 242, 265, 270) by a second anisotropic etch process to form the various second-tier openings concurrently. The various second-tier openings can include second-tier memory openings, second-tier support openings (not shown), and additional second-tier openings (not shown).

The second-tier memory openings are openings that are formed in the memory array regions 100 through each layer within the second vertically alternating sequence (232, 242) and are subsequently employed to form memory stack structures therein. The second-tier memory openings can have the same pattern, and can be formed directly on, the sacrificial first-tier memory opening fill material portions 148.

A sacrificial fill material can be deposited in the various second-tier openings to form various sacrificial second-tier opening fill material portions. The various sacrificial second-tier opening fill material portions comprise sacrificial second-tier memory opening fill material portions 248 that are formed in the second-tier memory openings. The sacrificial fill material in the various sacrificial second-tier opening fill material portions comprise a material than the materials of the second insulating layers 232 and the second sacrificial material layers 242. For example, the sacrificial fill material in the various sacrificial second-tier opening fill material portions may comprise a carbon-based material (such as amorphous carbon or diamond-like carbon), a semiconductor material (such as amorphous silicon or a silicon-germanium alloy), a dielectric material (such as organosilicate glass), or a polymer material. In one embodiment, the various sacrificial second-tier opening fill material portions may comprise a same material as the various sacrificial first-tier opening fill material portions.

Referring to FIGS. 9A-9D, a photoresist layer (not shown) can be applied over the exemplary structure, and can be lithographically patterned to form elongated openings that laterally extend along the first horizontal direction hd1. The elongated openings are formed between clusters of sacrificial second-tier memory opening fill material portions 248. In one embodiment, the elongated openings may have a respective uniform width along the second horizontal direction hd2. In one embodiment, the elongated openings may be periodic along the second horizontal direction hd2.

An anisotropic etch process can be performed to transfer the pattern of the openings in the photoresist layer through the second insulating cap layer 270, the second vertically alternating sequence (232, 242), the second retro-stepped dielectric material portions 265, the first insulating cap layer 170, the first vertically alternating sequence (132, 142), and the first retro-stepped dielectric material portions 165. Laterally-extending trenches are formed through the combination of the second insulating cap layer 270, the second vertically alternating sequence (232, 242), the second retro-stepped dielectric material portions 265, the first insulating cap layer 170, the first vertically alternating sequence (132, 142), and the first retro-stepped dielectric material portions 165 down to an upper portion of the semiconductor material layer 110. The laterally-extending trenches are herein referred to as lower-level backside trenches 179.

The first vertically alternating sequence (132, 142) is divided into first alternating stacks of first insulating layers 132 and first sacrificial material layers 142. The second vertically alternating sequence (232, 242) is divided into second alternating stacks of second insulating layers 232 and second sacrificial material layers 242. The first insulating cap layer 170 is divided into a plurality of first insulating cap layers 170. The second insulating cap layer 270 is divided into a plurality of second insulating cap layers 270. Each first retro-stepped dielectric material portion 165 is divided into two first retro-stepped dielectric material portions 165. Each second retro-stepped dielectric material portion 265 is divided into two second retro-stepped dielectric material portions 265. Each contiguous combination of a first alternating stack (132, 142), a first insulating cap layer 170, a first retro-stepped dielectric material portion 165, a second alternating stack (232, 242), a second insulating cap layer 270, and a second retro-stepped dielectric material portion 265 is laterally spaced from at least one neighboring contiguous combination of a first alternating stack (132, 142), a first insulating cap layer 170, a first retro-stepped dielectric material portion 165, a second alternating stack (232, 242), a second insulating cap layer 270, and a second retro-stepped dielectric material portion 265 by a respective backside trench 179.

Generally, at least one vertically alternating sequence of continuous insulating layers (132, 232) and continuous sacrificial material layers (142, 242) may be formed over a substrate 8, and lower-level backside trenches 179 can be formed through the at least one vertically alternating sequence. Remaining portions of the at least one vertically alternating sequence comprise lower alternating stacks of insulating layers (132, 232) and sacrificial material layers (142, 242).

In one embodiment, the lower-level backside trenches 179 comprises two types of trenches, which include a first subset of the lower-level backside trenches 179 that includes first lower-level backside trenches 1791, and a second subset of the lower-level backside trenches 179 that includes second lower-level backside trenches 1792. Generally, the first lower-level backside trenches 1791 are interlaced with the second lower-level backside trenches 1792 along the second horizontal direction hd2. Upon sequentially numbering the lower-level backside trenches 179 along the second horizontal direction hd2 with positive integers beginning with 1, the first lower-level backside trenches 1791 may comprise odd-numbered lower-level backside trenches and the second lower-level backside trenches 1792 may comprise even-numbered lower-level backside trenches. Alternatively, the first lower-level backside trenches 1791 may comprise even-numbered lower-level backside trenches and the second lower-level backside trenches 1792 may comprise odd-numbered lower-level backside trenches.

In one embodiment, each repetition unit RU may comprise four contiguous combinations of a first alternating stack (132, 142), a first insulating cap layer 170, a first retro-stepped dielectric material portion 165, a second alternating stack (232, 242), a second insulating cap layer 270, and a second retro-stepped dielectric material portion 265. Further, each repetition unit RU may comprise four lower-level backside trenches 179, which comprise two first lower-level backside trenches 1791 and two second lower-level backside trenches 1792. In one embodiment, each retro-stepped dielectric material portion (165, 265) may be physically exposed to the first lower-level backside trenches 1791, and not be physically exposed to the second lower-level backside trenches 1792. Alternatively, each retro-stepped dielectric material portion (165, 265) may be physically exposed to the second lower-level backside trenches 1792, and not be physically exposed to the first lower-level backside trenches 1791.

Referring to FIGS. 10A-10D, a first sacrificial trench fill material can be deposited in the lower-level backside trenches 179. The first sacrificial trench fill material may comprise a carbon-based material (such as amorphous carbon or diamond-like carbon), a semiconductor material (such as amorphous silicon or a silicon-germanium alloy), organosilicate glass, or a polymer material. Excess portions of the first sacrificial trench fill material may be removed from above the horizontal plane including the top surfaces of the second insulating cap layers 270 by a planarization process such as a recess etch process or a chemical mechanical polishing (CMP) process. Each remaining portion of the first sacrificial trench fill material filling a respective first lower-level backside trench 179 constitutes a first sacrificial trench fill structure 71. A first subset of the first sacrificial trench fill structures 71 can be formed in the first lower-level backside trenches 1791, and second subset of the first sacrificial trench fill structures 71 can be formed in the second lower-level backside trenches 1792.

Referring to FIGS. 11A-11D, first backside bridge support structures 72 can be formed within upper portions of a subset of the first sacrificial trench fill structures 71. The subset of the first sacrificial trench fill structures 71 in which the first backside bridge support structures 72 is formed may comprise the first lower-level backside trenches 1791, or alternatively, may comprise the second lower-level backside trenches 1791. While an embodiment is described in which the first backside bridge support structures 72 are formed in the first lower-level backside trenches 1791, alternative embodiments are expressly contemplated in which the first backside bridge support structures 72 are formed in the second lower-level backside trenches 1792.

Generally, the first backside bridge support structures 72 can be formed as rows of first backside bridge support structures 72 that are laterally spaced apart along the first horizontal direction hd1, i.e., along the lengthwise direction of the lower-level backside trenches 179. In other words, each row of first backside bridge support structures 72 comprise a respective plurality of first backside bridge support structures 72 that are laterally spaced apart along the first horizontal direction hd1. According to an aspect of the present disclosure, each of the first backside bridge support structures 72 may be formed in every other lower-level backside trench 179 along the second horizontal direction hd2. For example, the first backside bridge support structures 72 may be formed only in the first lower-level backside trenches 1791 but not in the second lower-level backside trenches 1792. Alternatively, the first backside bridge support structures 72 may be formed only in the second lower-level backside trenches 1792 but not in the first lower-level backside trenches 1791.

Generally, the material composition of the first backside bridge support structures 72 is different from the material composition of the first sacrificial trench fill structures 71. The first sacrificial trench fill structures 71 comprises a material that can be subsequently removed selective to the materials of the first backside bridge support structures 72, the insulating layers (132, 232), and the insulating cap layers (170, 270). The first backside bridge support structures 72 may be formed by conversion of the material of the first sacrificial trench fill structures 71 into a different material, or by replacement of discrete upper portions of the first sacrificial trench fill structures 71 with material portions having a different material composition.

In a non-limiting illustrative example, the first sacrificial trench fill structures 71 may comprise undoped amorphous silicon. In this case, a first photoresist layer 177 may be applied over the exemplary structure, and may be lithographically patterned to form an array of discrete openings that overlie every other first sacrificial trench fill structures 71 along the second horizontal direction hd2. For example, the openings in the photoresist layer may comprise rows of discrete openings that overlie the first subset of the first sacrificial trench fill structures 71 that are located in the first lower-level backside trenches 1791, while the second subset of the first sacrificial trench fill structures 71 in the second lower-level backside trenches 1792 is covered with the photoresist layer. Boron can be implanted into unmasked upper portions of the first subset of the first sacrificial trench fill structures 71, and convert the implanted portions of the undoped amorphous silicon into a heavily boron-doped amorphous silicon portions, which constitute the first backside bridge support structures 72. The atomic concentration of boron in the first backside bridge support structures 72 may be in a range from $1.0\times10^{18}/cm^3$ to $2.0\times10^{21}/cm^3$, although lesser and greater atomic concentrations may also be employed. Generally, undoped amorphous silicon may be etched selective to heavily boron-doped amorphous silicon with high selectivity, such as a selectivity greater than 100, employing tetramethyl ammonium hydroxide (TMAH). The first photoresist layer 177 may be subsequently removed, for example, by ashing.

Alternatively, the first photoresist layer 177 may be employed as an etch mask for an etch process that vertically recesses unmasked portions of the first sacrificial trench fill structures 71. In this case, an anisotropic etch process or an isotropic etch process may be performed to form rows of discrete recess regions in upper portions of the first subset of the first sacrificial trench fill structures 71 that are located in the first lower-level backside trenches 1791. The first photoresist layer 177 can be removed, for example, by ashing. A first fill material, which is herein referred to as a first backside bridge material, can be deposited, in the discrete recess regions in the upper portions of the first subset of the first sacrificial trench fill structures 71. Excess portions of the first backside bridge material can be removed from above the horizontal plane including the top surfaces of the second insulating cap layers 270 by a planarization process, which may comprise a chemical mechanical polishing (CMP) process and/or a recess etch process. Each remaining portion of the first backside bridge material that fills a respective one of the discrete recess regions constitutes a first backside bridge support structure 72. In one embodiment, the first backside bridge support structure 72 may comprise silicon oxide, a dielectric metal oxide, and/or a conductive material.

In one embodiment, top surfaces of the first backside bridge support structures 72 may be located within a horizontal plane including the top surfaces of the second insulating cap layer 270. In one embodiment, the bottom surfaces of the first backside bridge support structures 72 may be located above the horizontal plane including the bottom surfaces of the second insulating cap layer 270. In one embodiment, the thickness of the first backside bridge support structures 72 may be less than the thickness of the second insulating cap layers 270. For example, the first backside bridge support structures 72 may have a thickness in a range from 50 nm to 500 nm, such as from 100 nm to 400 nm, and/or from 200 nm to 300 nm, although lesser and greater thicknesses may also be employed. The length of each first backside bridge support structure 72 along the first horizontal direction hd1 may be in a range from 50 nm to 1,000 nm, such as from 100 nm to 500 nm, although lesser and greater lengths may also be employed. The first backside bridge support structures 72 within each row of first backside bridge support structures 72 may be arranged with a periodicity, which may be in a range from 200 nm to 10,000 nm, such as from 500 nm to 5,000 nm, although lesser and greater periodicities may also be employed.

Generally, first backside bridge support structures 72 can be formed in upper portions of the first subset of the first sacrificial trench fill structures 71 that are located within the first subset of the lower-level backside trenches 179. Each of the first backside support bridge structures 72 can be located at a first vertical spacing vs1 from the substrate 8. The first vertical spacing vs1 is a vertical distance between the top surface of the substrate 8 and the bottom surfaces of the first backside support bridge structures 72. In one embodiment, the lower-level backside trenches 179 comprise a second subset of the lower-level backside trenches 1792 that are free of any backside bridge support structure after formation of the first backside bridge support structures 72.

Figure 12A:
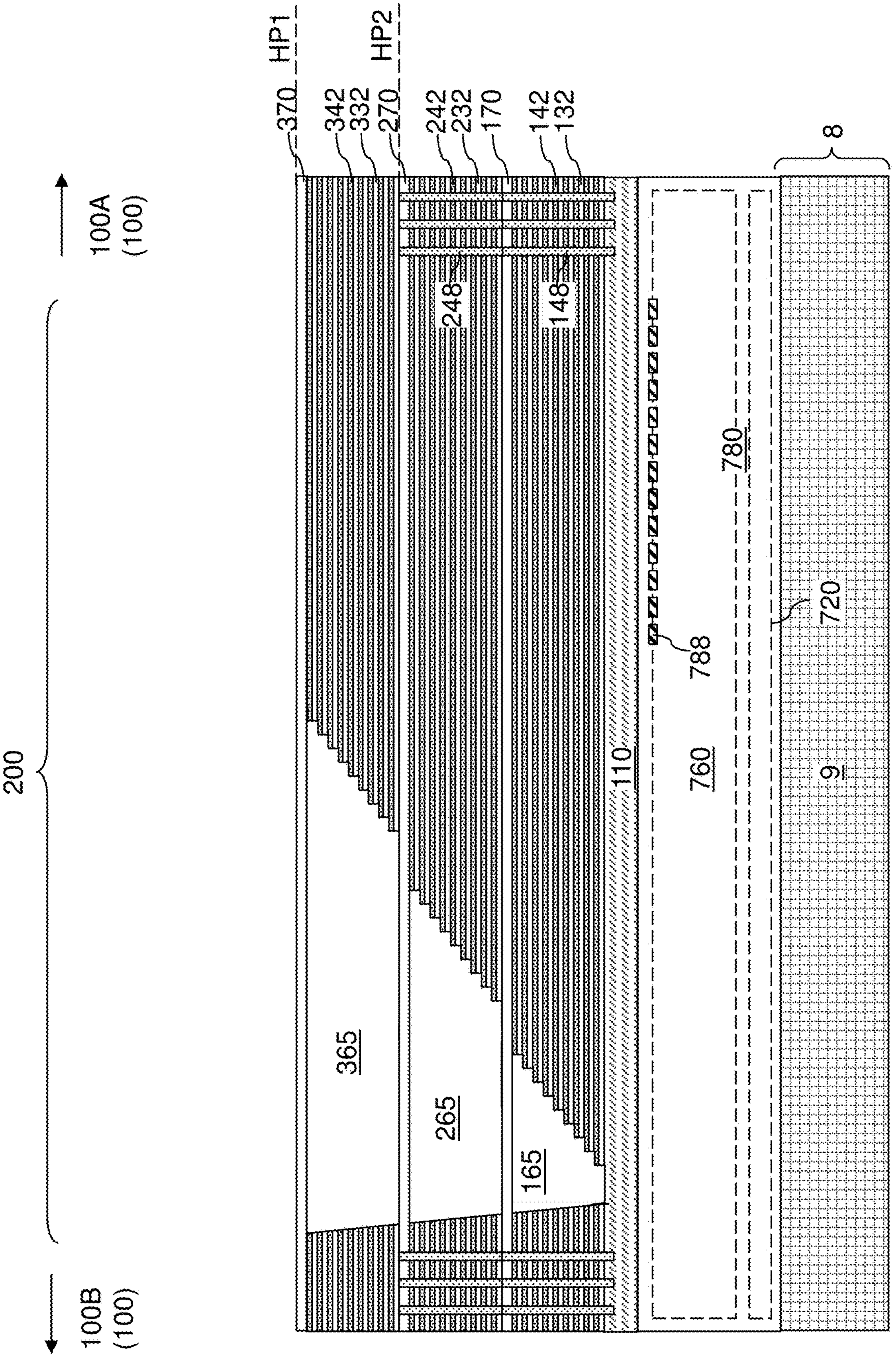
FIG. 12A is a vertical cross-sectional view of the exemplary structure along the first horizontal direction after formation of a third vertically alternating sequence of third continuous insulating layers and third continuous sacrificial material layers and third-tier retro-stepped dielectric material portions according to an embodiment of the present disclosure.
Figure 12B:
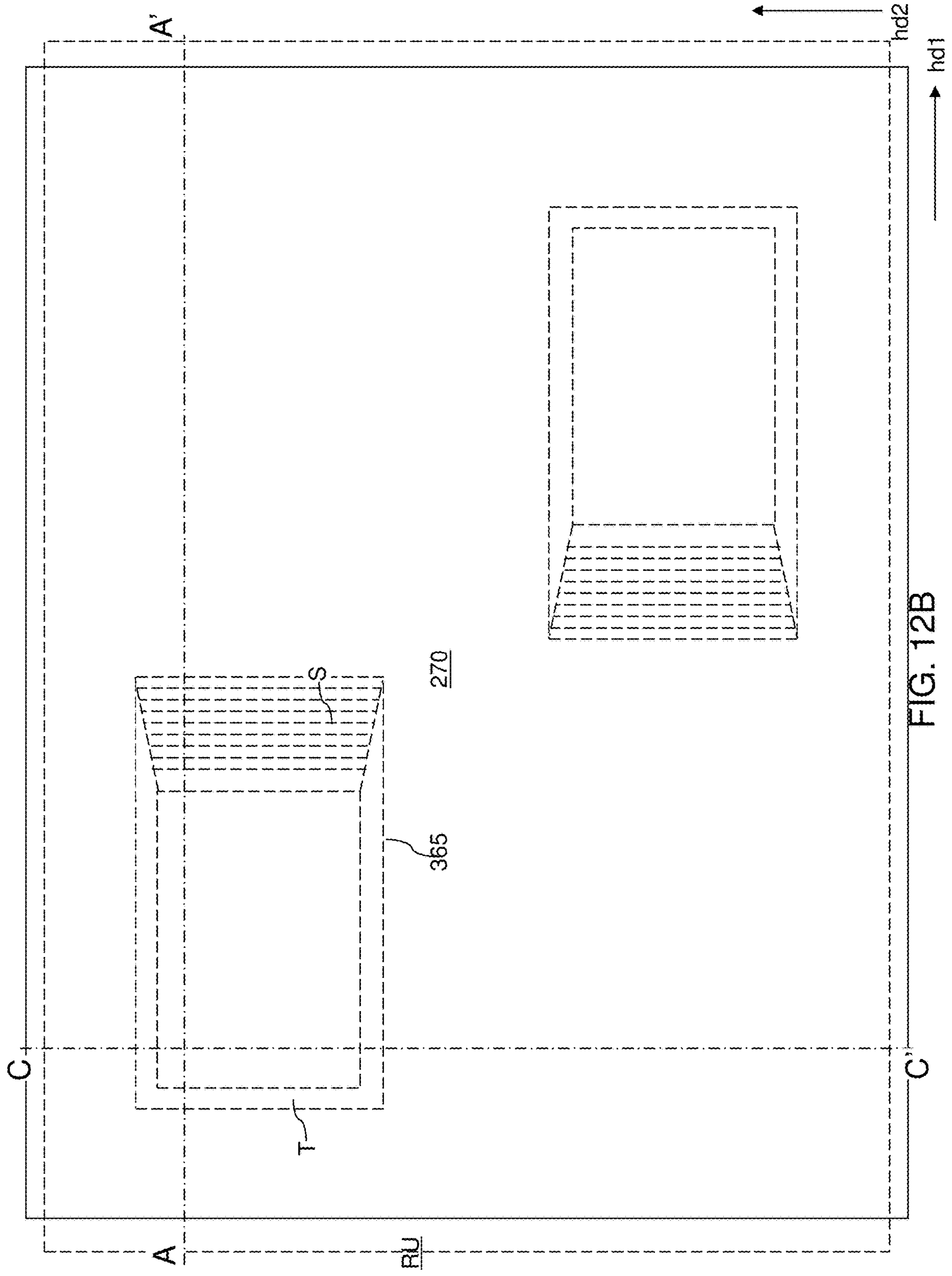
FIG. 12B is a top-down view of the exemplary structure of FIG. 12A. The vertical plane A-A' is the plane of the vertical cross-sectional view of FIG. 12A.
Figure 12C:
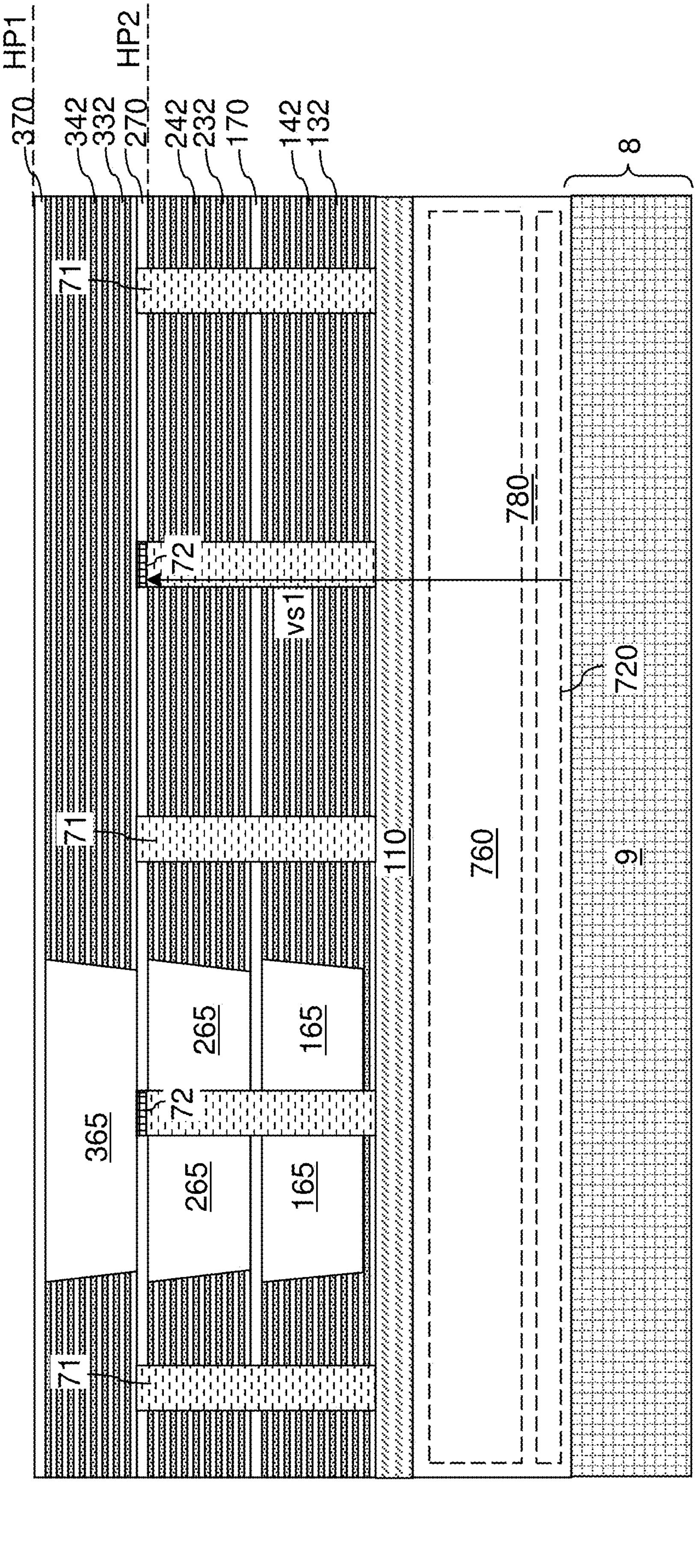
FIG. 12C is a vertical cross-sectional view of the exemplary structure along a vertical plane C-C' of FIG. 12B.

Referring to FIGS. 12A-12C, a third vertically alternating sequence of third insulating layers 332 and third sacrificial material layers 342 can be formed over the second-tier structure (232, 242, 265, 270, 248), the first sacrificial trench fill structures 71, and the first backside support bridge structures 72. Each of the third insulating layers 332 may be formed as single continuous material layer, and thus, may be referred to as a third continuous insulating layer. Each of the third sacrificial material layers 342 may be formed as a single continuous material layer, and thus, may be formed as a third continuous sacrificial material layer. Each of the third insulating layers 332 and the third sacrificial material layers 342 may have a thickness in a range from 20 nm to 80 nm, although lesser and greater thicknesses may also be employed. In one embodiment, the third vertically alternating sequence of third insulating layers 332 and third sacrificial material layers 342 may include a periodic repetition of a unit layer stack including a third insulating layer 332 and a third sacrificial material layer 342. The total number of repetitions of the unit layer stack may be in a range from 4 to 1,024, such as from 16 to 256, although lesser and greater numbers of repetition may also be employed. The third insulating layers 332 may comprise, and/or may consist essentially of, an insulating material such as undoped silicate glass or a doped silicate glass. The third sacrificial material layers 342 may comprise, and/or may consist essentially of, a sacrificial material such as silicon nitride, a silicon-germanium alloy, organosilicate glass, or a polymer material. Generally, the third sacrificial material layers 342 comprise a material that may be removed selective to the materials of the third insulating layers 332. Generally, an additional alternating sequence of additional continuous insulating layers and additional continuous sacrificial material layers can be formed over the first sacrificial trench fill structures 71 and the first backside support bridge structures 72.

The processing steps described with reference to FIGS. 3A and 3B may be performed again with a change in the pattern of openings in masking layers. A set of third stepped surfaces may be formed adjacent to each set of second stepped surfaces. In one embodiment, the set of third stepped surfaces may be laterally offset from a most proximal set of second stepped surfaces along the first horizontal direction hd1. Further, portions of the third vertically alternating sequence (332, 342) that overlie areas of the second retro-stepped dielectric material portion 265 and the first retro-stepped dielectric material portions 165 can be removed. A dielectric fill material can be deposited in the third stepped cavities to form third retro-stepped dielectric material portions 365. A third insulating cap layer 370 can be formed over the third vertically alternating sequence (332, 342) and the third retro-stepped dielectric material portions 365. In one embodiment, the third insulating cap layer 370 comprises an insulating material such as silicon oxide, and has a thickness in a range from 100 nm to 600 nm, such as from 200 nm to 500 nm, and/or from 300 nm to 400 nm, although lesser and greater thicknesses may also be employed. The horizontal plane including the top surface of the third insulating cap layer 370 is hereafter referred to as a first horizontal plane HP1. The horizontal plane including the top surfaces of the second insulating cap layers 270 is hereafter referred to as a second horizontal plane HP2.

Figure 13:
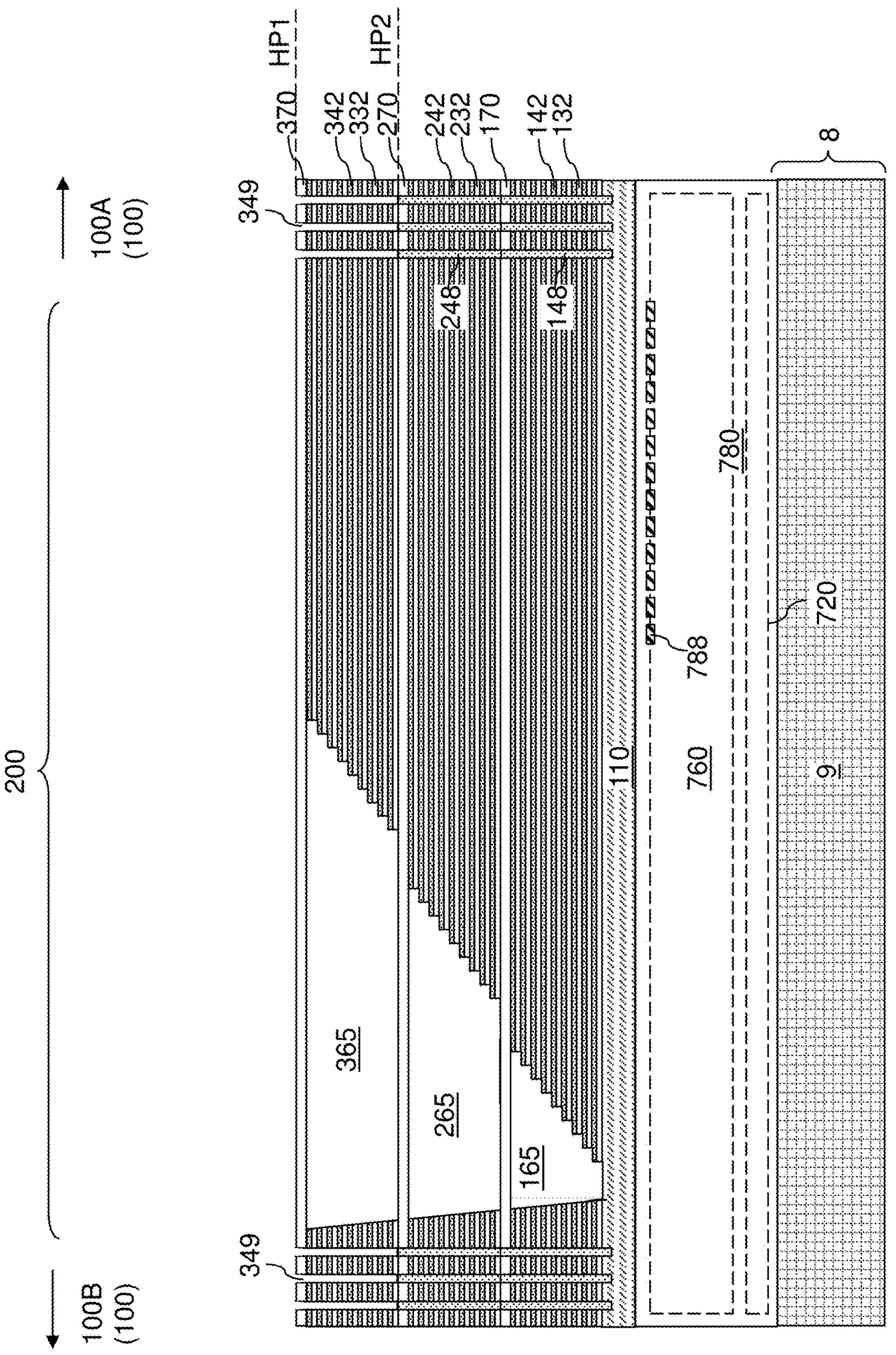
FIG. 13 is a vertical cross-sectional view of the exemplary structure after formation of third-tier openings according to an embodiment of the present disclosure.

Referring to FIG. 13, various third-tier openings can be formed through the third-tier structure (332, 342, 365, 370). A photoresist layer (not shown) can be applied over the third insulating cap layer 370, and can be lithographically patterned to form various openings therethrough. The pattern of the openings in the photoresist layer may be the same as the pattern of the sacrificial second-tier opening fill material portions within the second-tier structure (232, 242, 265, 270, 248). The pattern of openings in the photoresist layer can be transferred through the third-tier structure (332, 342, 365, 370) by a third anisotropic etch process to form the various third-tier openings concurrently. The various third-tier openings can include third-tier memory openings 349, third-tier support openings (not shown), and additional third-tier openings (not shown).

The third-tier memory openings 349 are openings that are formed in the memory array regions 100 through each layer within the third vertically alternating sequence (332, 342) and are subsequently employed to form memory stack structures therein. The third-tier memory openings 349 can have the same pattern, and can be formed directly on, the sacrificial second-tier memory opening fill material portions 148.

Figure 14:
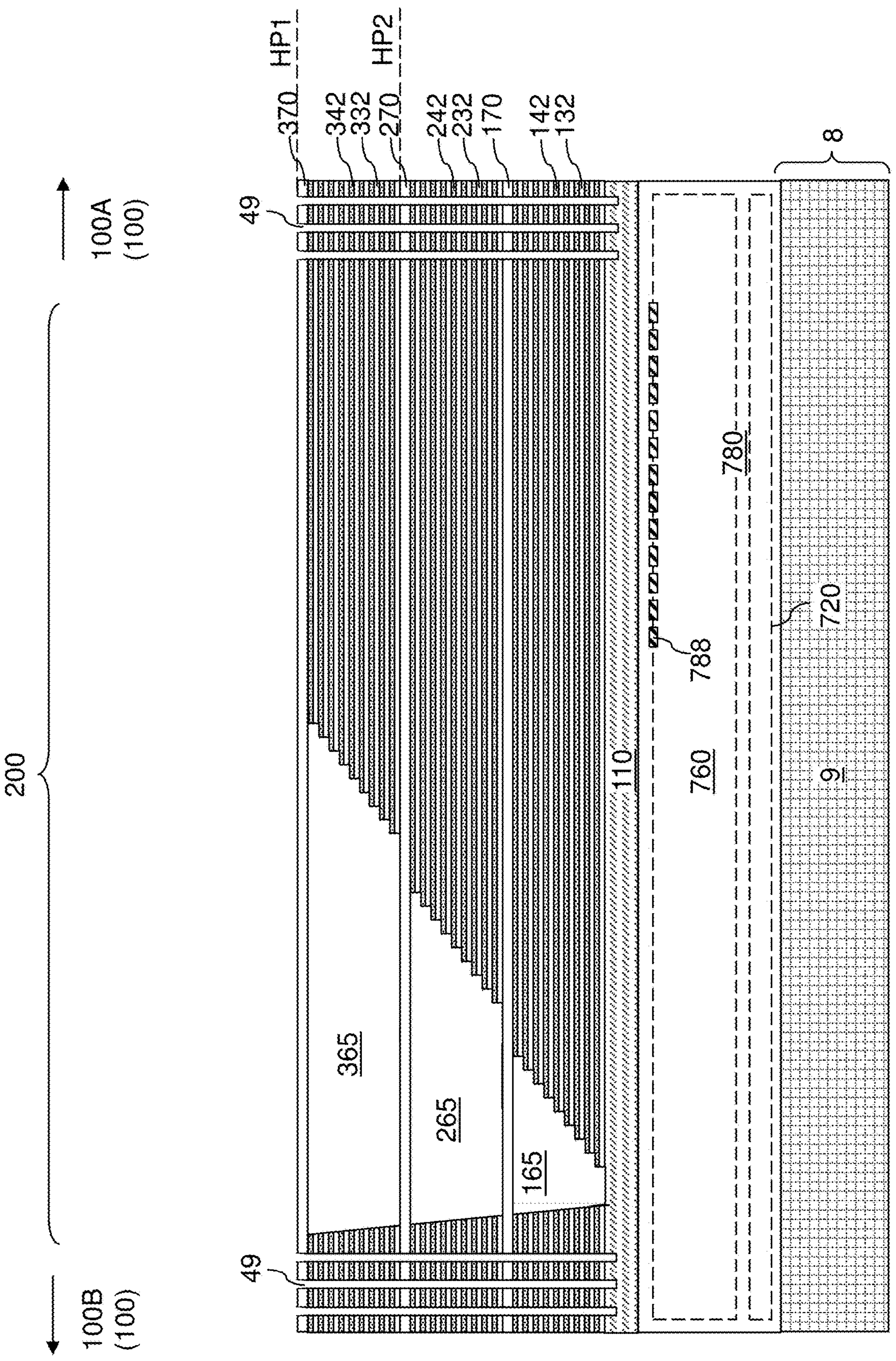
FIG. 14 is a vertical cross-sectional view of the exemplary structure after formation of inter-tier memory openings and inter-tier support openings according to an embodiment of the present disclosure.

Referring to FIG. 14, sacrificial second-tier opening fill material portions 248 and sacrificial first-tier opening fill material portions 148 can be removed selective to the alternating stacks of insulating layers (132, 232, 332) and sacrificial material layers (142, 242, 342) and selective to the semiconductor material layer 110. An isotropic etch process or an anisotropic etch process may be performed. In an illustrative example, if the sacrificial second-tier opening fill material portions and sacrificial first-tier opening fill material portions comprise amorphous carbon, an ashing process may be performed to remove the sacrificial second-tier opening fill material portions and sacrificial first-tier opening fill material portions. Various inter-tier openings are formed in the exemplary structure. The various inter-tier openings vertically extend through a respective first alternating stack (132, 142), a respective second alternating stack (232, 242), and a respective third alternating stack (332, 342). The inter-tier openings comprise inter-tier memory openings 49 that are formed in the memory array regions 100. The inter-tier memory openings 49 may also be referred to as memory openings 49. While additional inter-tier openings may be formed in the exemplary structure, such additional inter-tier openings are not illustrated for clarity. Such additional inter-tier openings may be employed to subsequently form support pillar structures (not illustrated) and/or connection via structures (not illustrated).

FIGS. 15A-15D illustrate sequential vertical cross-sectional views of a memory opening 49 during formation of a memory opening fill structure according to an embodiment of the present disclosure.

Figure 15A:
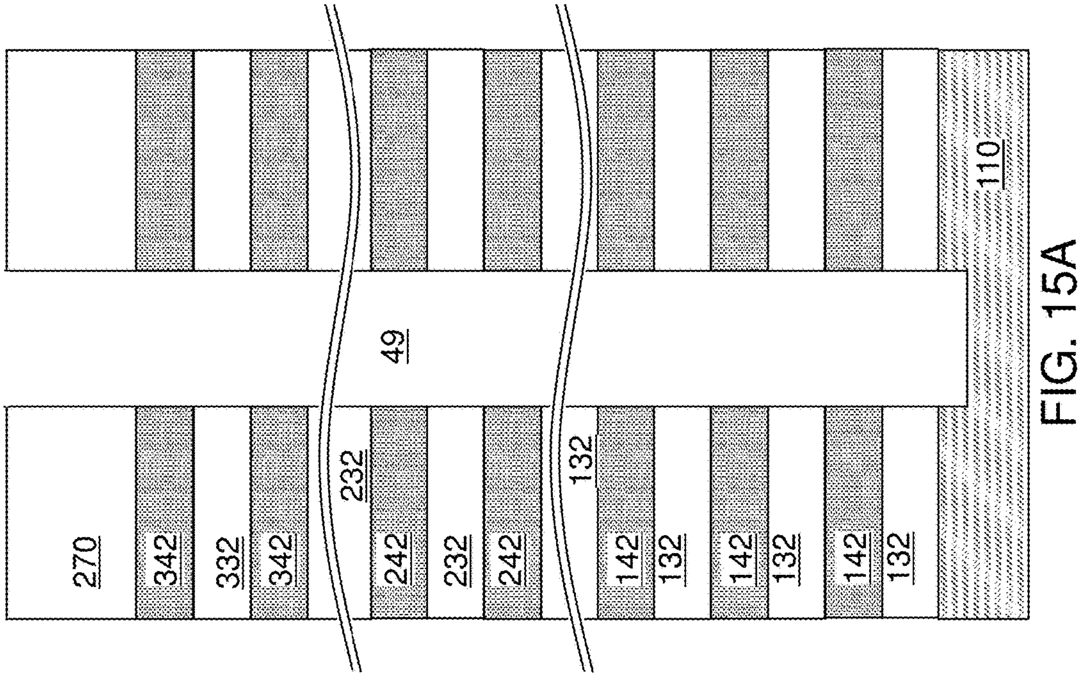
FIGS. 15A-15D illustrate sequential vertical cross-sectional views of a memory opening during formation of a memory opening fill structure according to an embodiment of the present disclosure.

Referring to FIG. 15A, a memory opening 49 in the exemplary structure of FIG. 14 is illustrated. The memory opening 49 extends through a first-tier structure, a second-tier structure, and a third-tier structure.

Figure 15B:
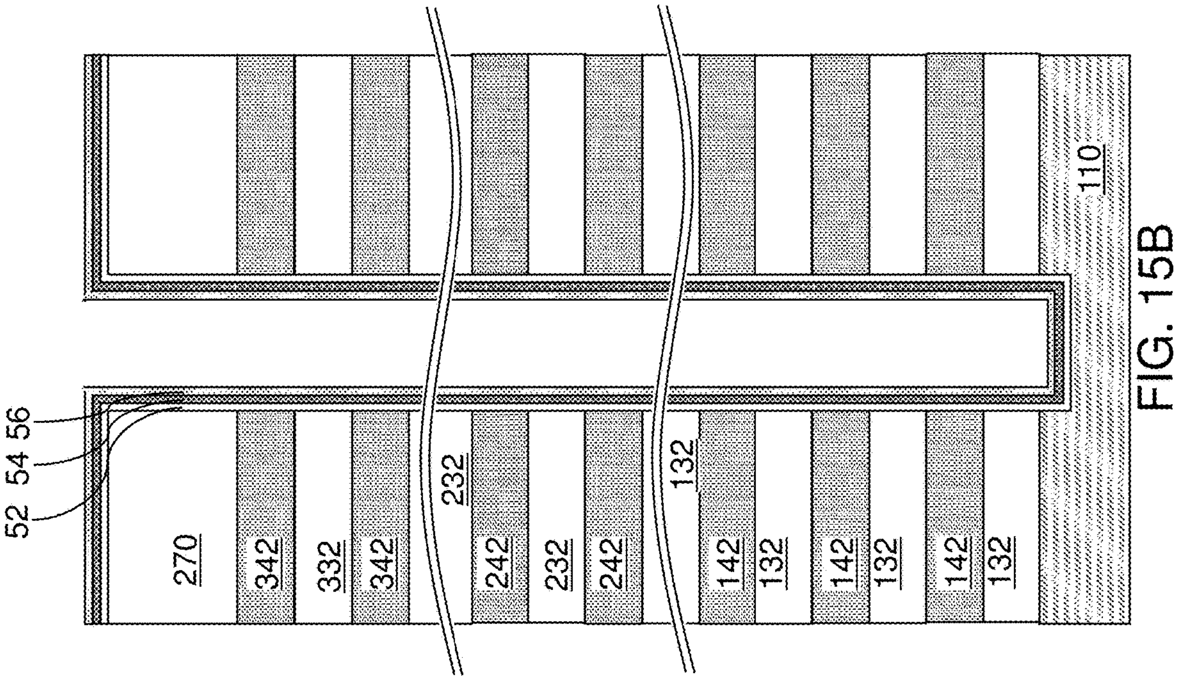

Referring to FIG. 15B, a stack of layers including an optional blocking dielectric layer 52, a memory material layer 54, an optional dielectric liner 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

The optional dielectric liner 56, if present, includes a dielectric material. In case the memory material layer 54 comprises a charge storage material, the dielectric liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed. The stack of the blocking dielectric layer 52, the memory material layer 54, and the dielectric liner 56 constitutes a memory film 50 that stores memory bits.

Figure 15D:
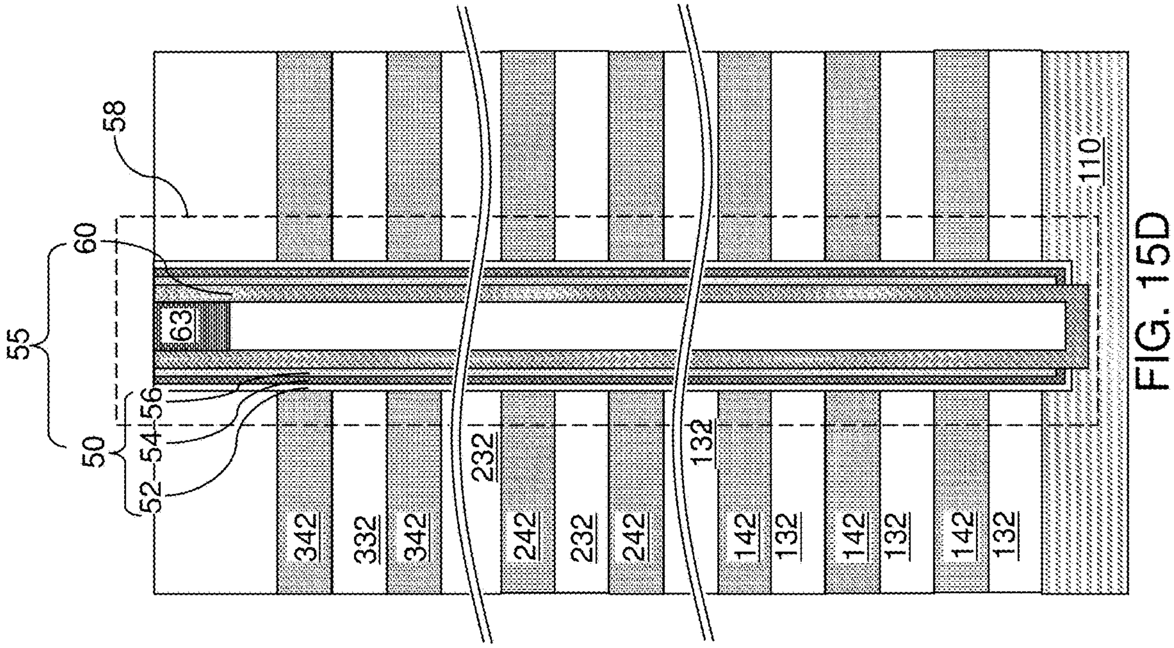
Figure 15C:
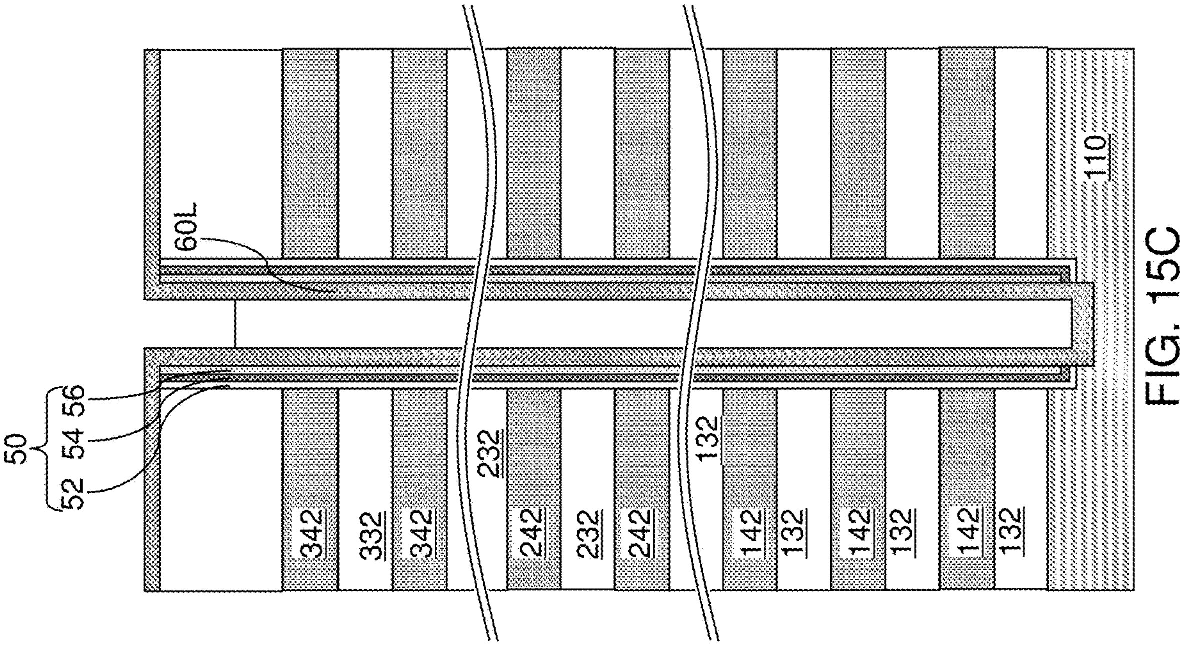

Referring to FIG. 15C, an anisotropic etch process can be performed to remove horizontally-extending portions of the dielectric liner 56, the memory material layer 54, and the blocking dielectric layer 52. Each remaining contiguous combination of an optional blocking dielectric layer 52, a memory material layer 54, and an optional dielectric liner 56 constitutes a memory film 50. A top surface of the semiconductor material layer 110 can be physically exposed at the bottom of each memory opening 49.

A semiconductor channel material layer 60L can be conformally deposited over the memory film 50 within each memory opening 49. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity may be present in the volume of each memory opening 49 that is not filled with the deposited material layers (52, 54, 56, 60L).

In case the cavity in each memory opening is not completely filled by the semiconductor channel material layer 60L, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the third insulating cap layer 370 and the bottom surface of the third insulating cap layer 370. Each remaining portion of the dielectric core layer constitutes a dielectric core 62.

Referring to FIG. 15D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the dielectric liner 56, the memory material layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A dielectric liner 56 is surrounded by a memory material layer 54, and laterally surrounds a vertical semiconductor channel 60. Each adjoining set of a blocking dielectric layer 52, a memory material layer 54, and a dielectric liner 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric liner 56, a plurality of memory elements as embodied as portions of the memory material layer 54, and an optional blocking dielectric layer 52. Each combination of a memory stack structure 55, a dielectric core 62, and a drain region 63 within a memory opening 49 constitutes a memory opening fill structure 58.

Figure 16A:
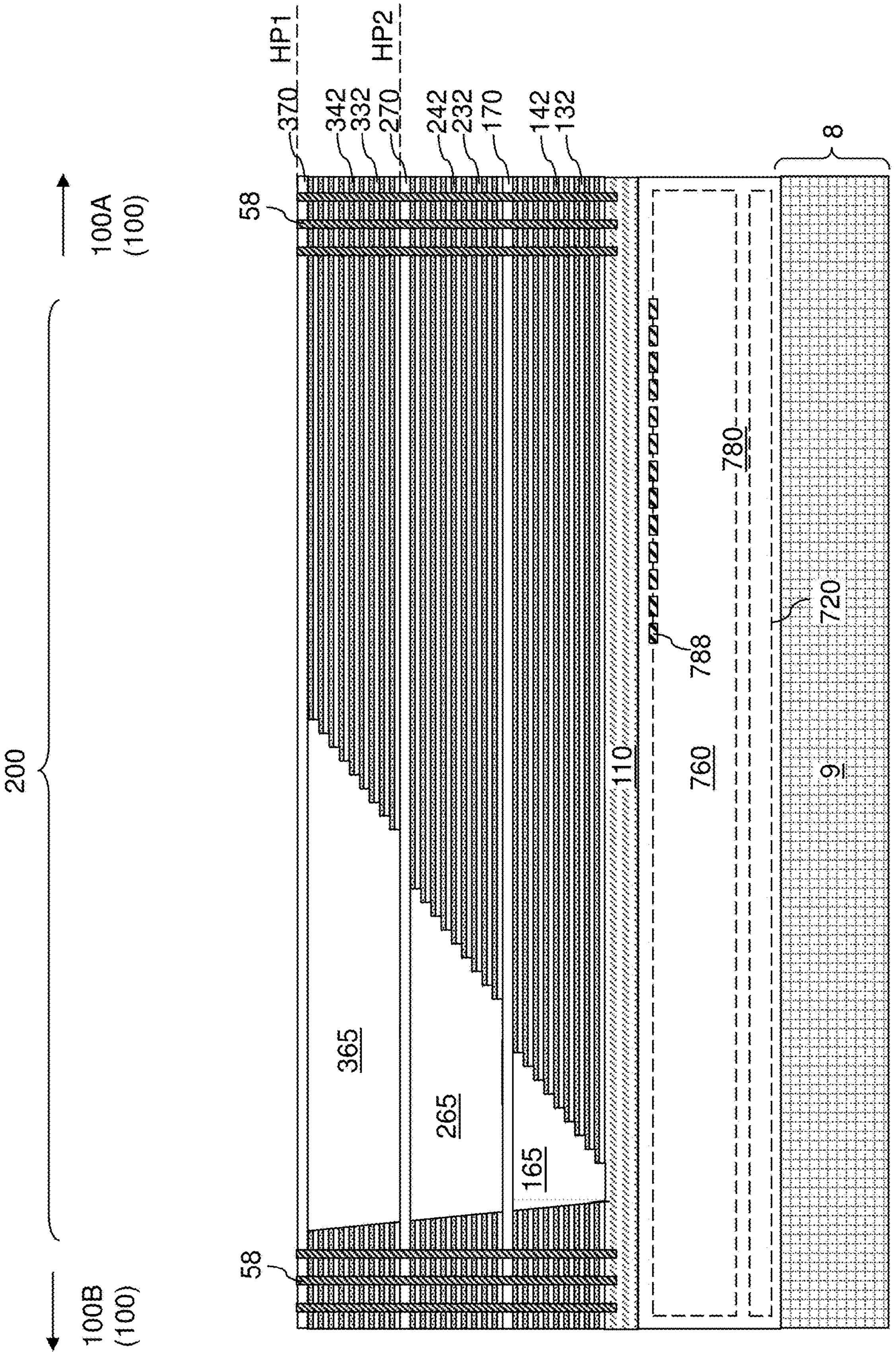
FIG. 16A is a vertical cross-sectional view of the exemplary structure after formation of memory opening fill structures and support pillar structures according to an embodiment of the present disclosure.
Figure 16B:
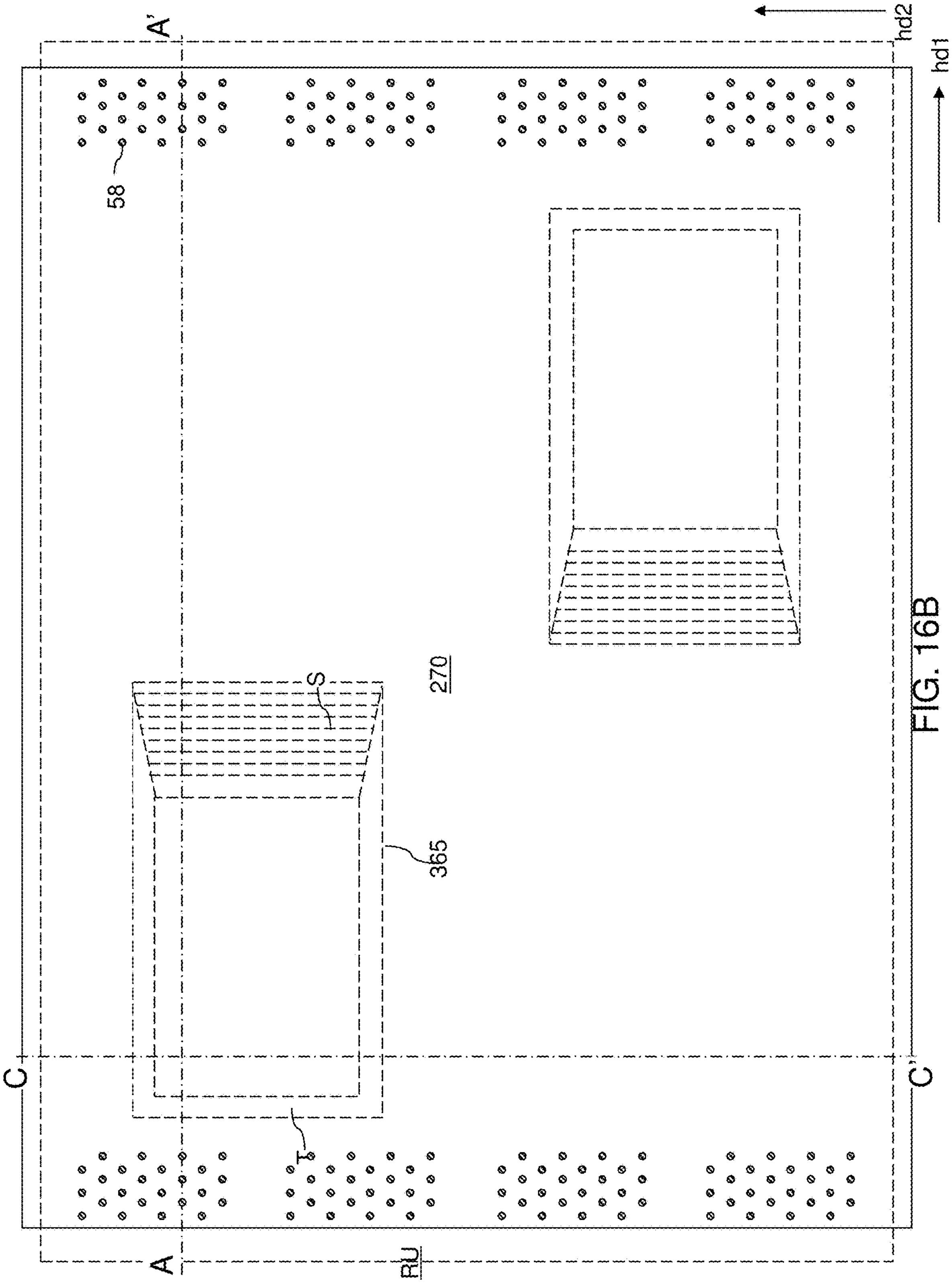
FIG. 16B is a top-down view of the exemplary structure of FIG. 16A. The vertical plane A-A' is the plane of the vertical cross-sectional view of FIG. 16A.
Figure 16C:
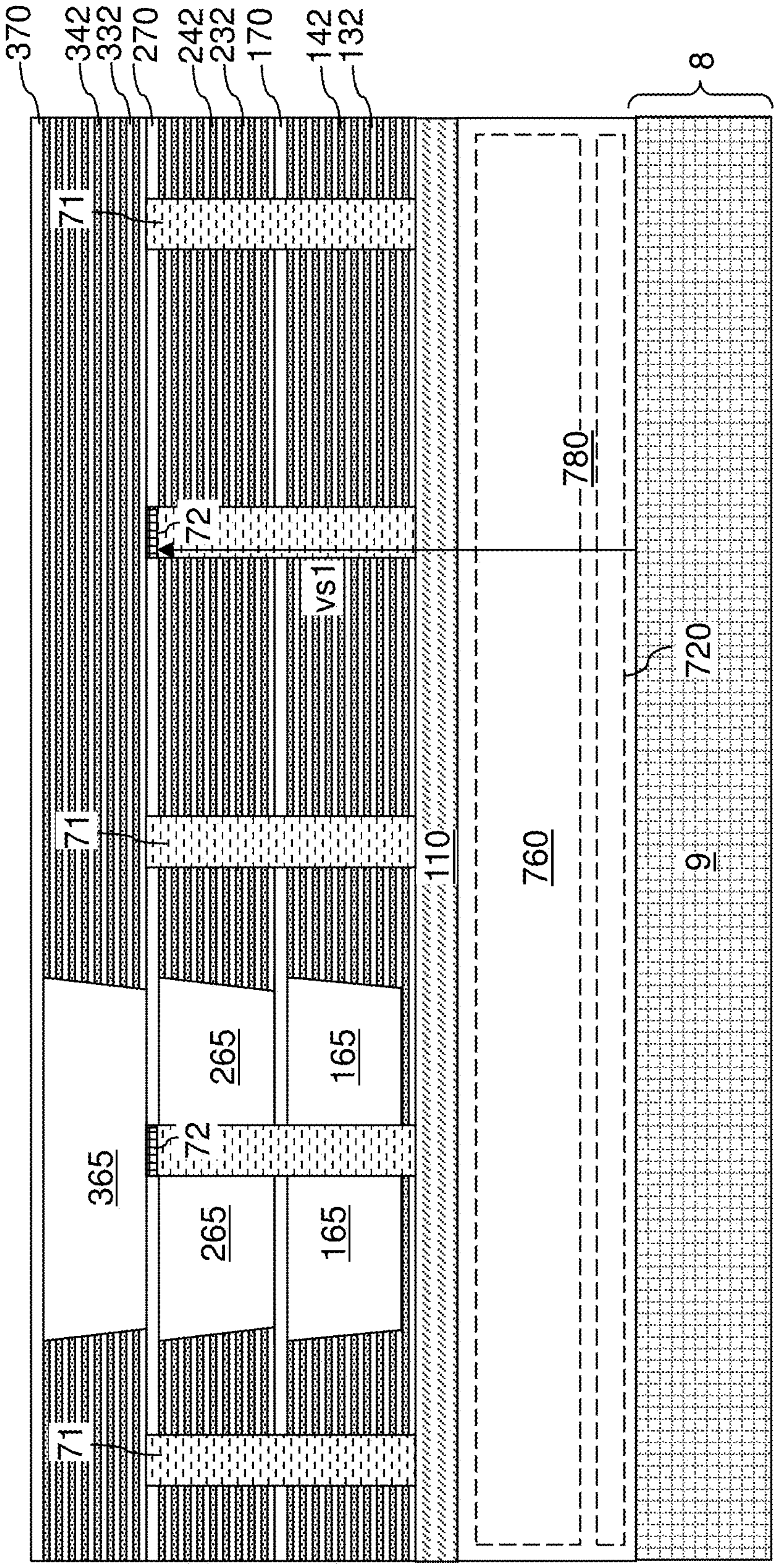
FIG. 16C is a vertical cross-sectional view of the exemplary structure along the vertical plane C-C' of FIG. 16B.
Figure 17A:
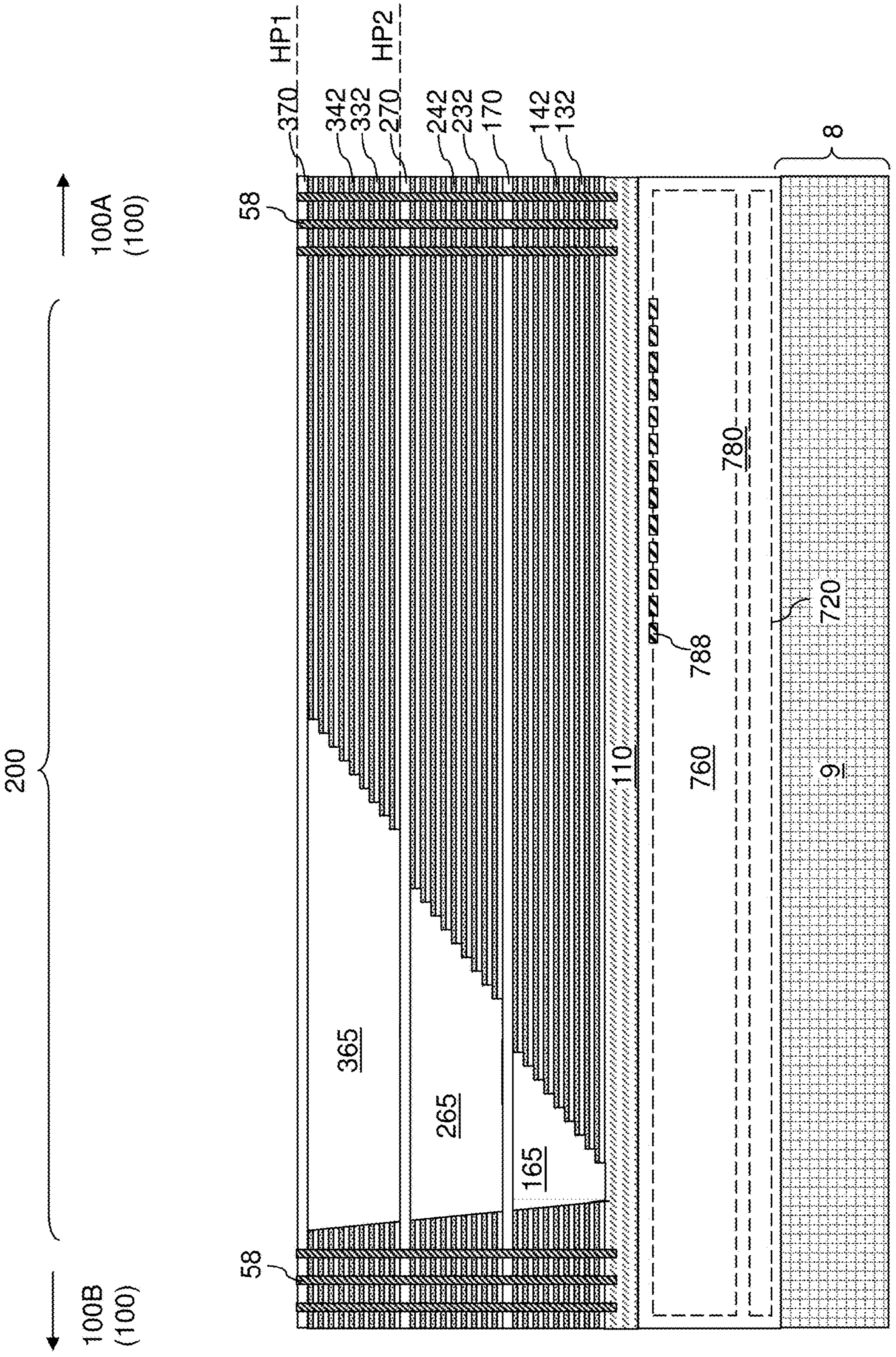
FIG. 17A is a vertical cross-sectional view of the exemplary structure after formation of upper-level backside trenches according to an embodiment of the present disclosure.
Figure 17B:
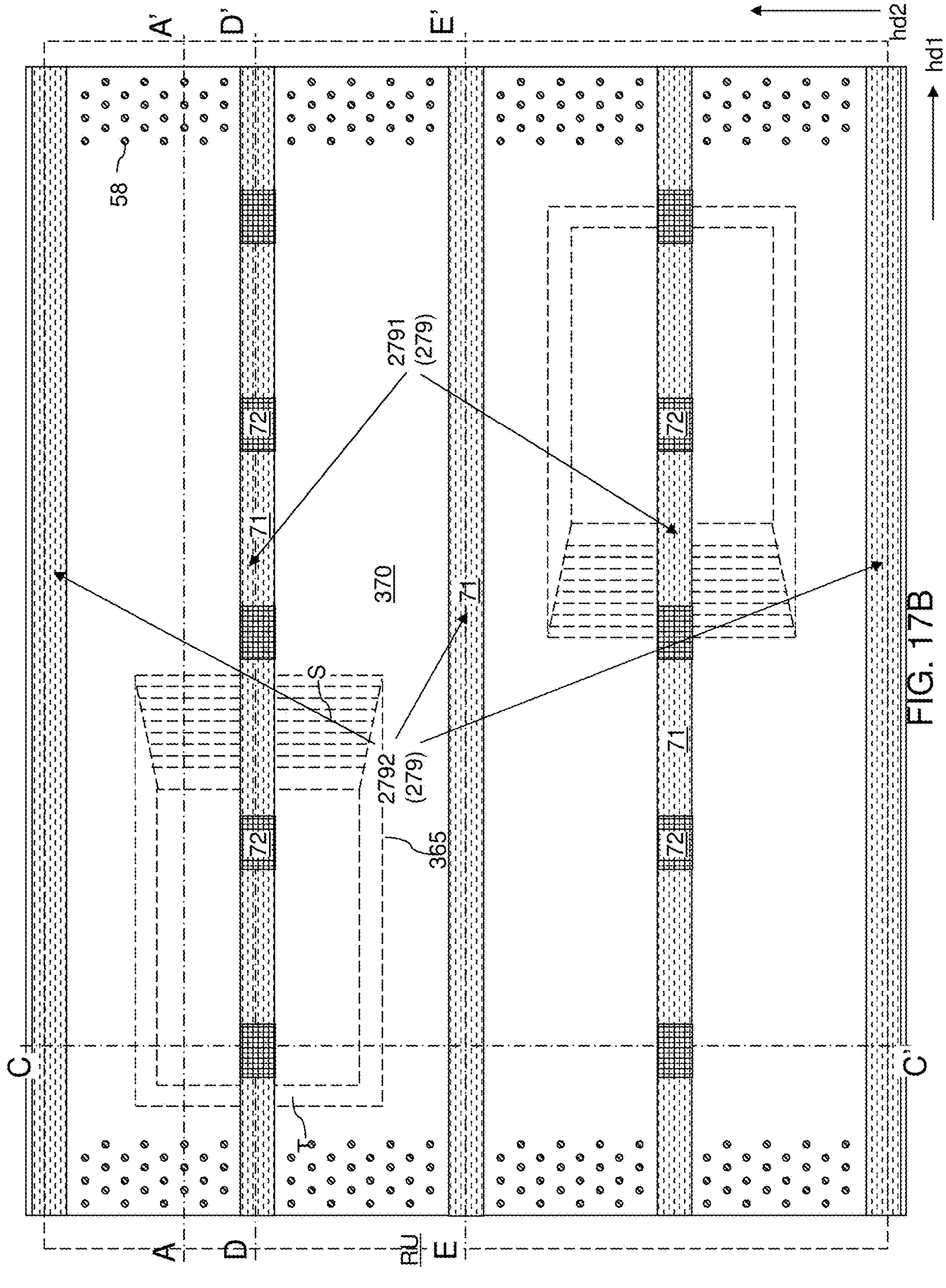
FIG. 17B is a top-down view of the exemplary structure of FIG. 17A. The vertical plane A-A' is the plane of the vertical cross-sectional view of FIG. 17A.
Figure 17C:
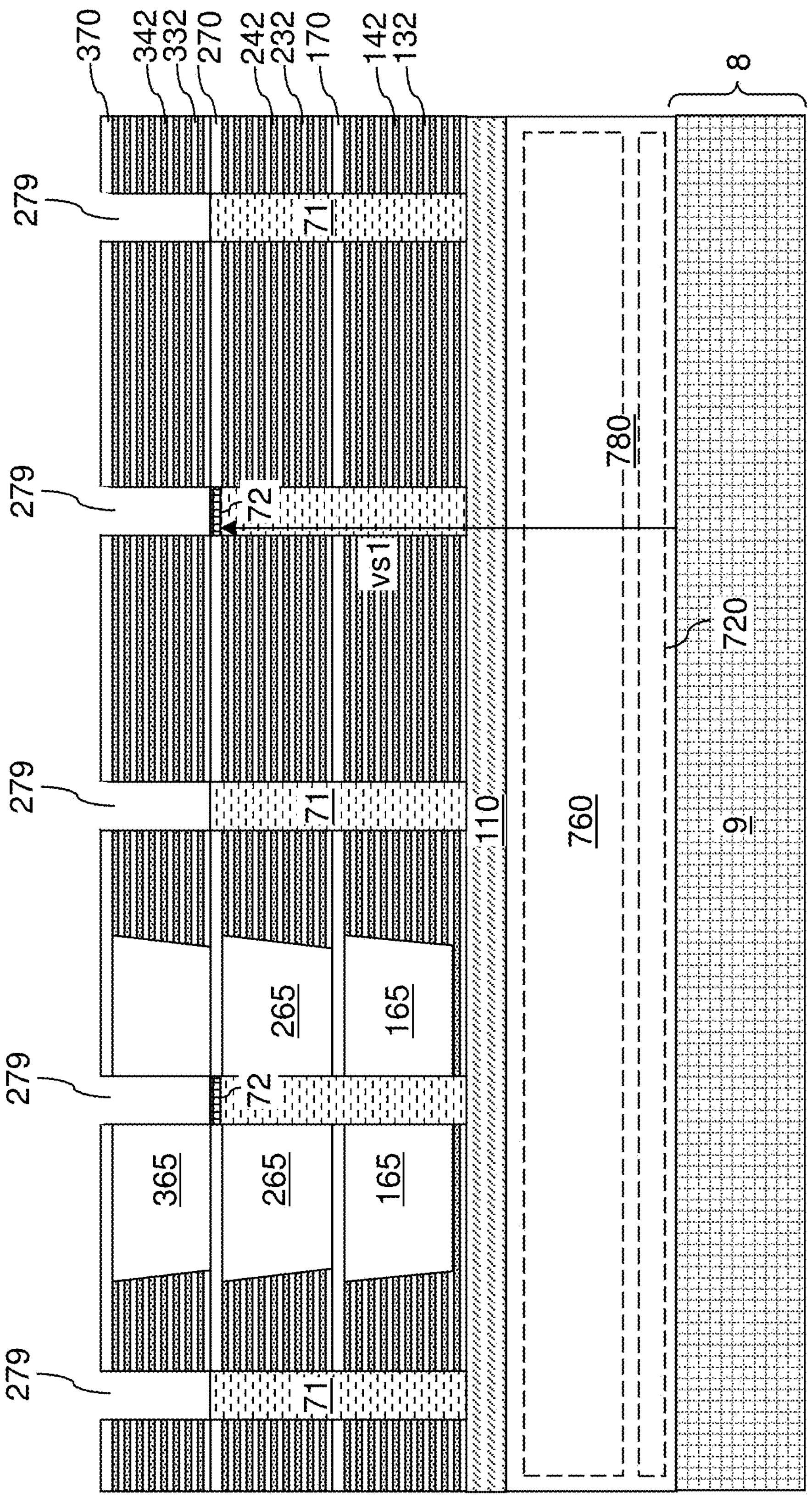
FIG. 17C is a vertical cross-sectional view of the exemplary structure along the vertical plane C-C' of FIG. 17B.
Figure 17D:
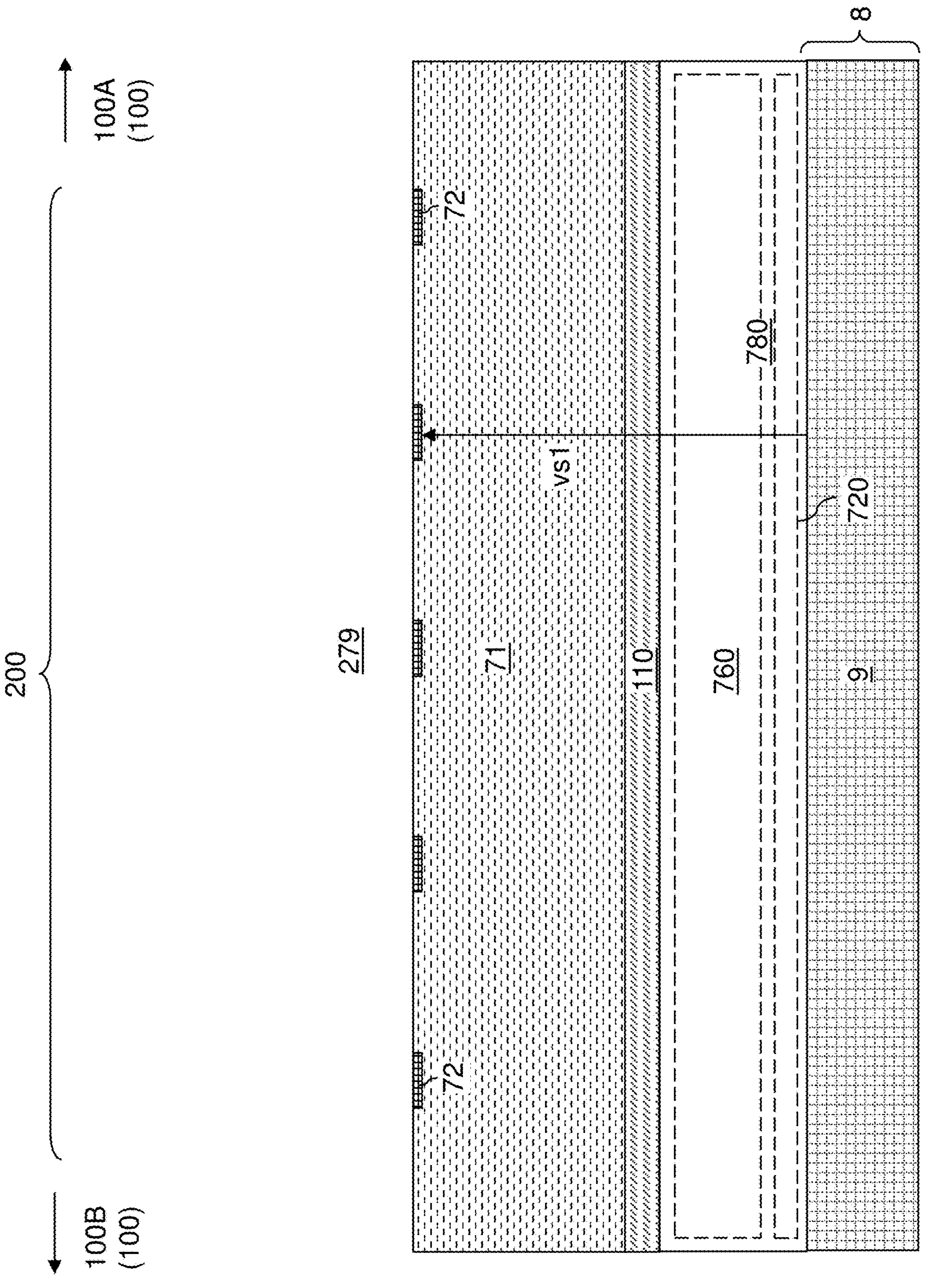
FIG. 17D is a vertical cross-sectional view of the exemplary structure along the vertical plane D-D' of FIG. 17B.
Figure 17E:
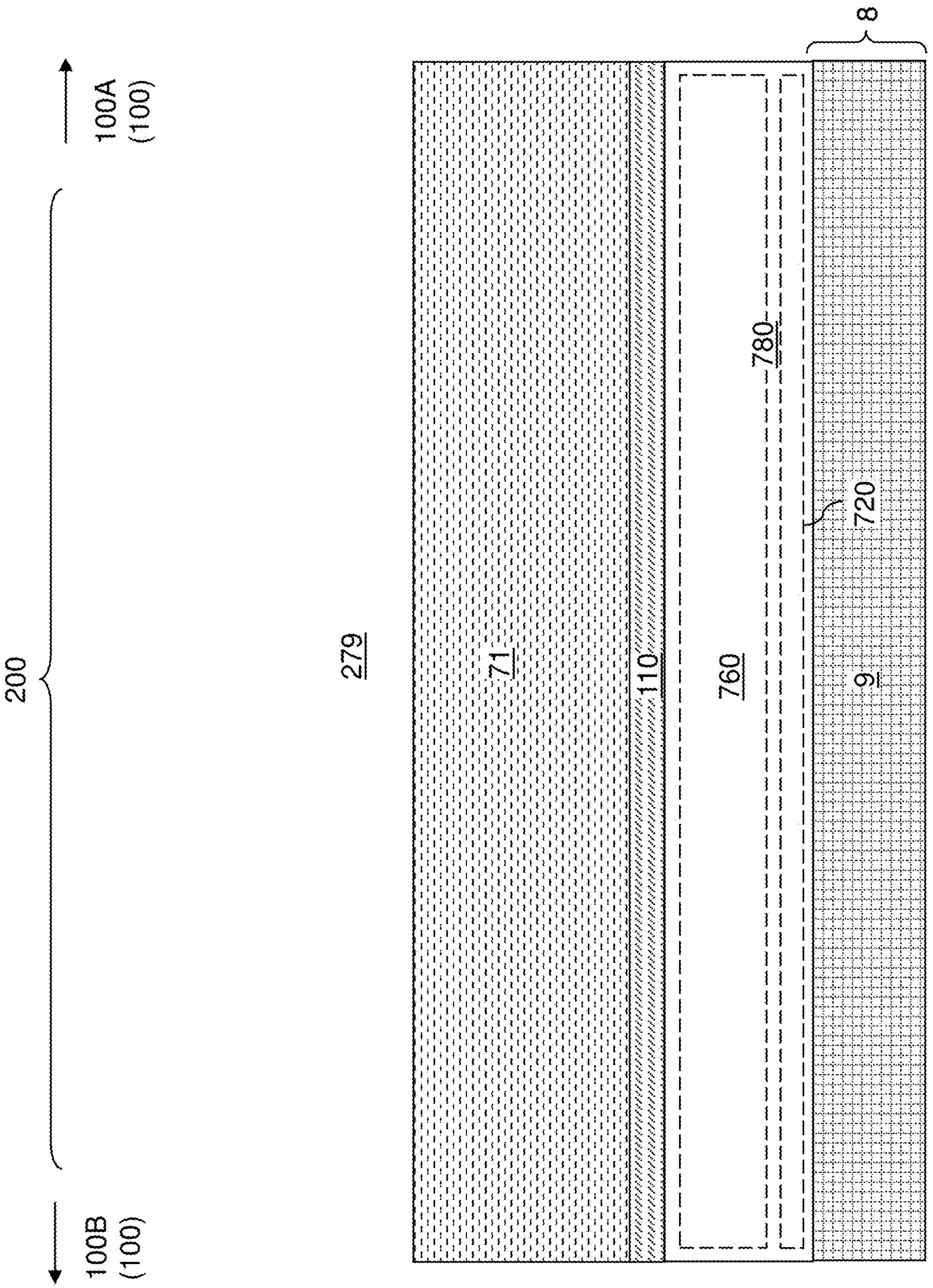
FIG. 17E is a vertical cross-sectional view of the exemplary structure along the vertical plane E-E' of FIG. 17B.
Figure 18A:
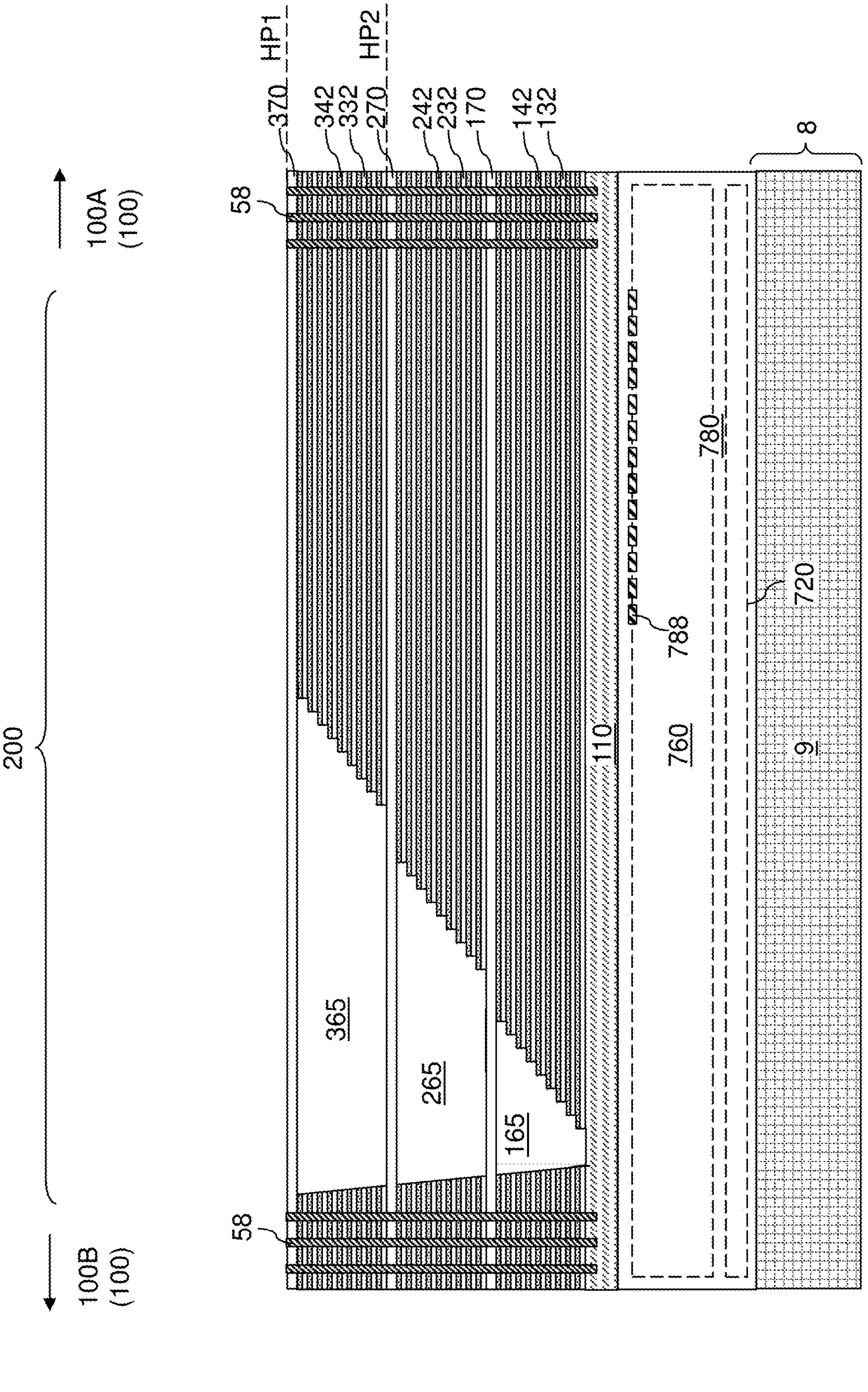
FIG. 18A is a vertical cross-sectional view of the exemplary structure after formation of second sacrificial trench fill structures according to an embodiment of the present disclosure.
Figure 18B:
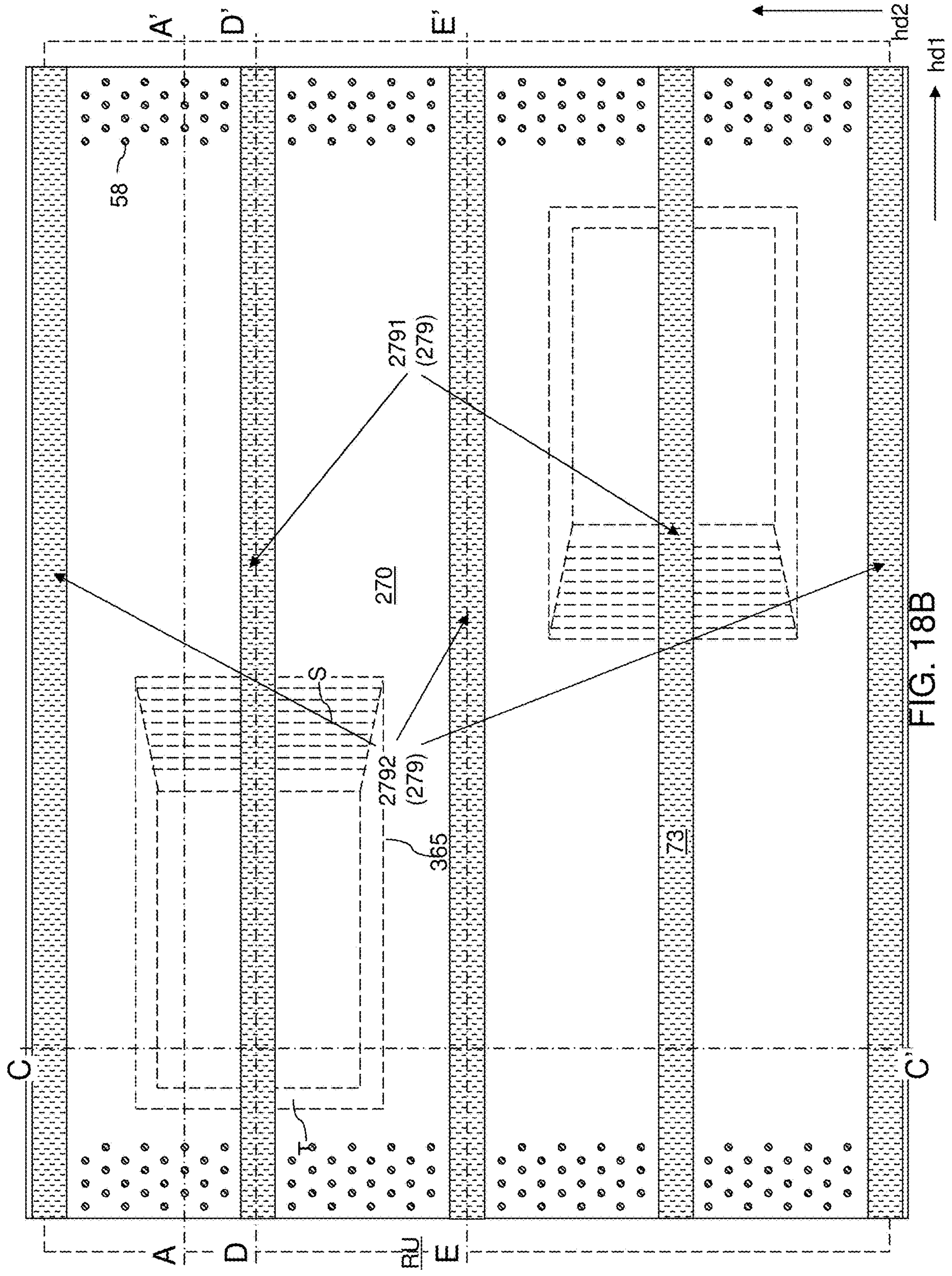
FIG. 18B is a top-down view of the exemplary structure of FIG. 18A. The vertical plane A-A' is the plane of the vertical cross-sectional view of FIG. 18A.
Figure 18C:
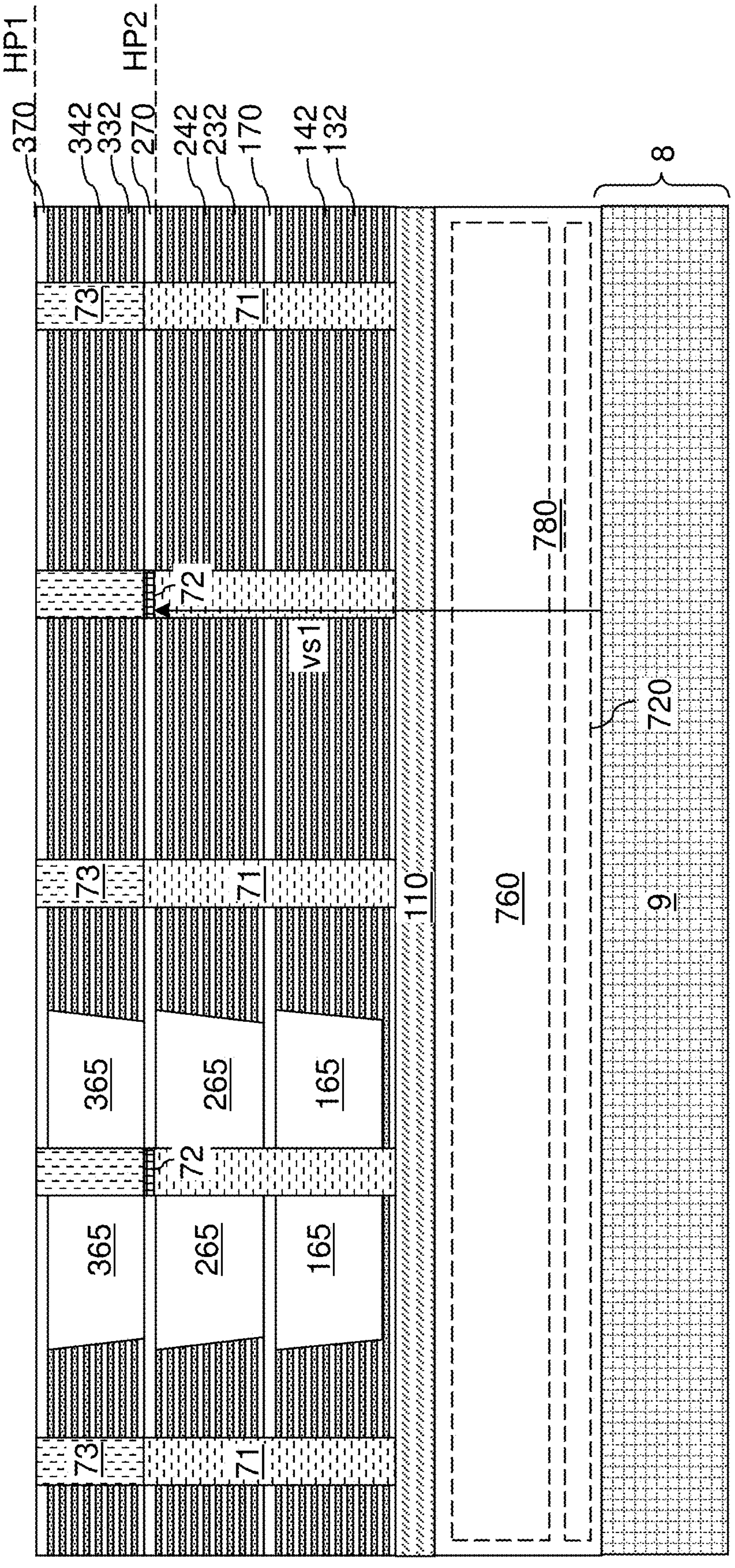
FIG. 18C is a vertical cross-sectional view of the exemplary structure along the vertical plane C-C' of FIG. 18B.
Figure 18D:
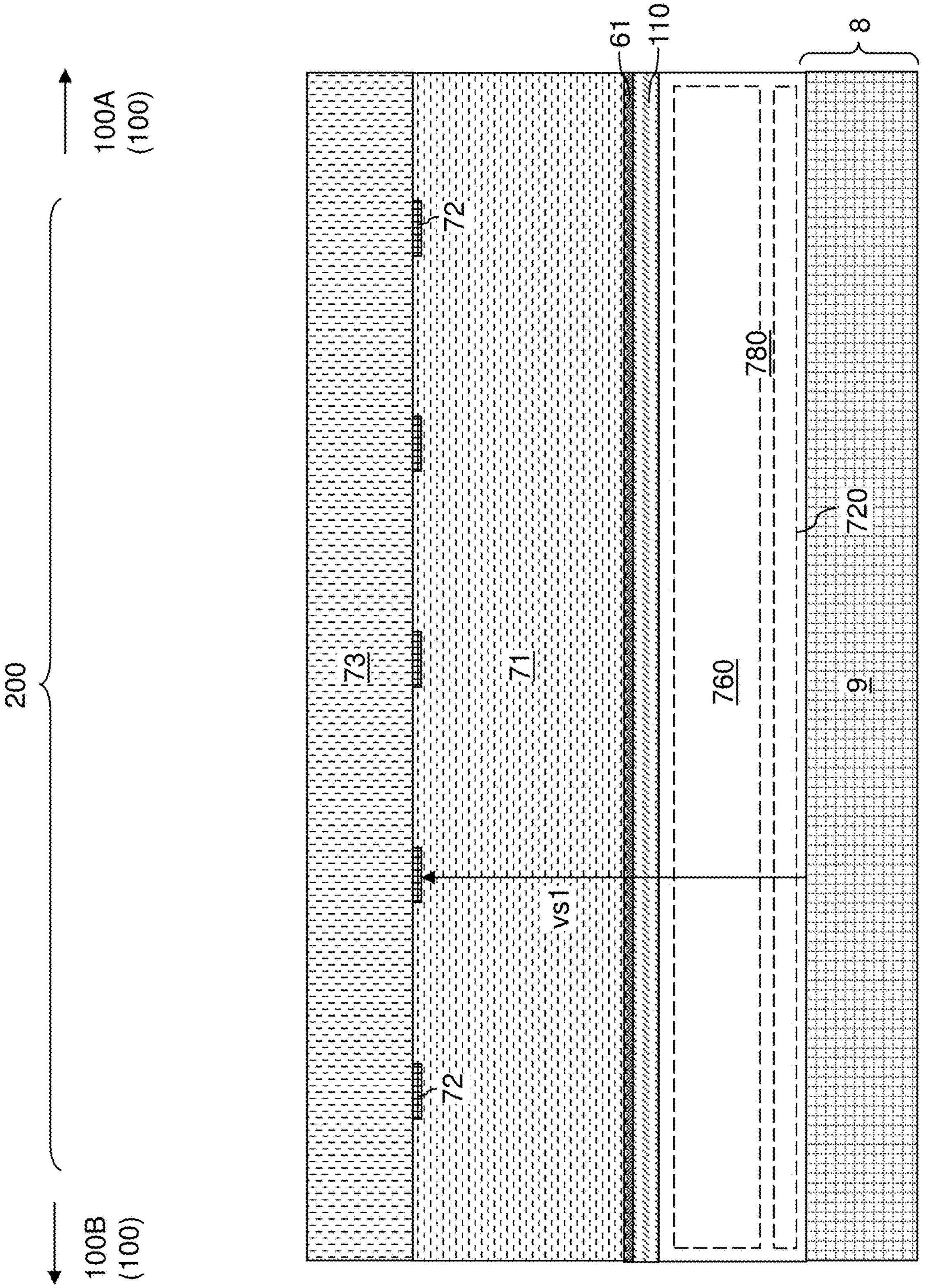
FIG. 18D is a vertical cross-sectional view of the exemplary structure along the vertical plane D-D' of FIG. 18B.
Figure 18E:
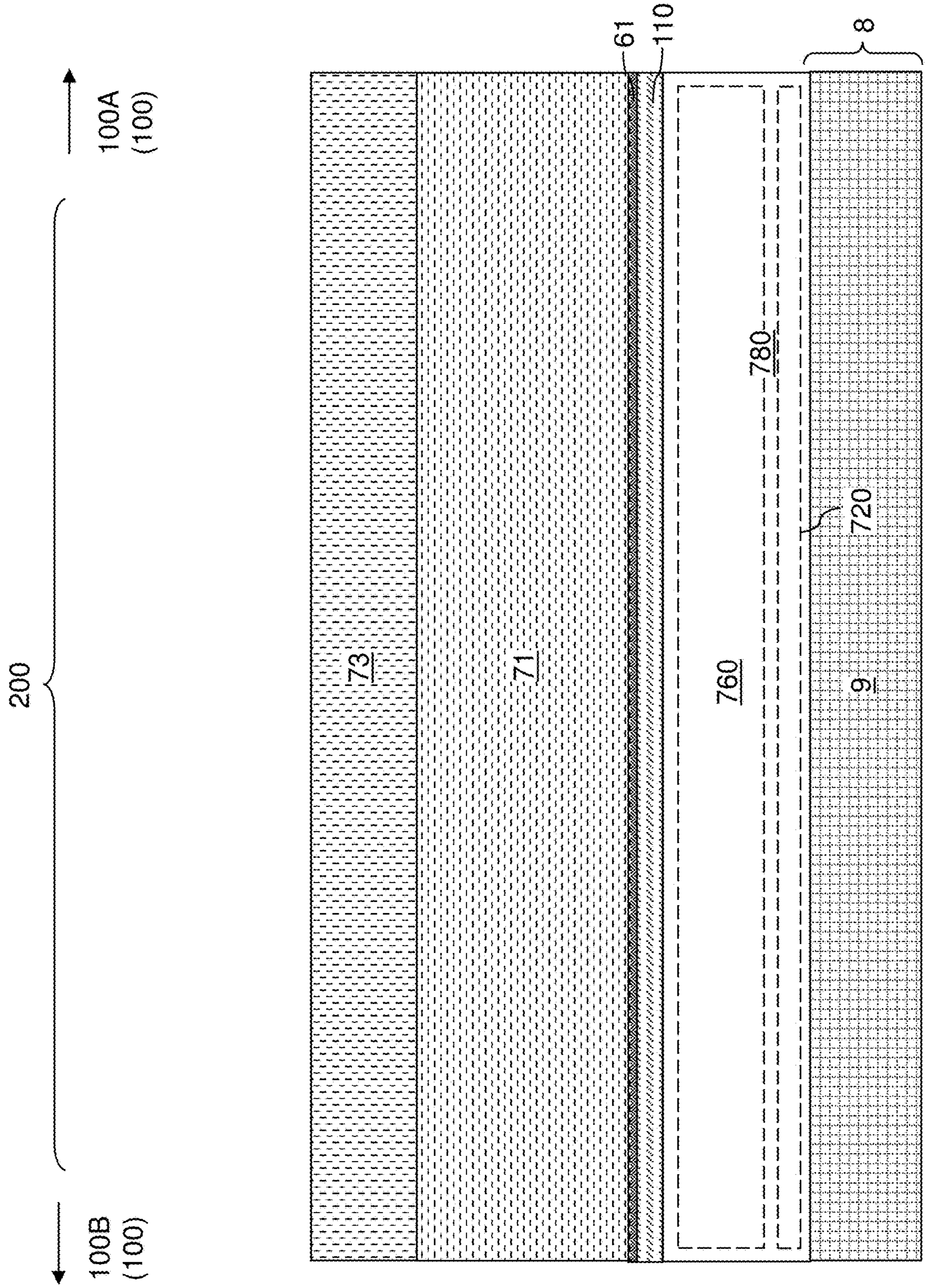
FIG. 18E is a vertical cross-sectional view of the exemplary structure along the vertical plane E-E' of FIG. 18B.
Figure 19A:
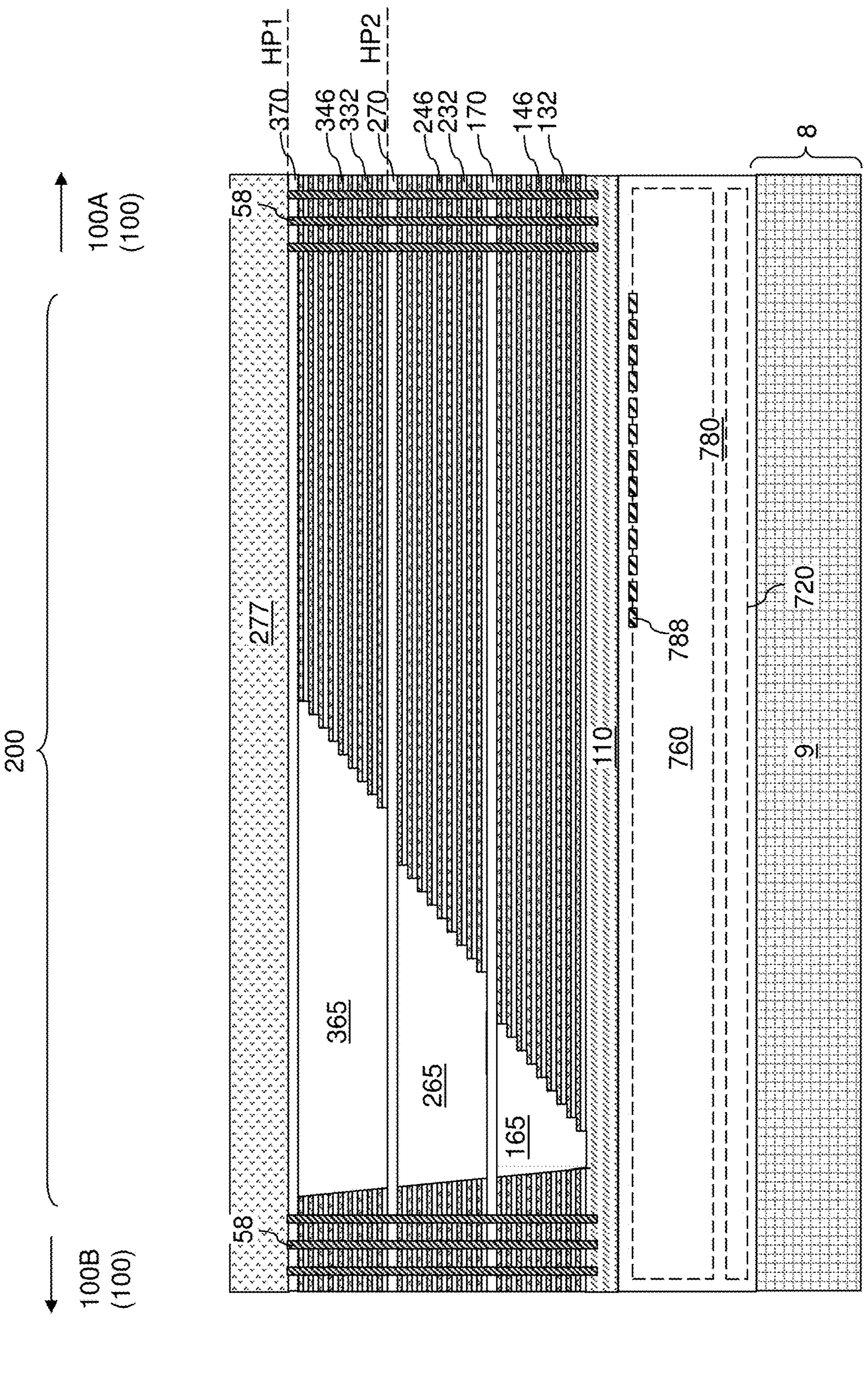
FIG. 19A is a vertical cross-sectional view of the exemplary structure after formation of second backside bridge support structures according to an embodiment of the present disclosure.
Figure 19B:
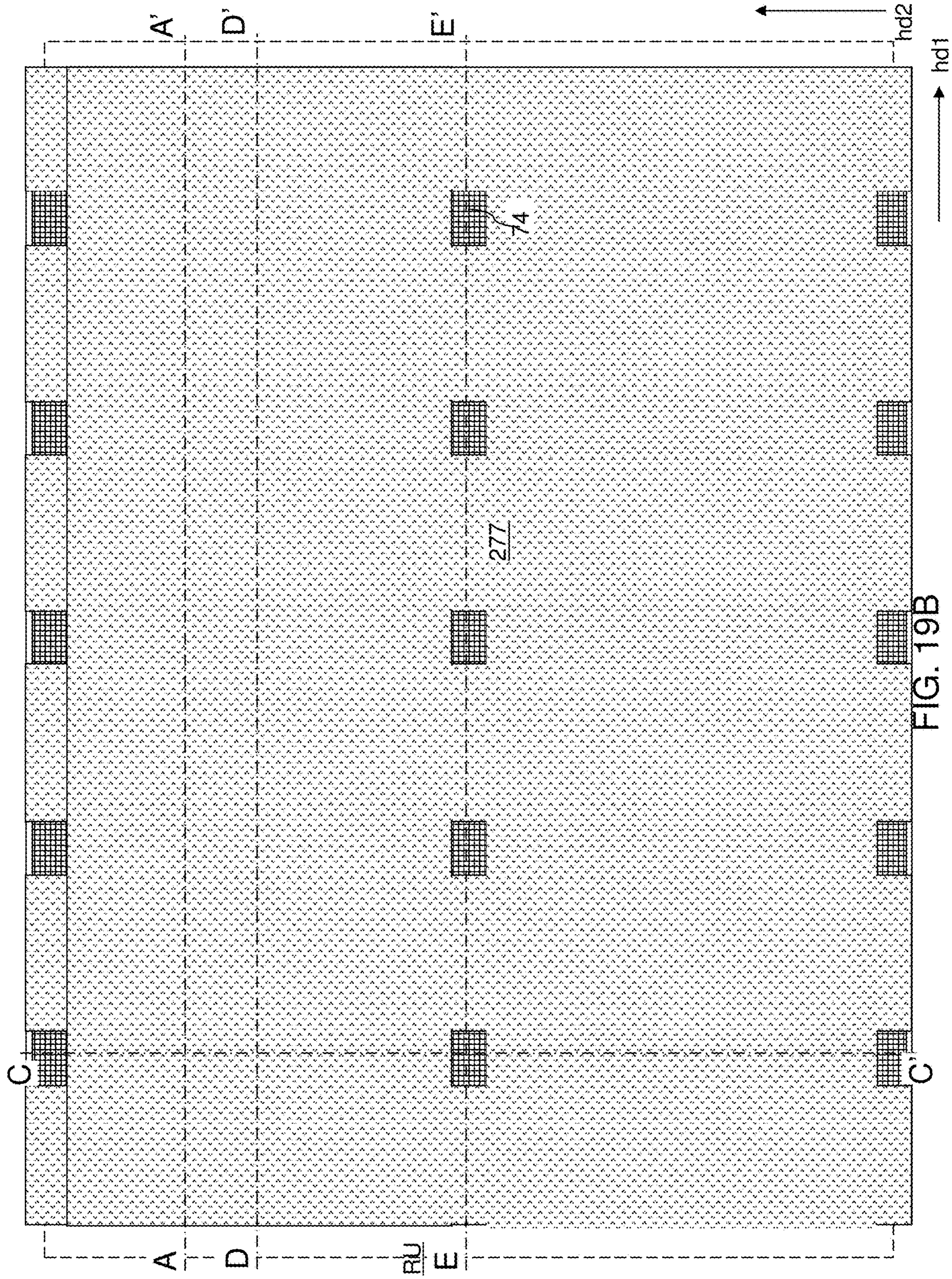
FIG. 19B is a top-down view of the exemplary structure of FIG. 19A. The vertical plane A-A' is the plane of the vertical cross-sectional view of FIG. 19A.
Figure 19C:
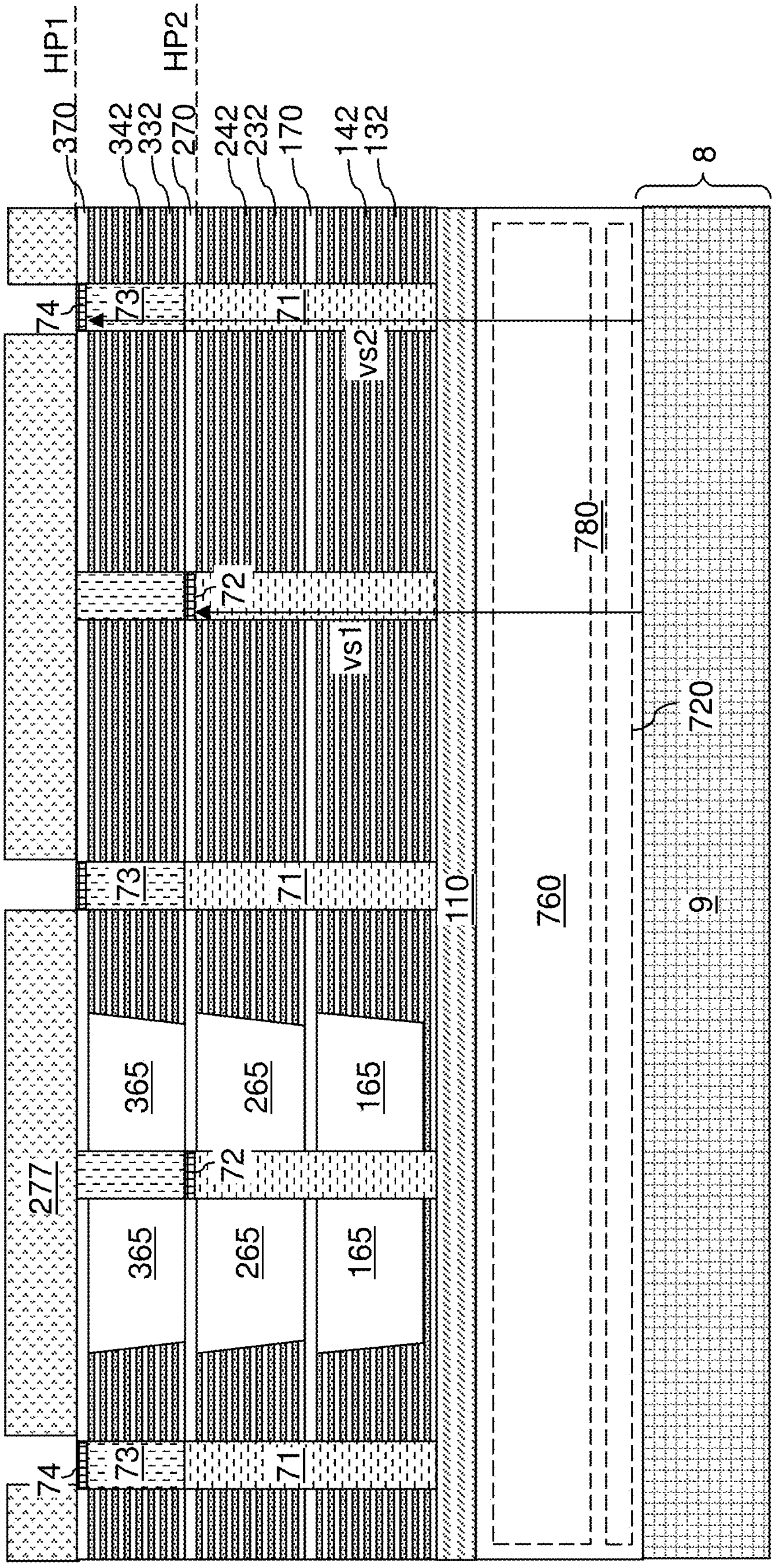
FIG. 19C is a vertical cross-sectional view of the exemplary structure along the vertical plane C-C' of FIG. 19B.
Figure 19D:
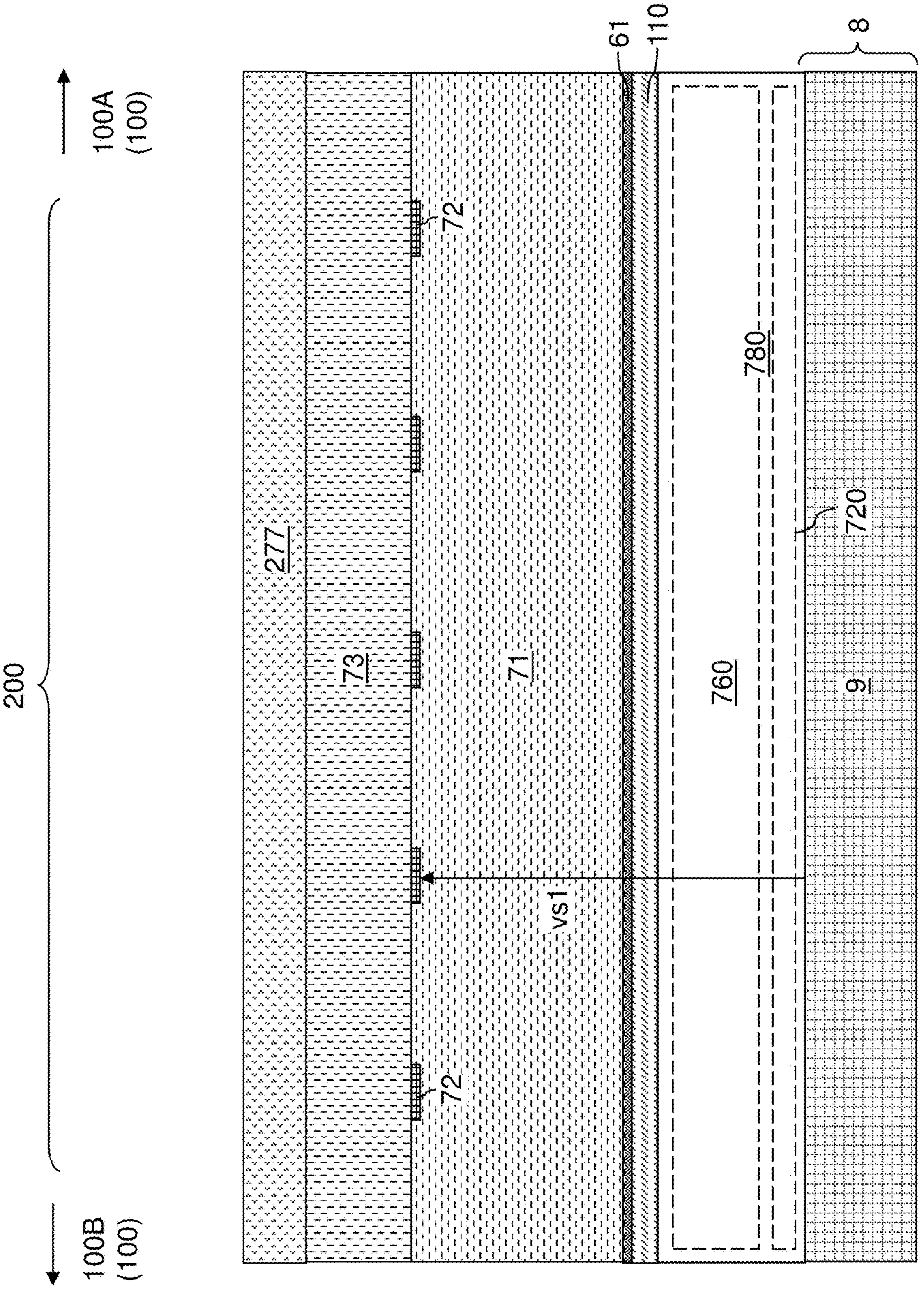
FIG. 19D is a vertical cross-sectional view of the exemplary structure along the vertical plane D-D' of FIG. 19B.
Figure 19E:
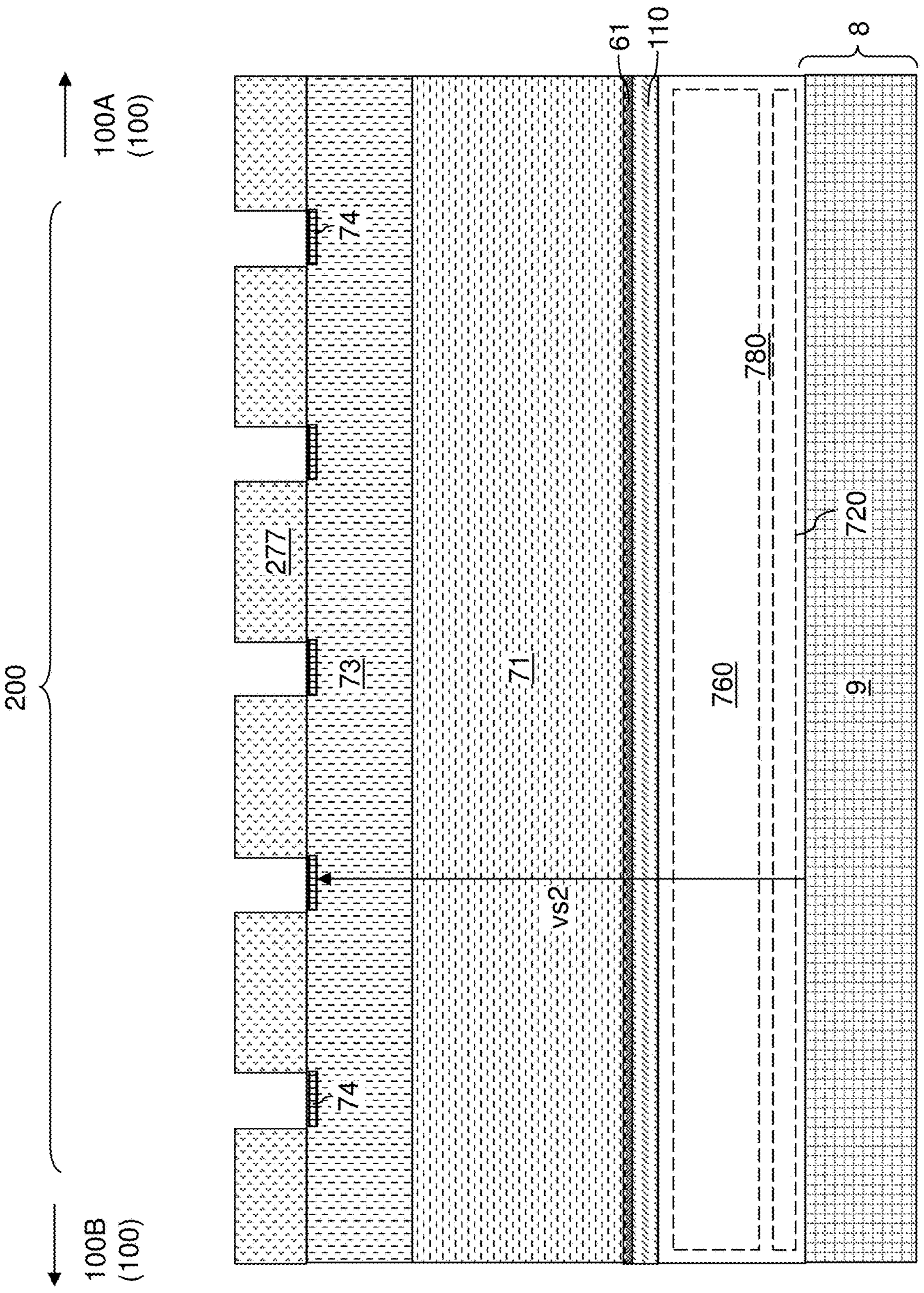
FIG. 19E is a vertical cross-sectional view of the exemplary structure along the vertical plane E-E' of FIG. 19B.
Figure 20A:
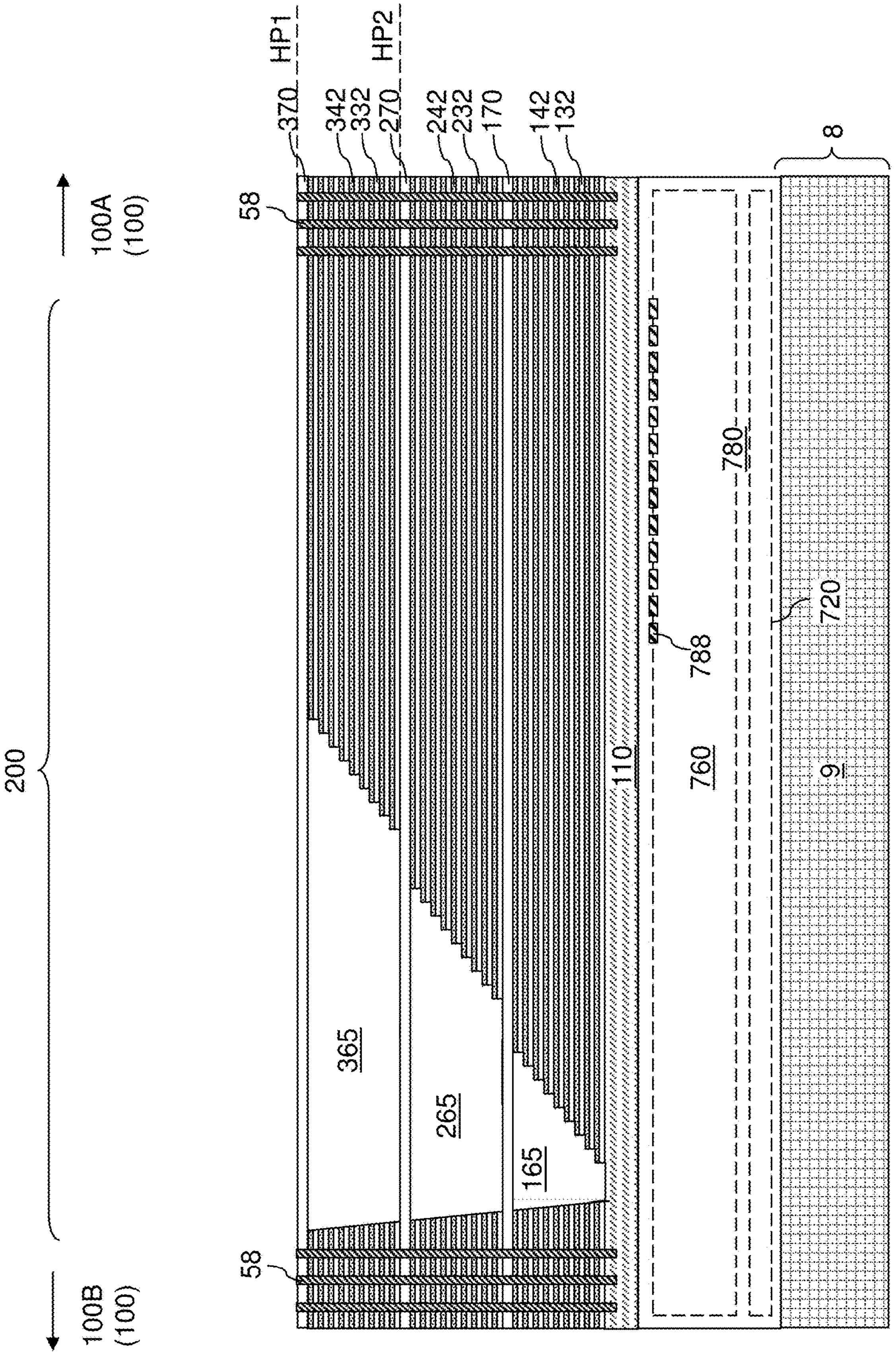
FIG. 20A is a vertical cross-sectional view of the exemplary structure after removal of the sacrificial trench fill structures and formation of backside trenches according to an embodiment of the present disclosure.
Figure 20B:
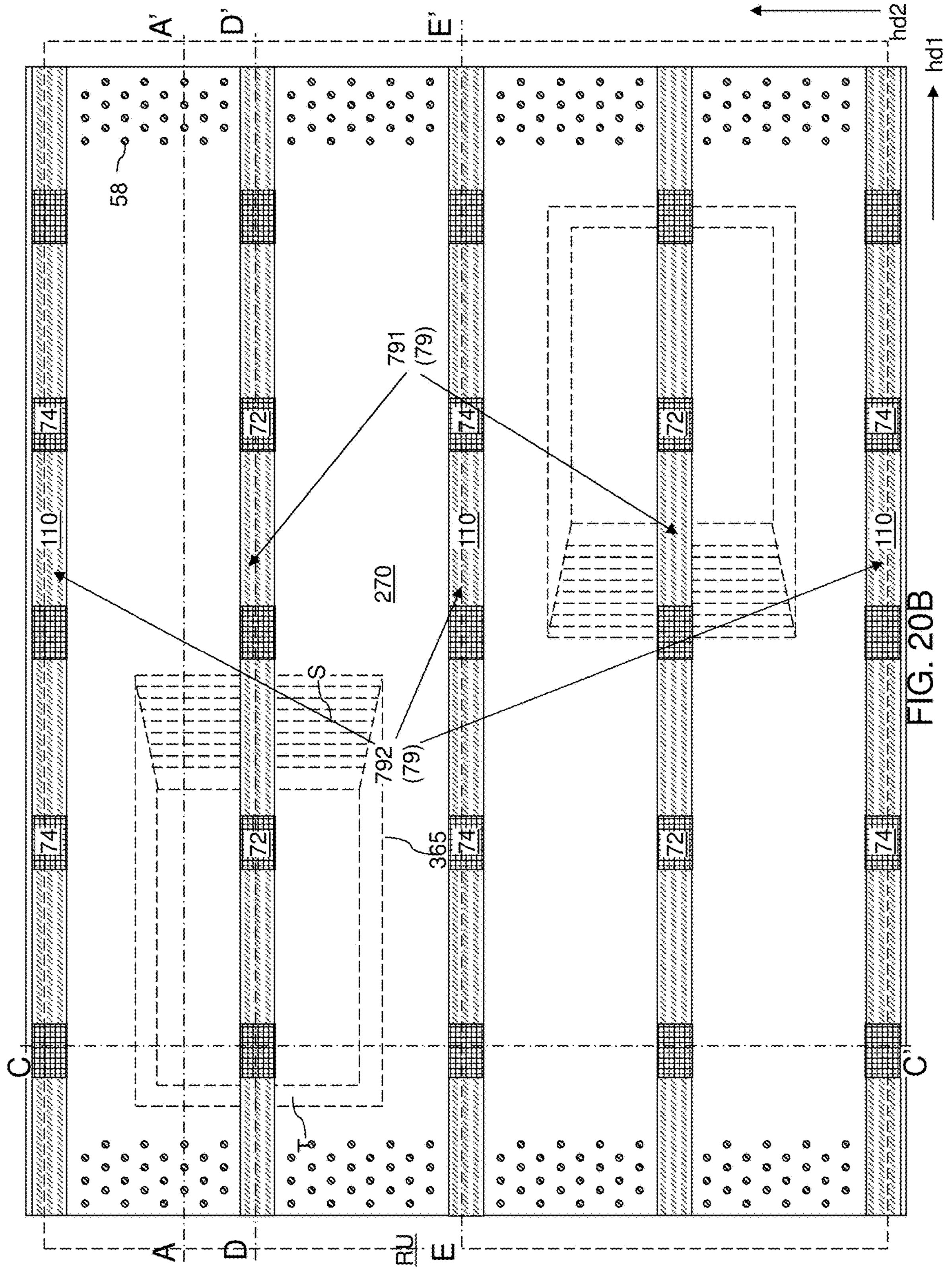
FIG. 20B is a top-down view of the exemplary structure of FIG. 20A. The vertical plane A-A' is the plane of the vertical cross-sectional view of FIG. 20A.
Figure 20C:
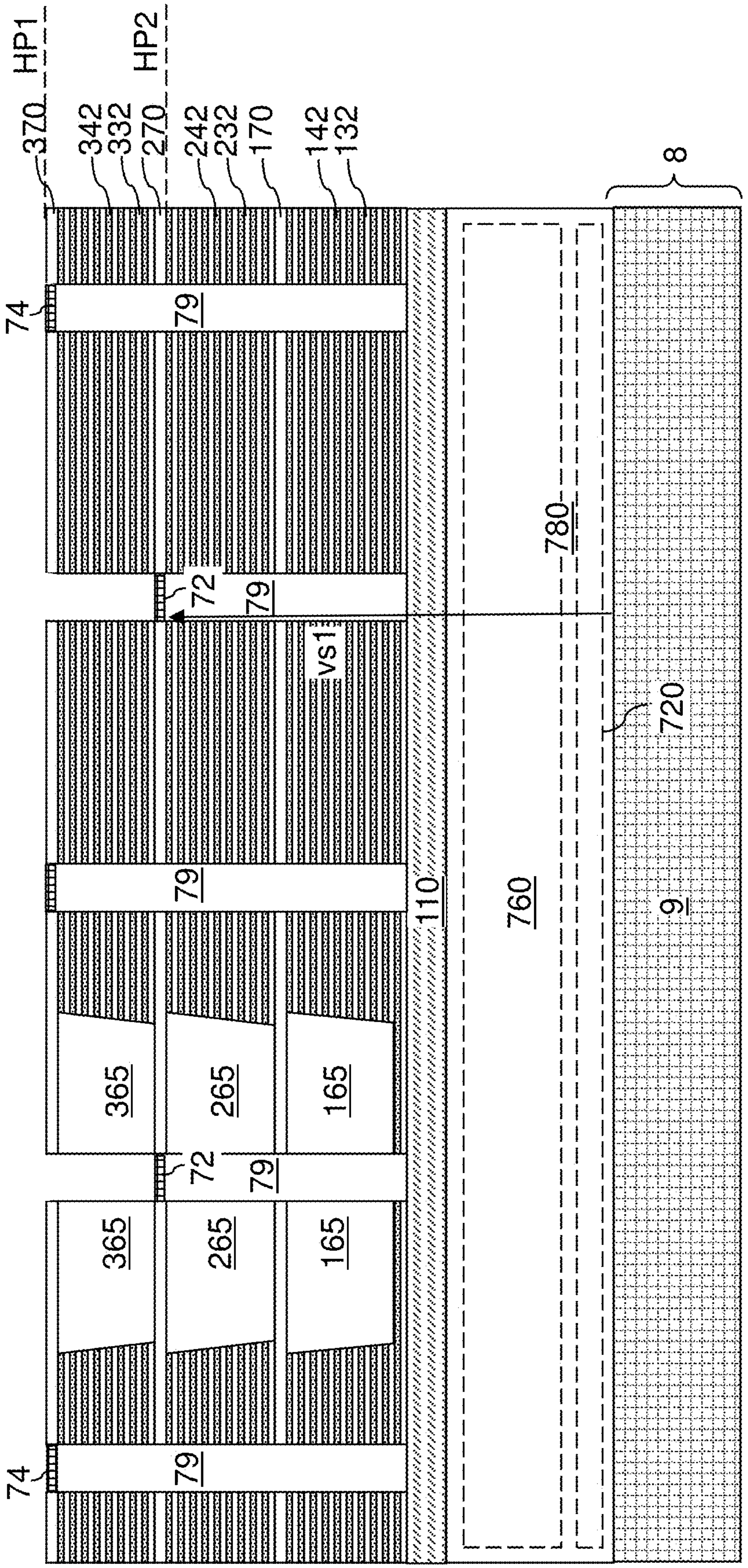
FIG. 20C is a vertical cross-sectional view of the exemplary structure along the vertical plane C-C' of FIG. 20B.
Figure 20D:
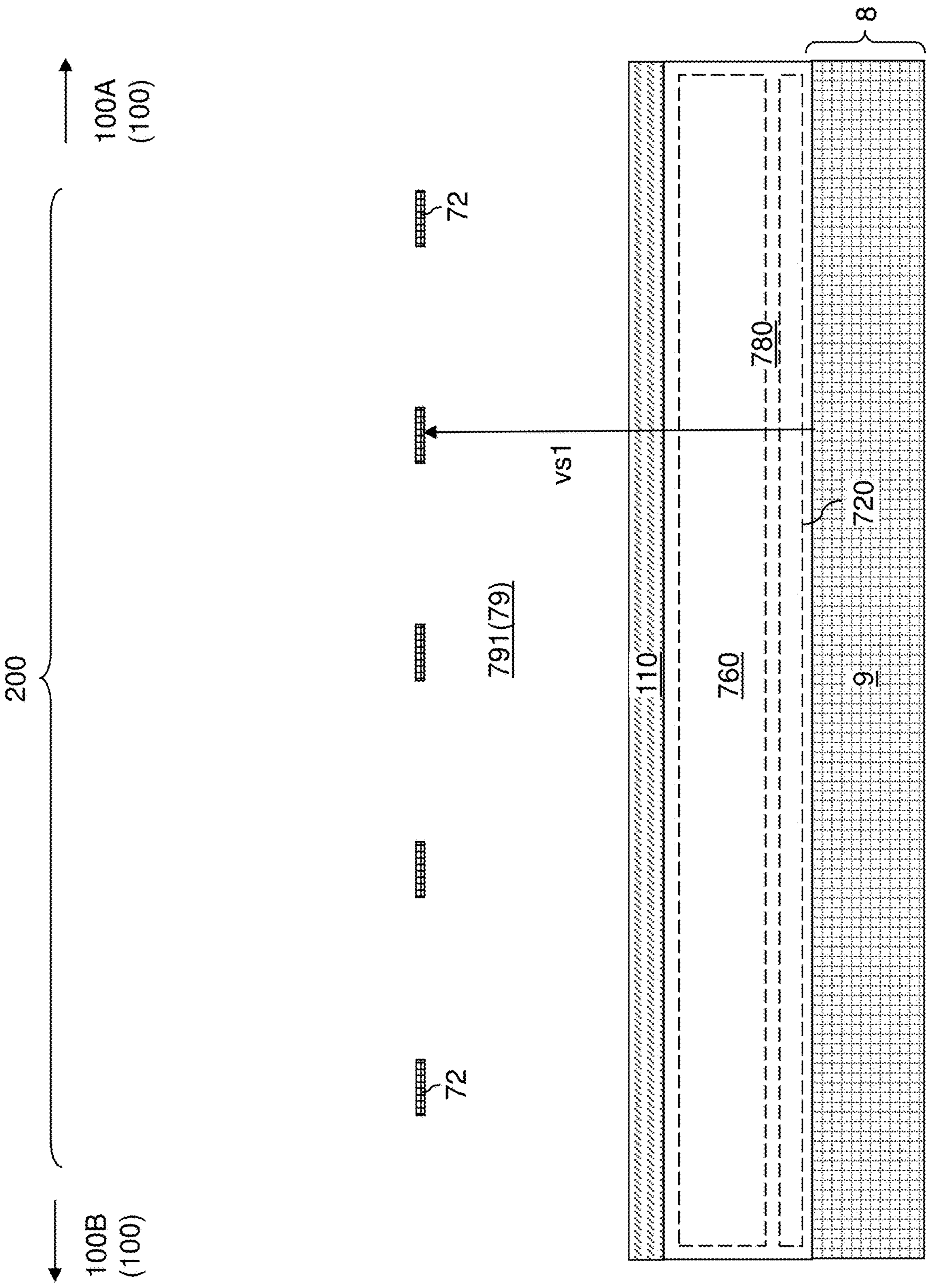
FIG. 20D is a vertical cross-sectional view of the exemplary structure along the vertical plane D-D' of FIG. 20B.
Figure 20E:
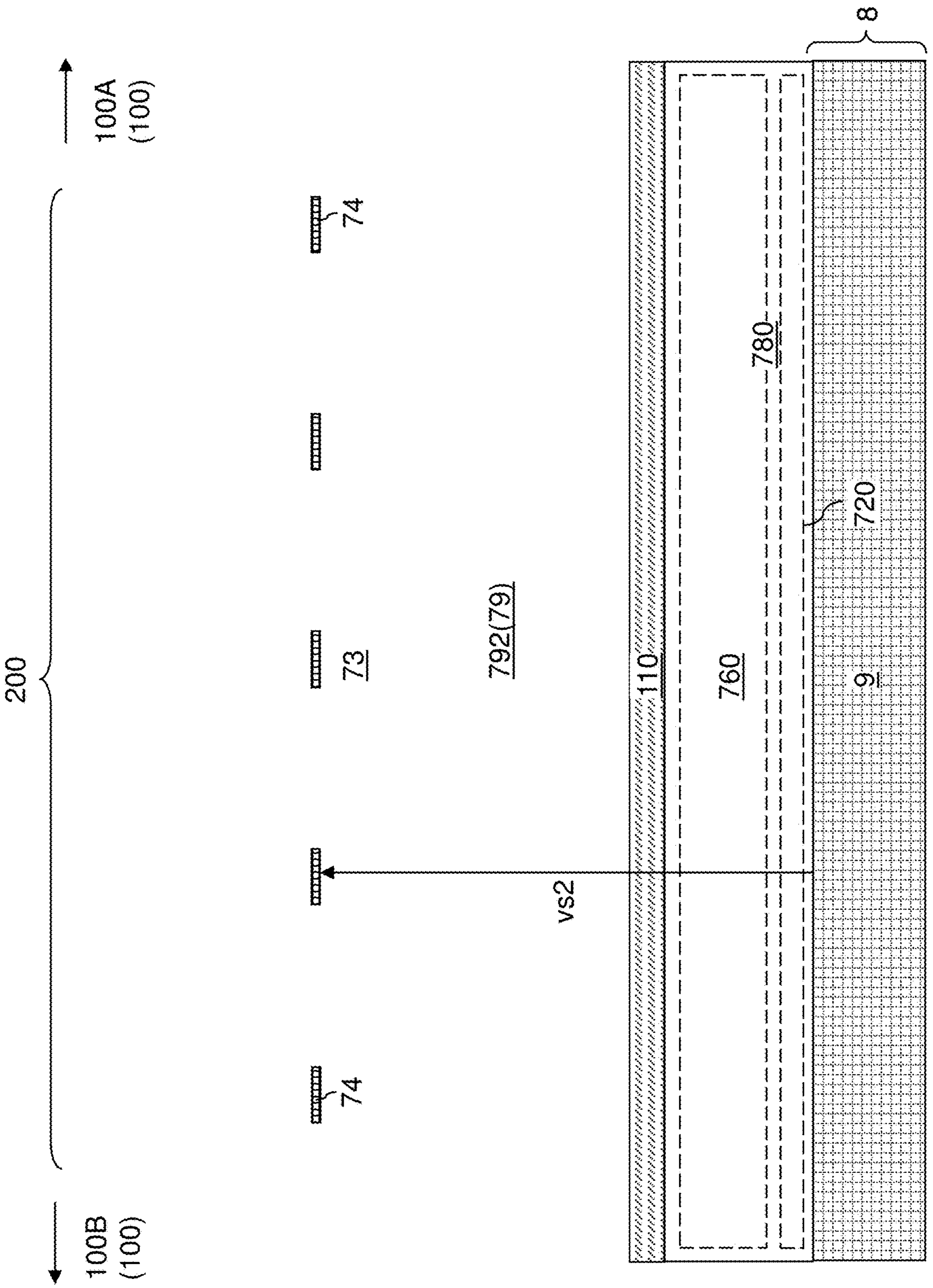
FIG. 20E is a vertical cross-sectional view of the exemplary structure along the vertical plane E-E' of FIG. 20B.

Referring to FIGS. 16A-16C, the exemplary structure is illustrated after formation of the memory opening fill structures 58. Support pillar structures (not illustrated) may be formed in support openings, for example, in the inter-array region 200 concurrently with formation of the memory opening fill structures 58.

Referring to FIGS. 17A-17E, a photoresist layer (not shown) can be applied over the exemplary structure, and can be lithographically patterned to form elongated openings that laterally extend along the first horizontal direction hd1. The elongated openings are formed between clusters of memory opening fill material portions 58. In one embodiment, the elongated openings may have a respective uniform width along the second horizontal direction hd2. In one embodiment, the elongated openings may be periodic along the second horizontal direction hd2. Each elongated opening in the photoresist layer may have an areal overlap within a respective one of the first sacrificial trench fill structures 71.

An anisotropic etch process can be performed to transfer the pattern of the openings in the photoresist layer through the third insulating cap layer 370, the third vertically alternating sequence (333, 343), and the third retro-stepped dielectric material portions 365. Laterally-extending trenches are formed through the combination of the third insulating cap layer 370, the third vertically alternating sequence (333, 343), and the third retro-stepped dielectric material portions 365. The laterally-extending trenches are herein referred to as upper-level backside trenches 279. A first sacrificial trench fill structure 71 can be physically exposed at the bottom of each of the upper-level backside trenches 279.

The third vertically alternating sequence (332, 342) is divided into third alternating stacks of third insulating layers 332 and third sacrificial material layers 342. The third insulating cap layer 370 is divided into a plurality of third insulating cap layers 370. Each third retro-stepped dielectric material portion 365 is divided into two third retro-stepped dielectric material portions 365. Each contiguous combination of a third alternating stack (332, 342), a third insulating cap layer 370, and a third retro-stepped dielectric material portion 365 is laterally spaced from at least one neighboring contiguous combination of a third alternating stack (332, 342), a third insulating cap layer 370, and a third retro-stepped dielectric material portion 365 by a respective upper-level backside trench 279.

Generally, at least one additional vertically alternating sequence of continuous insulating layers and continuous sacrificial material layers may be formed over the first sacrificial trench fill structures 71, and upper-level backside trenches 279 can be formed through the at least one additional vertically alternating sequence. Remaining portions of the at least one vertically alternating sequence comprise upper alternating stacks of insulating layers and sacrificial material layers.

In one embodiment, the upper-level backside trenches 279 comprises two types of trenches, which include a first subset of the upper-level backside trenches 279 that includes first upper-level backside trenches 2791, and a second subset of the upper-level backside trenches 279 that includes third upper-level backside trenches 2792. Generally, the first upper-level backside trenches 2791 are interlaced with the second upper-level backside trenches 2792 along the second horizontal direction hd2. Upon sequentially numbering the upper-level backside trenches 279 along the second horizontal direction hd2 with positive integers beginning with 1, the first upper-level backside trenches 2791 may comprise even-numbered upper-level backside trenches and the second upper-level backside trenches 2792 may comprise odd-numbered upper-level backside trenches. Alternatively, the first upper-level backside trenches 2791 may comprise odd-numbered upper-level backside trenches and the third upper-level backside trenches 2793 may comprise even-numbered upper-level backside trenches.

In one embodiment, each repetition unit RU may comprise four contiguous combinations of a first alternating stack (132, 142), a first insulating cap layer 170, a first retro-stepped dielectric material portion 165, a second alternating stack (232, 242), a second insulating cap layer 270, a second retro-stepped dielectric material portion 265, a third alternating stack (332, 342), a third insulating cap layer 370, and a third retro-stepped dielectric material portion 365. Further, each repetition unit RU may comprise four upper-level backside trenches 279, which comprise two first upper-level backside trenches 2791 and two third upper-level backside trenches 2793. In one embodiment, each third retro-stepped dielectric material portion 365 may be physically exposed to the first upper-level backside trenches 2791, and not be physically exposed to the second upper-level backside trenches 27921. Alternatively, each third retro-stepped dielectric material portion 365 may be physically exposed to the second upper-level backside trenches 2792, and not be physically exposed to the first upper-level backside trenches 2791.

In one embodiment, each first upper-level backside trench 2791 may overlie, and may have an areal overlap with, a respective one of the first lower-level backside trench 1791, and each second upper-level backside trench 2791 may overlie, and may have an areal overlap with, a respective one of the first lower-level backside trench 1791. In this case, top surfaces of a row of first backside bridge support structures 72 may be physically exposed underneath each first upper-level backside trench 27921 First backside bridge support structures 72 may not be present underneath the second upper-level backside trenches 2792.

Referring to FIGS. 18A-18E, a second sacrificial trench fill material can be deposited in the upper-level backside trenches 279. The second sacrificial trench fill material may comprise a carbon-based material (such as amorphous carbon or diamond-like carbon), a semiconductor material (such as amorphous silicon or a silicon-germanium alloy), organosilicate glass, or a polymer material. Excess portions of the second sacrificial trench fill material may be removed from above the horizontal plane including the top surfaces of the second insulating cap layers 270 by a planarization process such as a recess etch process or a chemical mechanical polishing (CMP) process. Each remaining portion of the second sacrificial trench fill material filling a respective upper-level backside trench 279 constitutes a second sacrificial trench fill structure 73. A first subset of the second sacrificial trench fill structures 73 can be formed in the first upper-level backside trenches 2791, and second subset of the second sacrificial trench fill structures 73 can be formed in the second upper-level backside trenches 2792.

Referring to FIGS. 19A-19E, second backside bridge support structures 74 can be formed within upper portions of a subset of the second sacrificial trench fill structures 73. The subset of the second sacrificial trench fill structures 73 in which the second backside bridge support structures 74 is formed may comprise the second upper-level backside trenches 2792.

Generally, the second backside bridge support structures 74 can be formed as rows of second backside bridge support structures 74 that are laterally spaced apart along the first horizontal direction hd1, i.e., along the lengthwise direction of the upper-level backside trenches 279. In other words, each row of second backside bridge support structures 74 comprise a respective plurality of second backside bridge support structures 74 that are laterally spaced apart along the first horizontal direction hd1. According to an aspect of the present disclosure, each of the second backside bridge support structures 74 may be formed in every other upper-level backside trench 279 along the second horizontal direction hd2. For example, the second backside bridge support structures 74 may be formed only in the second upper-level backside trenches 2792 but not in the first upper-level backside trenches 2791. According to an aspect of the present disclosure, the second backside bridge support structures 74 may be formed only within a second subset of the upper-level backside trenches 2792 that do not overlie first backside bridge support structures 72, and are not formed within a first subset of the upper-level backside trenches 2792 that overlie a respective set of first backside bridge support structures 72.

Generally, the material composition of the second backside bridge support structures 74 is different from the material composition of the second sacrificial trench fill structures 73. The second sacrificial trench fill structures 73 comprises a material that can be subsequently removed selective to the materials of the second backside bridge support structures 74, the insulating layers (132, 232, 332), the sacrificial material layers (142, 242, 342), and the insulating cap layers (170, 270, 370). The second backside bridge support structures 74 may be formed by conversion of the material of the second sacrificial trench fill structures 73 into a different material, or by replacement of discrete upper portions of the second sacrificial trench fill structures 73 with material portions having a different material composition.

In a non-limiting illustrative example, the second sacrificial trench fill structures 73 may comprise undoped amorphous silicon. In this case, a second photoresist layer 277 may be applied over the exemplary structure, and may be lithographically patterned to form an array of discrete openings that overlie every other second sacrificial trench fill structures 73 along the second horizontal direction hd2. For example, the openings in the photoresist layer may comprise rows of discrete openings that overlie the second subset of the second sacrificial trench fill structures 73 that are located in the second upper-level backside trenches 2792, while the first subset of the second sacrificial trench fill structures 73 that are located in the first upper-level backside trenches 2791 that are located in the second upper-level backside trenches 2792 covered with the photoresist layer. Boron can be implanted into unmasked upper portions of the second subset of the second sacrificial trench fill structures 73, and convert the implanted portions of the undoped amorphous silicon into a heavily boron-doped amorphous silicon portions, which constitute the second backside bridge support structures 74. The atomic concentration of boron in the second backside bridge support structures 74 may be in a range from $1.0\times10^{18}/cm^3$ to $2.0\times10^{21}/cm^3$, although lesser and greater atomic concentrations may also be employed. Generally, undoped amorphous silicon may be etched selective to heavily boron-doped amorphous silicon with high selectivity, such as a selectivity greater than 100, employing tetramethyl ammonium hydroxide (TMAH). The second photoresist layer 277 may be subsequently removed, for example, by ashing.

Alternatively, the second photoresist layer 277 may be employed as an etch mask for an etch process that vertically recesses unmasked portions of the second sacrificial trench fill structures 73. In this case, an anisotropic etch process or an isotropic etch process may be performed to form rows of discrete recess regions in upper portions of the first subset of the second sacrificial trench fill structures 73 that are located in the second upper-level backside trenches 2792. The second photoresist layer 277 can be removed, for example, by ashing. A second fill material, which is herein referred to as a second backside bridge material, can be deposited, in the discrete recess regions in the upper portions of the first subset of the second sacrificial trench fill structures 73. Excess portions of the second backside bridge material can be removed from above the horizontal plane including the top surfaces of the third insulating cap layers 370 by a planarization process, which may comprise a chemical mechanical polishing (CMP) process and/or a recess etch process. Each remaining portion of the second backside bridge material that fills a respective one of the discrete recess regions constitutes a second backside bridge support structure 74. In one embodiment, the second backside bridge support structure 74 may comprise silicon oxide, a dielectric metal oxide, and/or a metallic material.

In one embodiment, top surfaces of the second backside bridge support structures 74 may be located within a horizontal plane including the top surfaces of the third insulating cap layer 370, i.e., within the first horizontal plane HP1. In one embodiment, the bottom surfaces of the second backside bridge support structures 74 may be located above the horizontal plane including the bottom surfaces of the third insulating cap layer 370. In one embodiment, the thickness of the second backside bridge support structures 74 may be less than the thickness of the third insulating cap layers 370. For example, the second backside bridge support structures 74 may have a thickness in a range from 50 nm to 500 nm, such as from 100 nm to 400 nm, and/or from 200 nm to 300 nm, although lesser and greater thicknesses may also be employed. The length of each second backside bridge support structure 74 along the first horizontal direction hd1 may be in a range from 50 nm to 1,000 nm, such as from 100 nm to 500 nm, although lesser and greater lengths may also be employed. The second backside bridge support structures 74 within each row of second backside bridge support structures 74 may be arranged with a periodicity, which may be in a range from 200 nm to 10,000 nm, such as from 500 nm to 5,000 nm, although lesser and greater periodicities may also be employed.

Generally, second backside bridge support structures 74 can be formed in upper portions of the first subset of the second sacrificial trench fill structures 73 that are located within the second subset of the upper-level backside trenches 279. Each of the second backside support bridge structures 74 can be located at a second vertical spacing vs2 from the substrate 8. The second vertical spacing vs2 is a vertical distance between the top surface of the substrate 8 and the bottom surfaces of the second backside support bridge structures 74. In one embodiment, the upper-level backside trenches 279 comprise a second subset of the upper-level backside trenches 279 in which a respective row of second backside bridge support structures 74 is formed, and a first subset of the backside trenches 79 that is free of any backside bridge support structure therein.

Referring to FIGS. 20A-20E, the second sacrificial trench fill structures 73 and the first sacrificial trench fill structures 71 can be removed selective to the insulating layers (132, 232, 332), the sacrificial material layers (142, 242, 342), and the insulating cap layers (170, 270, 370). For example, if the second sacrificial trench fill structures 73 and the first sacrificial trench fill structures 71 comprise undoped amorphous silicon, a wet etch process employing tetramethyl ammonium hydroxide (TMAH) may be performed to remove the first sacrificial trench fill structures 71. In case the second sacrificial trench fill structures 73 and the first sacrificial trench fill structures 71 comprise a carbon-based material, an ashing process may be performed to remove the first sacrificial trench fill structures 71. The first backside bridge support structures 72 and the second backside bridge support structures 74 provide lateral structural support between neighboring pairs of laterally adjacent combinations of a first alternating stack (132, 142), a first insulating cap layer 170, a first retro-stepped dielectric material portion 165, a second alternating stack (232, 242), a second insulating cap layer 270, a second retro-stepped dielectric material portion 265, a third alternating stack (332, 342), a third insulating cap layer 370, and a third retro-stepped dielectric material portion 365. Thus, the first backside bridge support structures 72 and the second backside bridge support structures 74 prevent or reduce the alternating stacks from toppling or leaning into the backside trenches 79. A backside trench 79 is formed within each contiguous volume including a volume from which a combination of a second sacrificial trench fill structure 73 and a first sacrificial trench fill structure 71 is removed.

According to an aspect of the present disclosure, the height (i.e., the second vertical spacing vs2) of the second backside support bridge structures 74 is different from the height (i.e., the first vertical spacing vs1) of the first backside support bridge structure 72. Thus, the second backside support bridge structures 74 and the first backside support bridge structure 72 alternate along the second horizontal direction hd2 with alternations in the vertical spacing from the top surface of the substrate 8. This configuration provides increased resistance to toppling and leaning (i.e., inclining) between neighboring alternating stacks of insulating layers (132, 232, 332) and sacrificial material layers (142, 242, 342) while reducing the area covered by the second backside support bridge structures 74 and the first backside support bridge structure 72. Generally, the greater the total area for the second backside support bridge structures 74 and the first backside support bridge structure 72, the greater the difficulty in removing residual electrically conductive material from inside the backside trenches 79 during a subsequent processing step that replaces the sacrificial material layers (142, 242, 342) with electrically conductive layers. The vertical staggering of the second backside support bridge structures 74 and the first backside support bridge structure 72 also reduces tensile stresses in the device without requiring an excess total area in a plan view for the backside support bridge structures (72, 74). In one embodiment, the vertically staggered backside support bridge structures (72, 74) may be in compressive stress, in contrast to bridge structures which are not vertically staggered, which may be under a high tensile stress.

Figure 21:
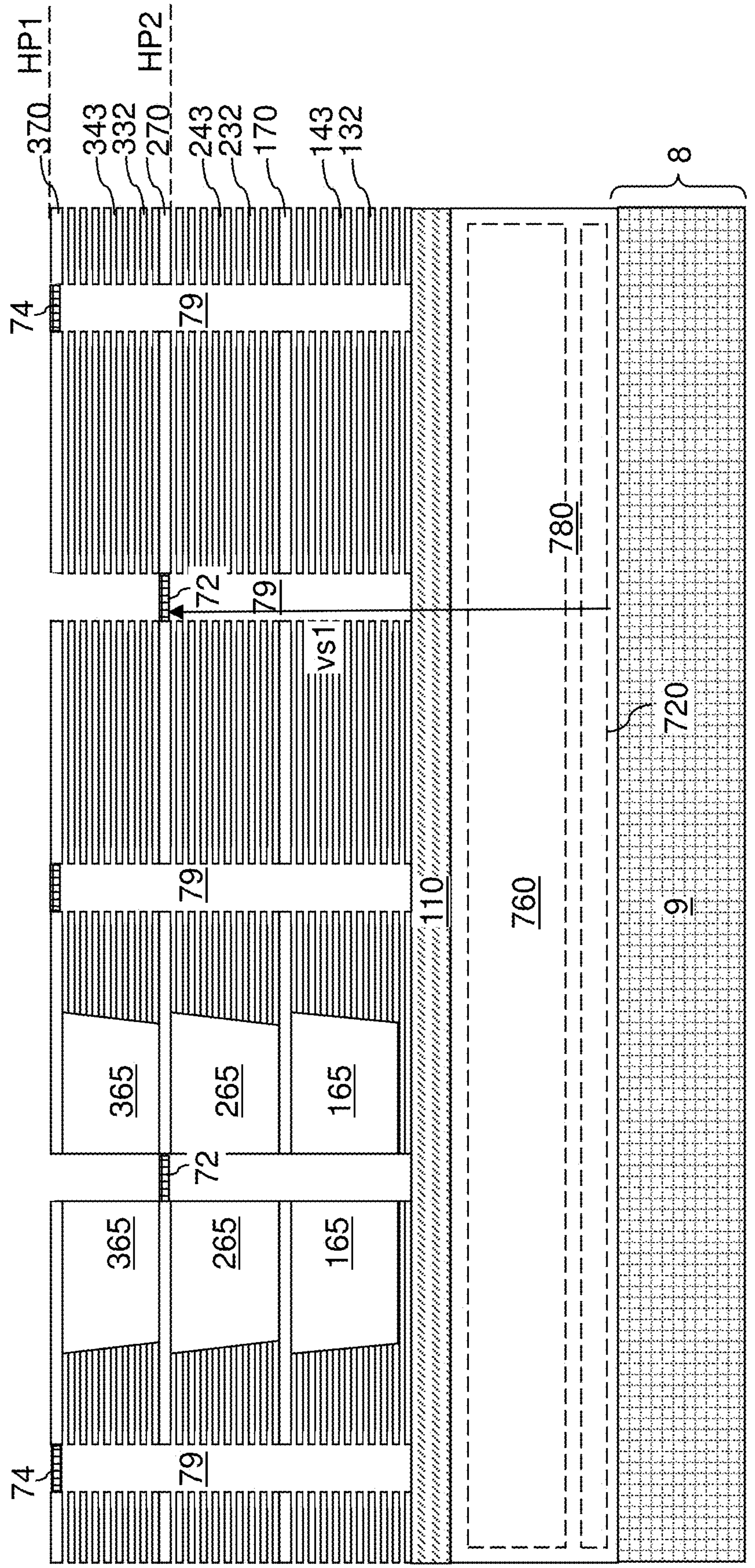
FIG. 21 is a vertical cross-sectional view of the exemplary structure after formation of backside recesses according to an embodiment of the present disclosure.

Referring to FIG. 21, an etchant that selectively etches the materials of the sacrificial material layers (142, 242, 342) with respect to the materials of the insulating layers (132, 232, 332), the insulating cap layers (170, 270, 370), the inter-tier insulating layer 180, the retro-stepped dielectric material portions (165, 265, 365), and the material of the outermost layer of the memory films 50 can be introduced into the backside trenches 79, for example, employing an isotropic etch process. For example, the sacrificial material layers (142, 242, 342) can include silicon nitride, the materials of the insulating layers (132, 232, 332), the insulating cap layers (170, 270, 370), the material of the retro-stepped dielectric material portions (165, 265, 365), and the material of the outermost layer of the memory films 50 can include silicon oxide materials.

The isotropic etch process can be a wet etch process employing a wet etch solution, or can be a gas phase (dry) etch process in which the etchant is introduced in a vapor phase into the backside opening 79. For example, if the sacrificial material layers (142, 242, 342) include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses (143, 243, 343) can be a laterally extending cavity having a lateral dimension that is greater than the vertical extent of the cavity. In other words, the lateral dimension of each of the backside recesses (143, 243, 343) can be greater than the height of the respective backside recess (143, 243, 343). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. A plurality of third backside recesses 343 can be formed in the volumes from which the material of the third sacrificial material layers 342 is removed. Each of the backside recesses (143, 243, 343) can extend substantially parallel to the top surface of the substrate 8. A backside recess (143, 243, 343) can be vertically bounded by a top surface of an underlying insulating layer (132, 232, 332) and a bottom surface of an overlying insulating layer (132, 232, or 332). In one embodiment, each of the backside recesses (143, 243, 343) can have a uniform height throughout.

Figure 22:
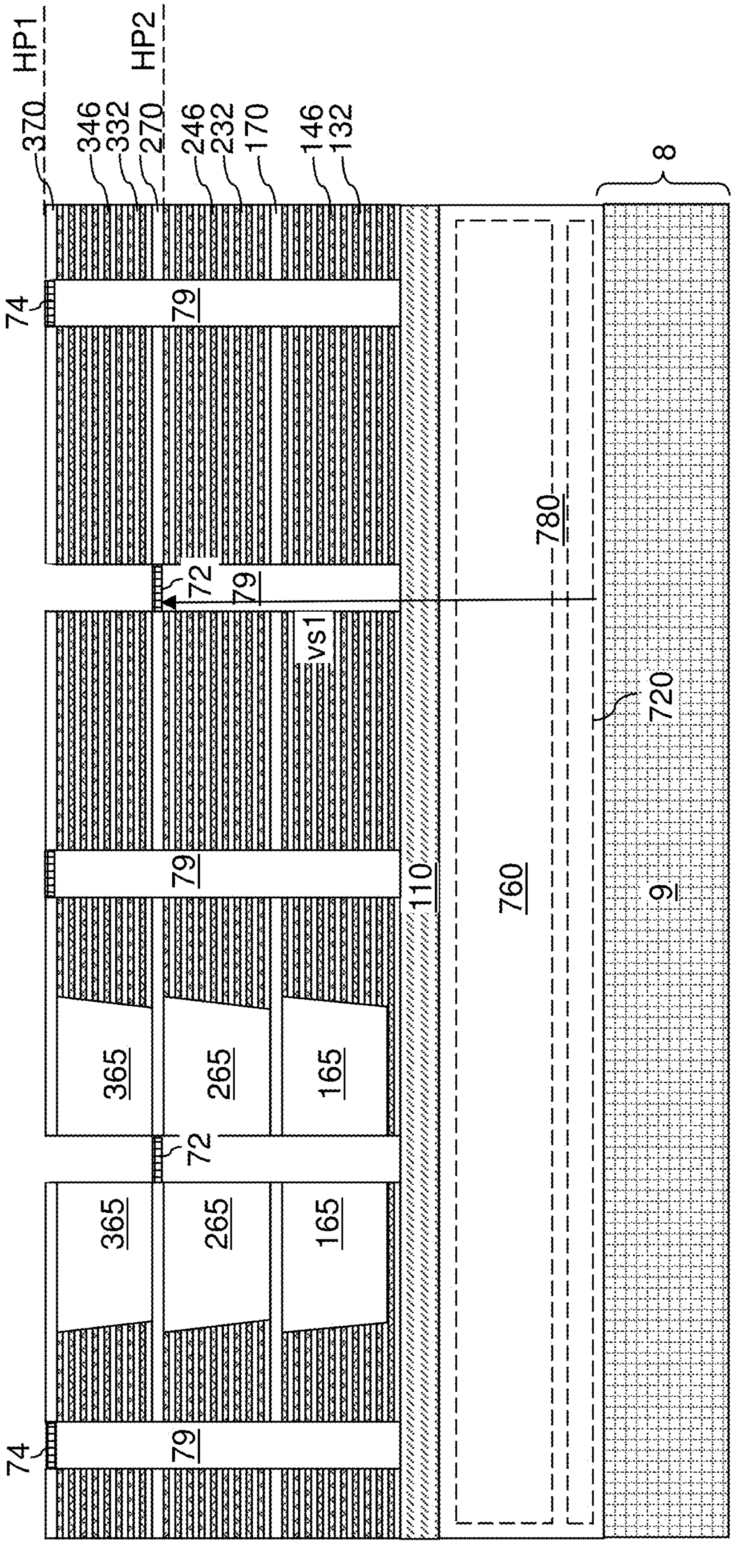
FIG. 22 is a vertical cross-sectional view of the exemplary structure after formation of electrically conductive layers according to an embodiment of the present disclosure.

Referring to FIG. 22, a backside blocking dielectric layer (not shown) can be optionally deposited in the backside recesses (143, 243, 343) and the backside trenches 79 and over the third insulating cap layer 370. At least one conductive material can be deposited in the plurality of backside recesses (243, 243), on the sidewalls of the backside opening 79, and over the third insulating cap layer 370. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243, 343) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243, 343) can be a combination of titanium nitride layer and a tungsten fill material.

Electrically conductive layers (146, 246, 346) can be formed in the backside recesses (143, 243, 343) by deposition of the at least one conductive material. A plurality of first electrically conductive layers 146 can be formed in the plurality of first backside recesses 243, a plurality of second electrically conductive layers 246 can be formed in the plurality of second backside recesses 243, a plurality of third electrically conductive layers 346 can be formed in the plurality of third backside recesses 343, and a continuous metallic material layer (not shown) can be formed on the sidewalls of each backside opening 79 and over the third insulating cap layer 370. Each of the electrically conductive layers (146, 246, 346) may include a respective conductive metallic nitride liner and a respective conductive fill material. Thus, the sacrificial material layers (142, 242, 342) can be replaced with the electrically conductive layers (146, 246, 346), respectively. Specifically, each first sacrificial material layer 142 can be replaced with an optional portion of the backside blocking dielectric layer and a first electrically conductive layer 146, each second sacrificial material layer 242 can be replaced with an optional portion of the backside blocking dielectric layer and a second electrically conductive layer 246, and each third sacrificial material layer 342 can be replaced with an optional portion of the backside blocking dielectric layer and a third electrically conductive layer 346. A backside cavity is present in the portion of each backside opening 79 that is not filled with the continuous metallic material layer.

Residual conductive material can be removed from inside the backside trenches 79. Specifically, the deposited metallic material of the continuous metallic material layer can be etched back from the sidewalls of each backside opening 79 and from above the third insulating cap layer 370, for example, by an isotropic etchback process. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each remaining portion of the deposited metallic material in the third backside recesses 343 constitutes a third electrically conductive layer 346.

Each electrically conductive layer (146, 246, 346) can be a conductive sheet including openings therein. A first subset of the openings through each electrically conductive layer (146, 246, 346) can be filled with memory opening fill structures 58. A second subset of the openings through each electrically conductive layer (146, 246, 346) can be filled with the support pillar structures. A third subset of the openings through each electrically conductive layer (146, 246, 346) can include backside trenches 79. Each electrically conductive layer (146, 246, 346) can have a lesser area than any underlying electrically conductive layer (146, 246, 346) because of the stepped surfaces. Each electrically conductive layer (146, 246, 346) can have a greater area than any overlying electrically conductive layer (146, 246, 346) because of the stepped surfaces.

In some embodiment, drain-select-level isolation structures (not illustrated) may be provided at topmost levels of the third electrically conductive layers 346. A subset of the third electrically conductive layers 346 located at the levels of the drain-select-level isolation structures constitutes drain select gate electrodes. One or more bottommost first electrically conductive layers 146 constitutes source select gate electrodes. A subset of the electrically conductive layer (146, 246, 346) located between the source and drain select gate electrodes can function as combinations of a control gate and a word line located at the same level. The control gate electrodes within each electrically conductive layer (146, 246, 346) are the control gate electrodes for a vertical memory device including the memory stack structure 55. Each of the memory stack structures 55 comprises a vertical stack of memory elements (e.g., portions of the memory film 50) located at each level of the electrically conductive layers (146, 246, 346). A subset of the electrically conductive layers (146, 246, 346) can comprise word lines for the memory elements. The semiconductor devices 720 can comprise word line switch devices configured to control a bias voltage to respective word lines.

In the exemplary structure illustrated in FIG. 22, alternating stacks of insulating layers (132, 232, 332) and electrically conductive layers (146, 246, 346) can be located over a substrate 8. Each of the alternating stacks laterally extends along a first horizontal direction hd1 through a first memory array region 100A and a second memory array region 100B that are laterally spaced apart by an inter-array region 200.

Each of the alternating stacks includes a set of stepped surfaces in the inter-array region 200. The alternating stacks are laterally spaced apart from each other along a second horizontal direction hd2 by backside trenches 79 that laterally extend along the first horizontal direction hd1. The backside trenches 79 comprise first backside trenches 79 and second backside trenches 79 that are interlaced along the second horizontal direction hd2.

Memory openings 49 vertically extend through a respective alternating stack of insulating layers (132, 232, 332) and electrically conductive layers (146, 246, 346). Memory opening fill structures 58 are located within a respective one of the memory openings 49. The memory opening fill structures 58 comprise a respective vertical stack of memory elements (such as portions of memory material layer 54 located at levels of the electrically conductive layers (146, 246, 346)) and a respective vertical semiconductor channel 60.

In one embodiment, each of the alternating stacks comprises a respective plurality of sets of stepped surfaces in the inter-array region 200; and lateral extents of electrically conductive layers (146, 246, 346) within a respective alternating stack decreases with a vertical distance from the substrate 8 at each set of stepped surfaces. In one embodiment, each set of stepped surfaces underlies and contacts a respective retro-stepped dielectric material portion (165, 265, 365). Each retro-stepped dielectric material portion (165, 265, 365) may be physically exposed to only one backside trench 79.

Figure 23A:
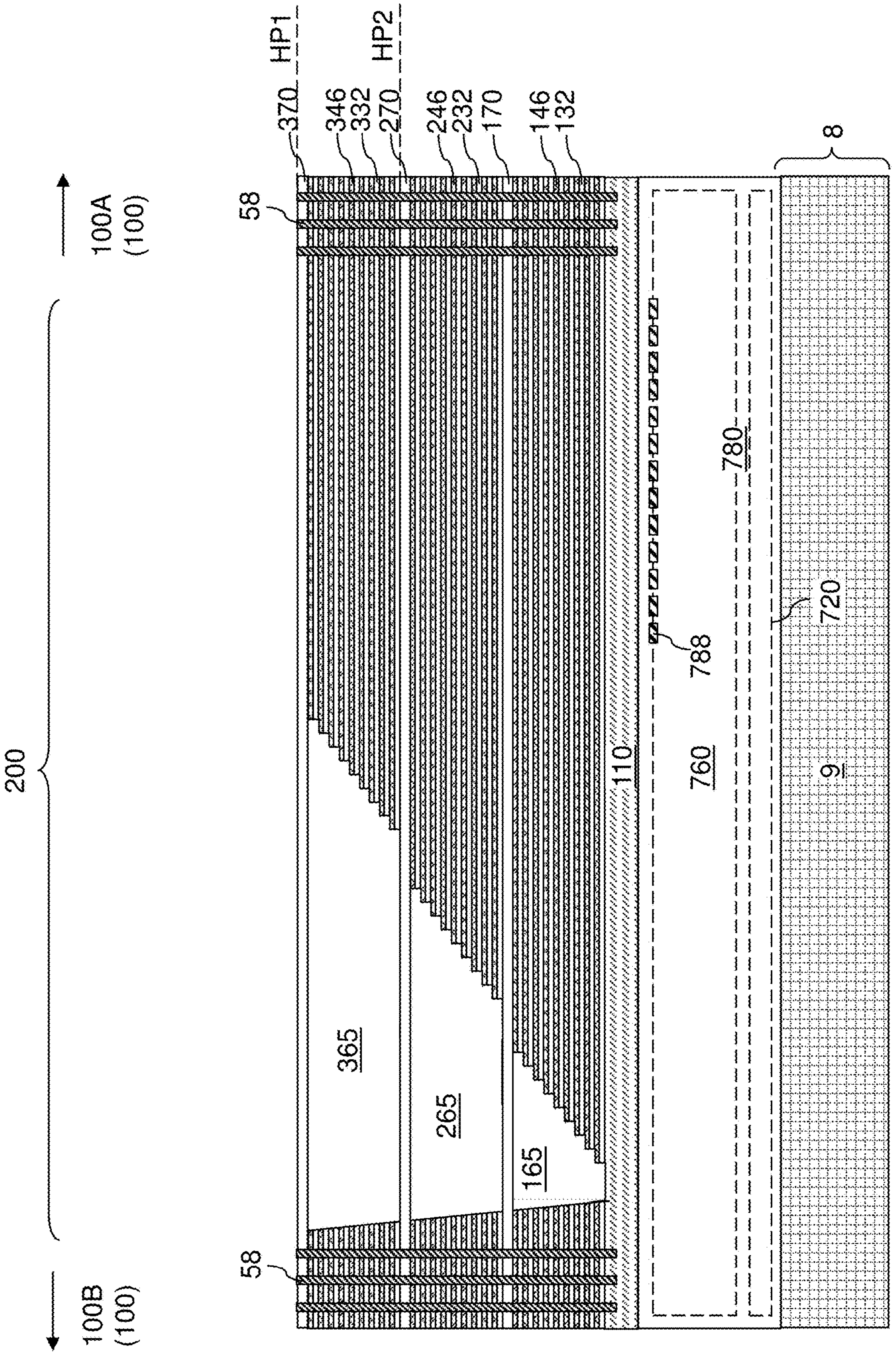
FIG. 23A is a vertical cross-sectional view of the exemplary structure after formation of source regions according to an embodiment of the present disclosure.
Figure 23B:
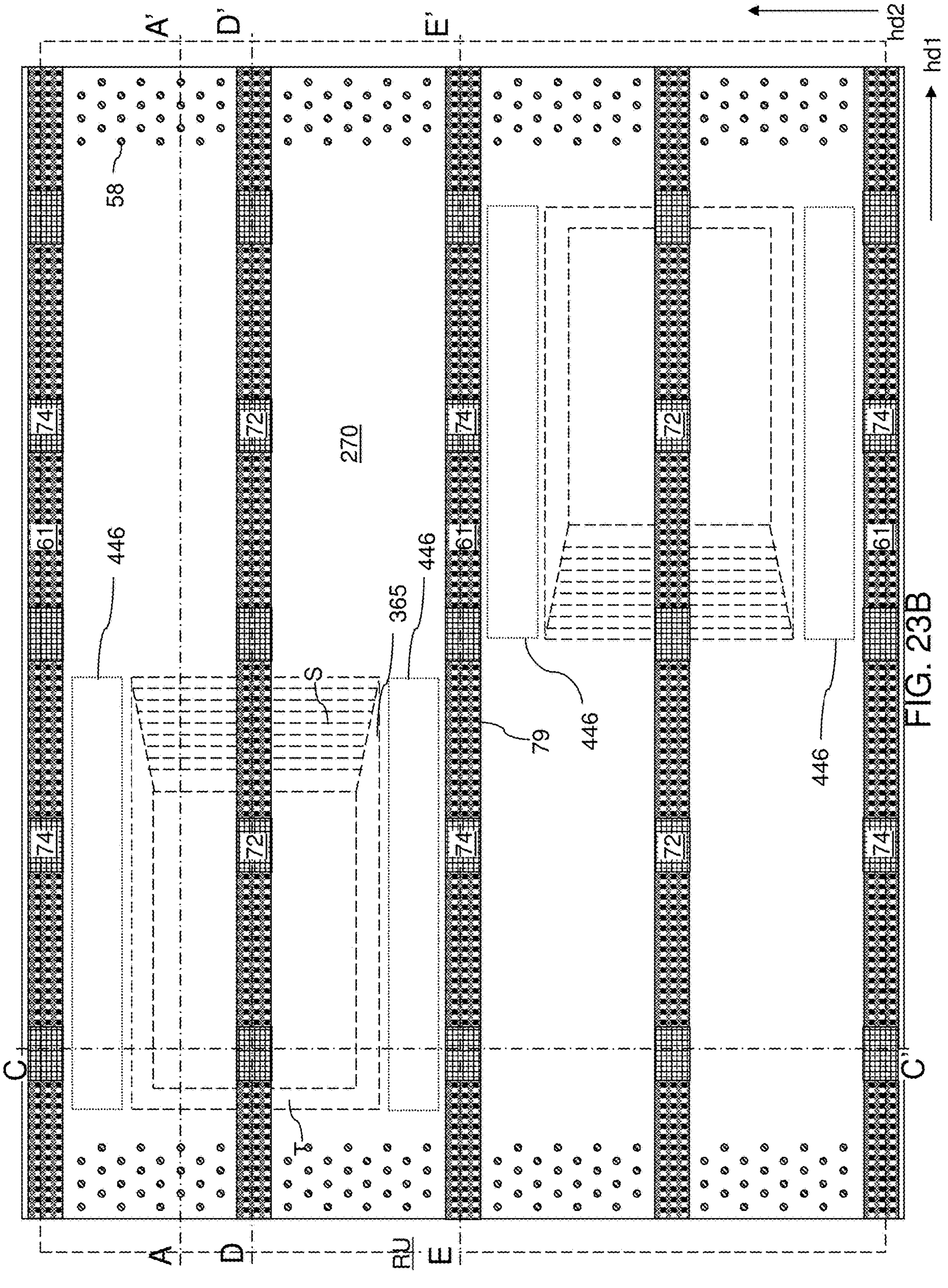
FIG. 23B is a top-down view of the exemplary structure of FIG. 23A. The vertical plane A-A' is the plane of the vertical cross-sectional view of FIG. 23A.
Figure 23C:
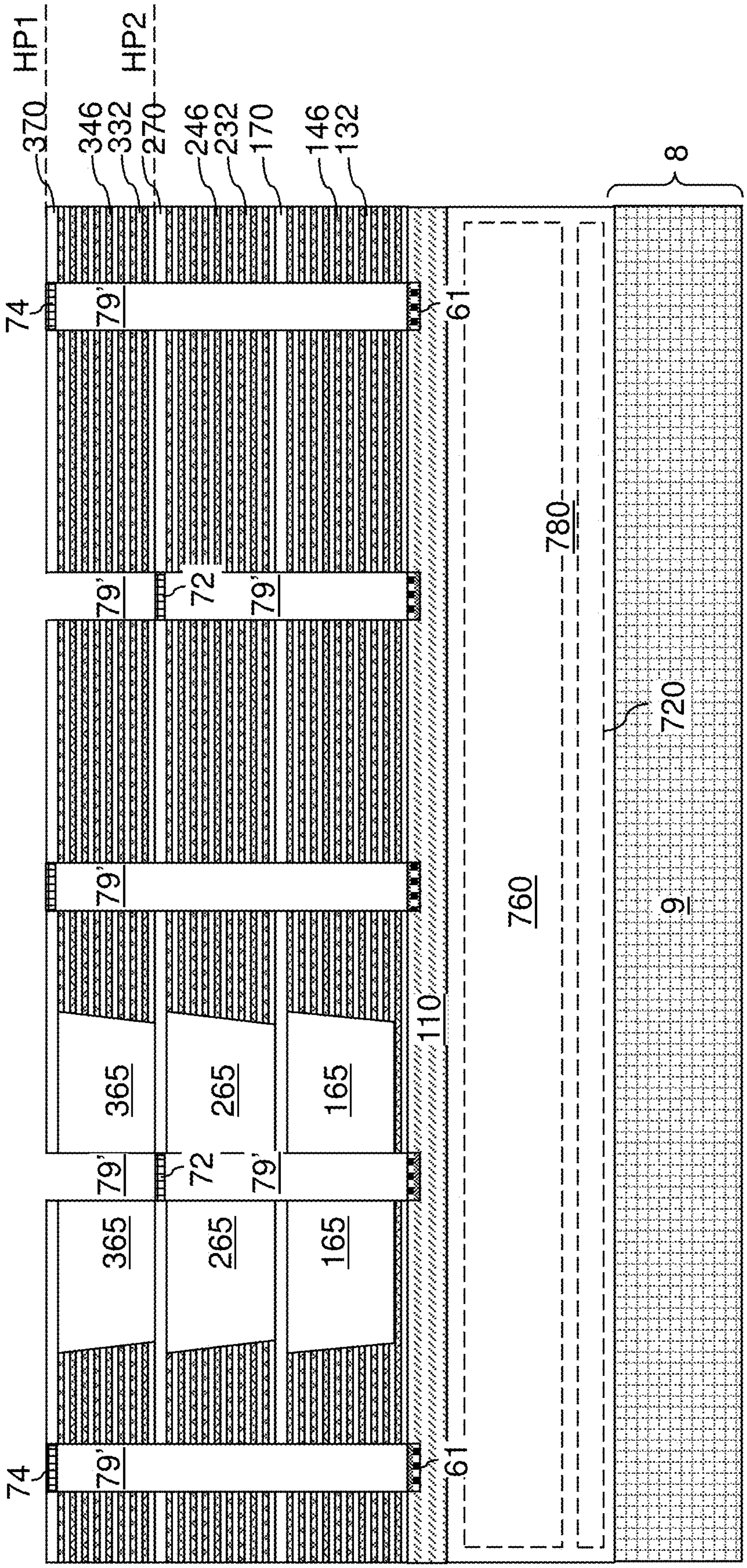
FIG. 23C is a vertical cross-sectional view of the exemplary structure along the vertical plane C-C' of FIG. 23B.
Figure 23D:
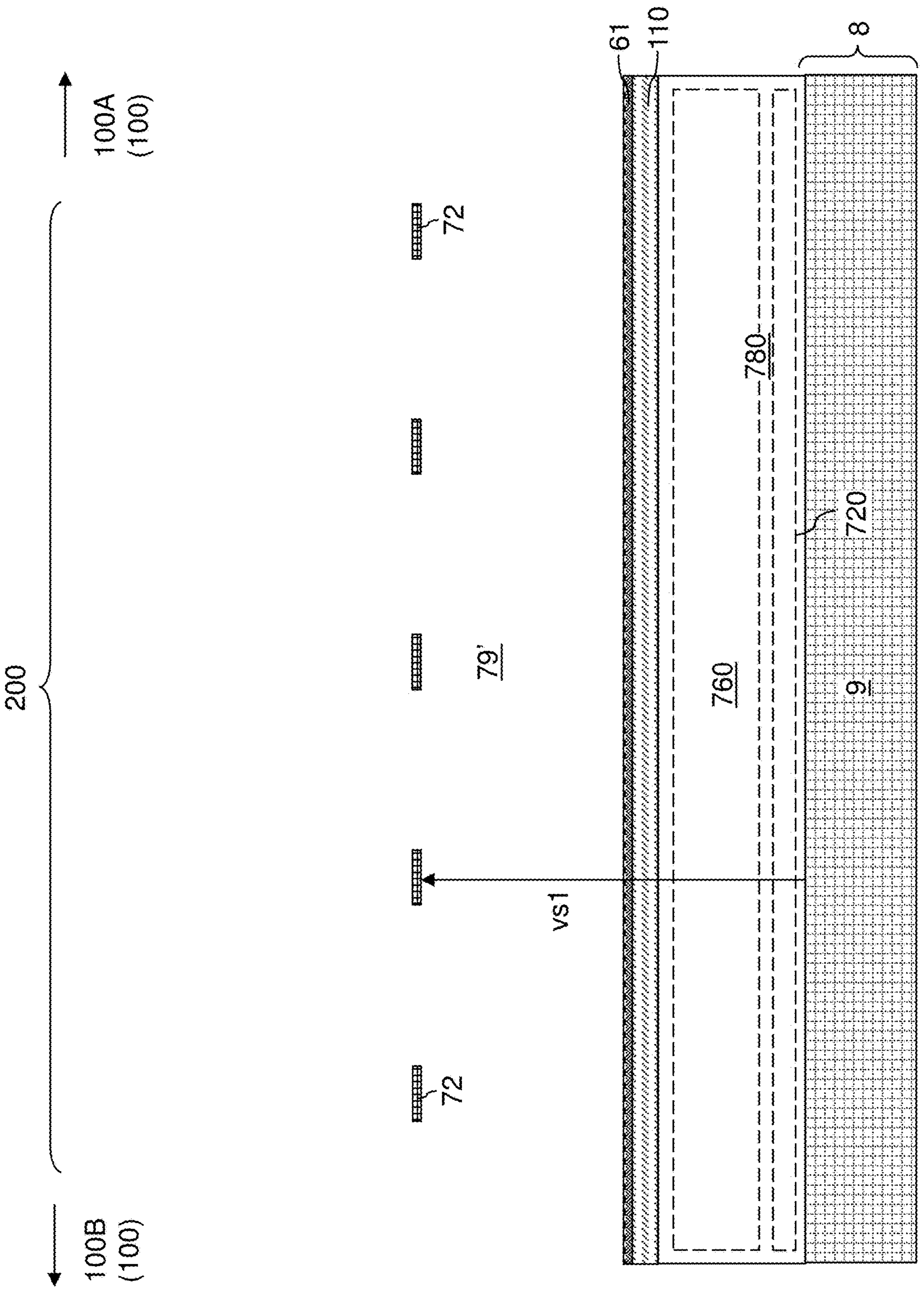
FIG. 23D is a vertical cross-sectional view of the exemplary structure along the vertical plane D-D' of FIG. 23B.
Figure 23E:
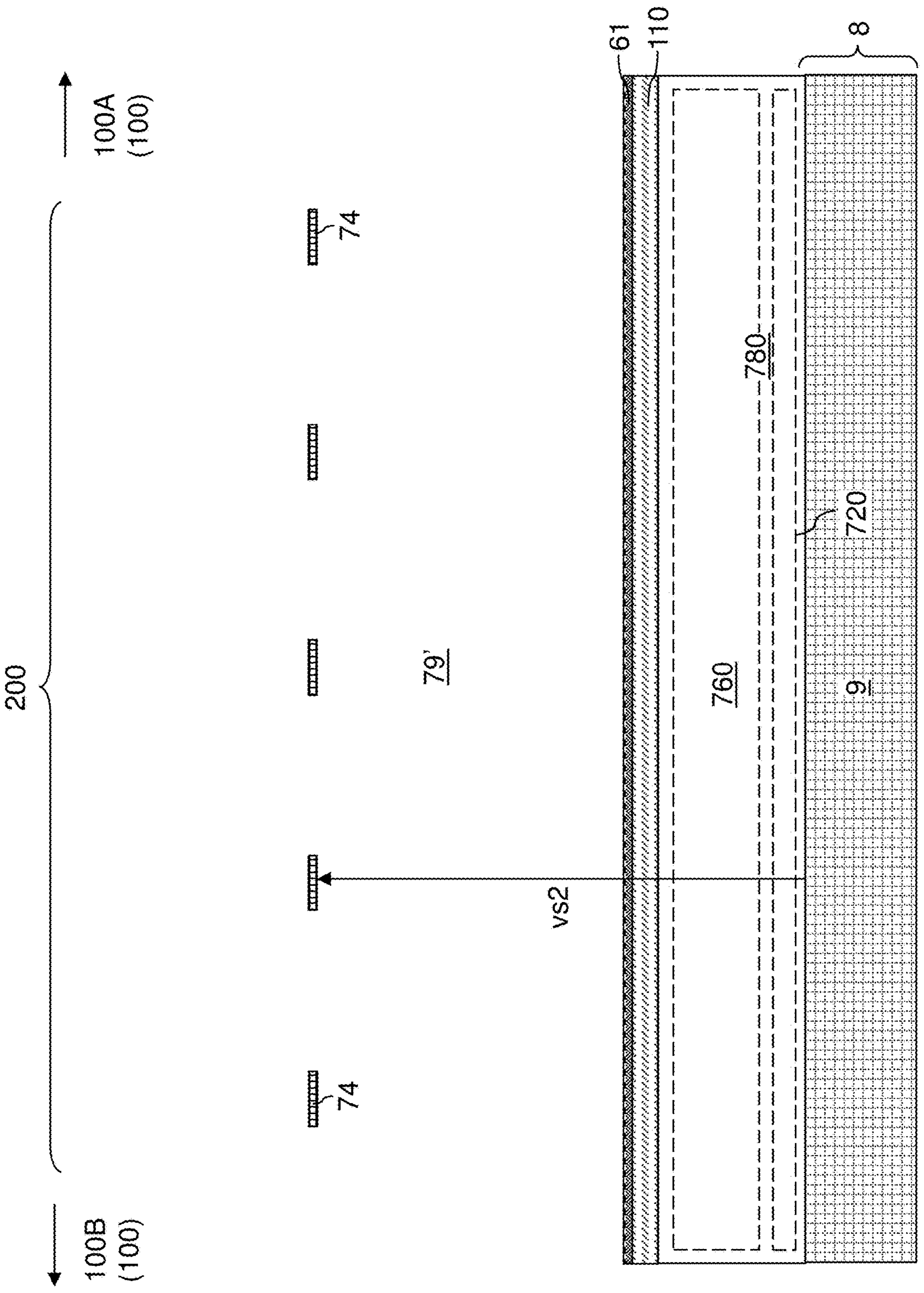
FIG. 23E is a vertical cross-sectional view of the exemplary structure along the vertical plane E-E' of FIG. 23B.
Figure 24A:
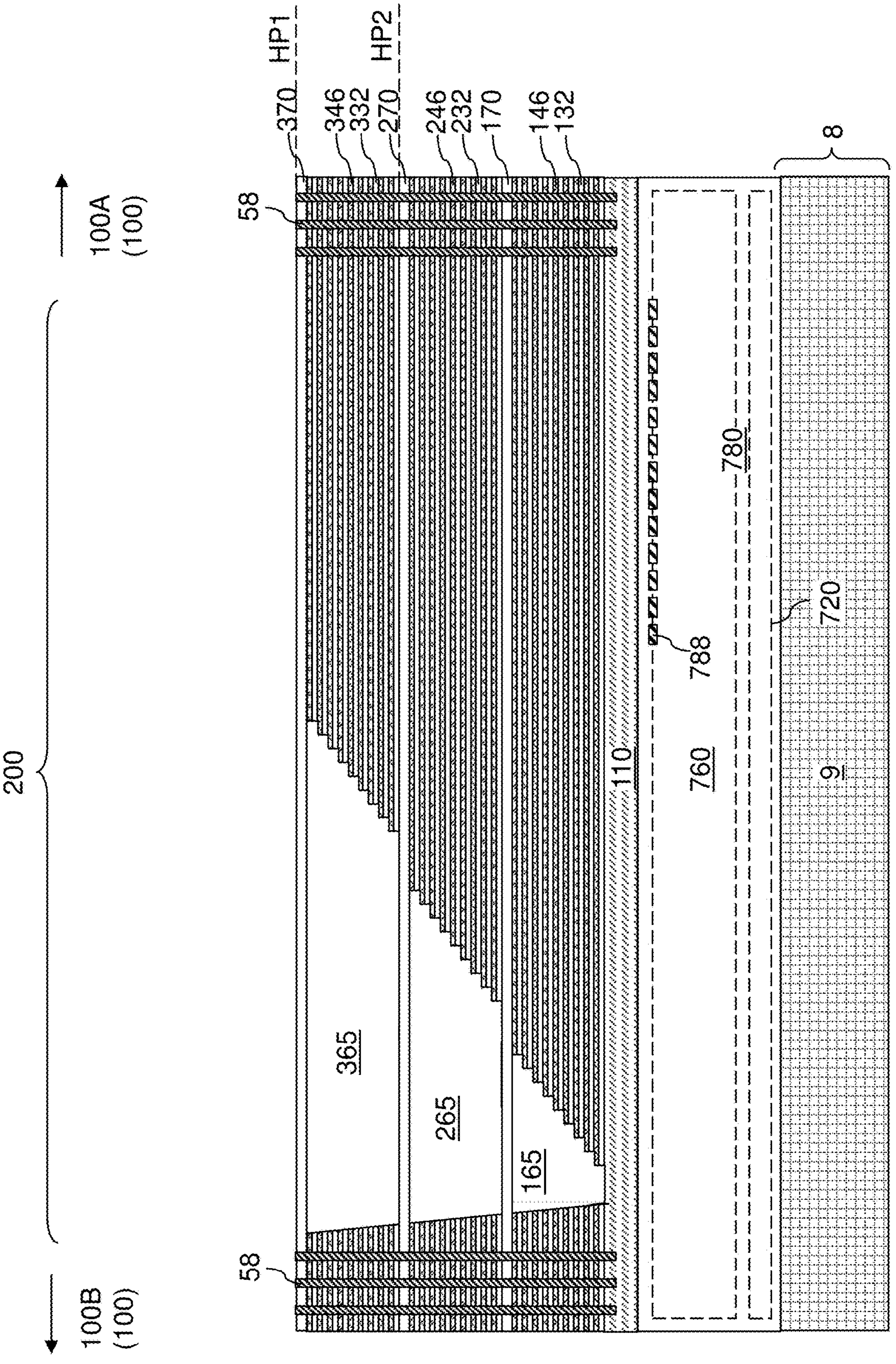
FIG. 24A is a vertical cross-sectional view of the exemplary structure after formation of backside insulating spacers in the backside trenches according to an embodiment of the present disclosure.
Figure 24B:
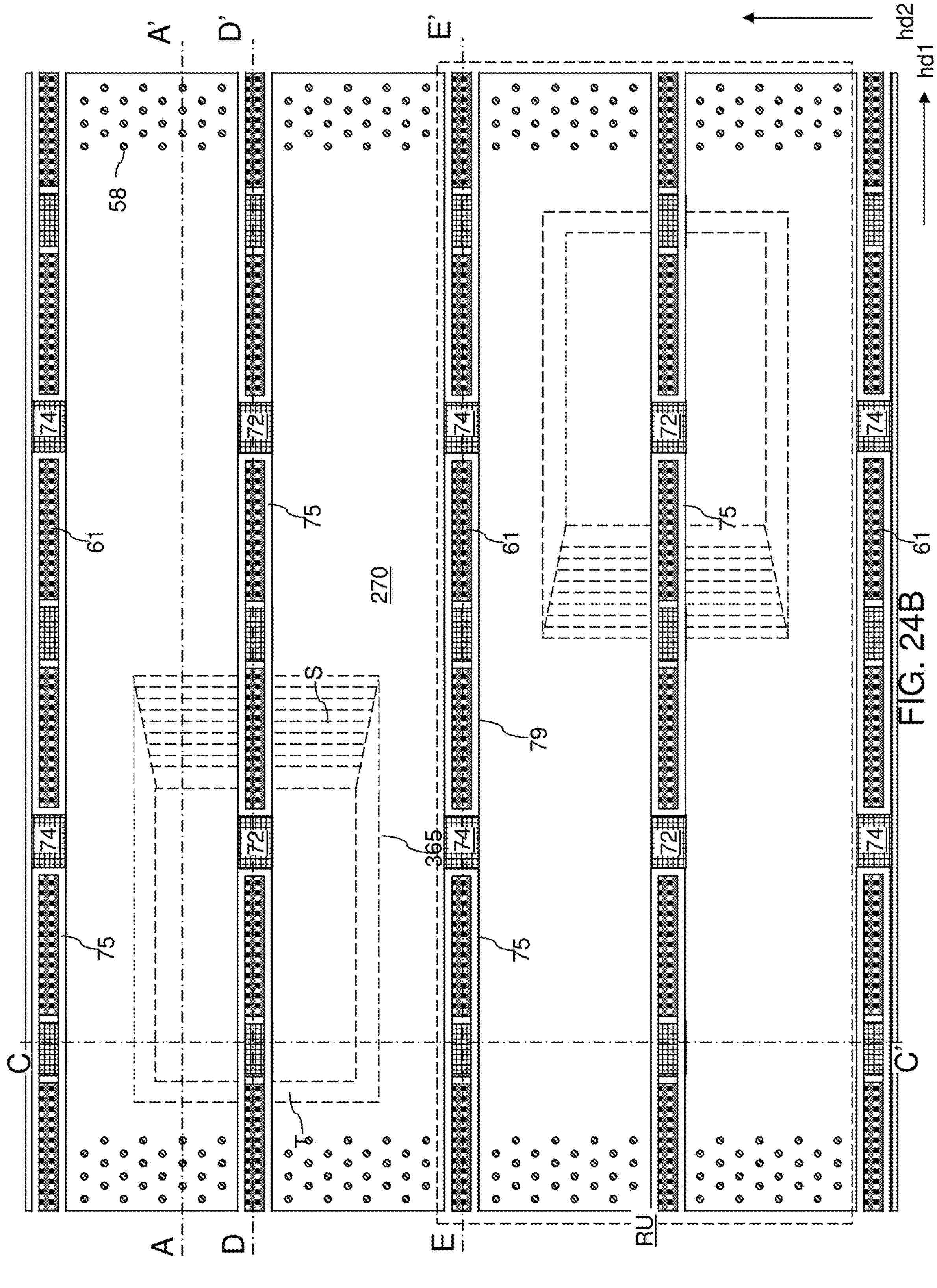
FIG. 24B is a top-down view of the exemplary structure of FIG. 24A. The vertical plane A-A' is the plane of the vertical cross-sectional view of FIG. 24A.
Figure 24C:
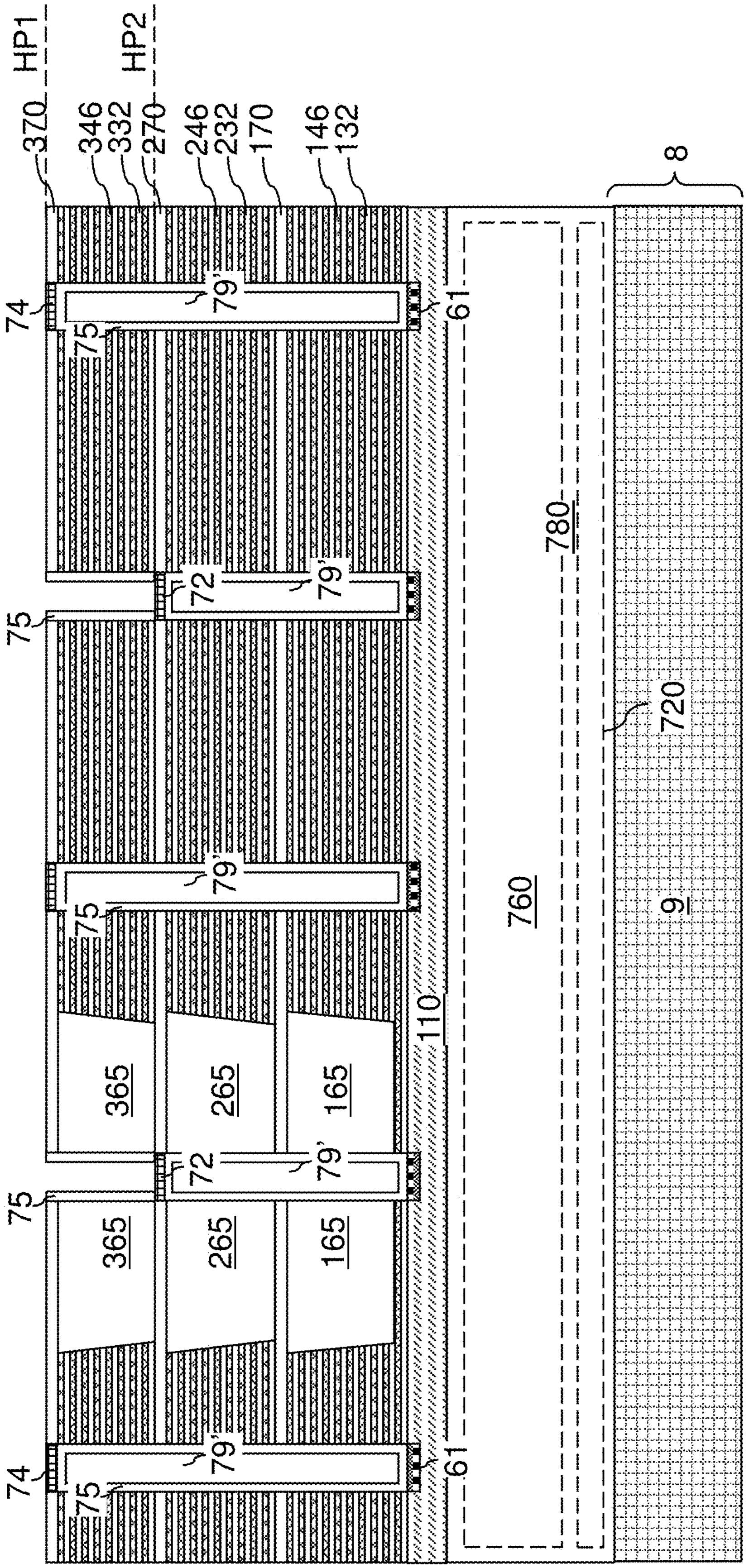
FIG. 24C is a vertical cross-sectional view of the exemplary structure along the vertical plane C-C' of FIG. 24B.
Figure 24D:
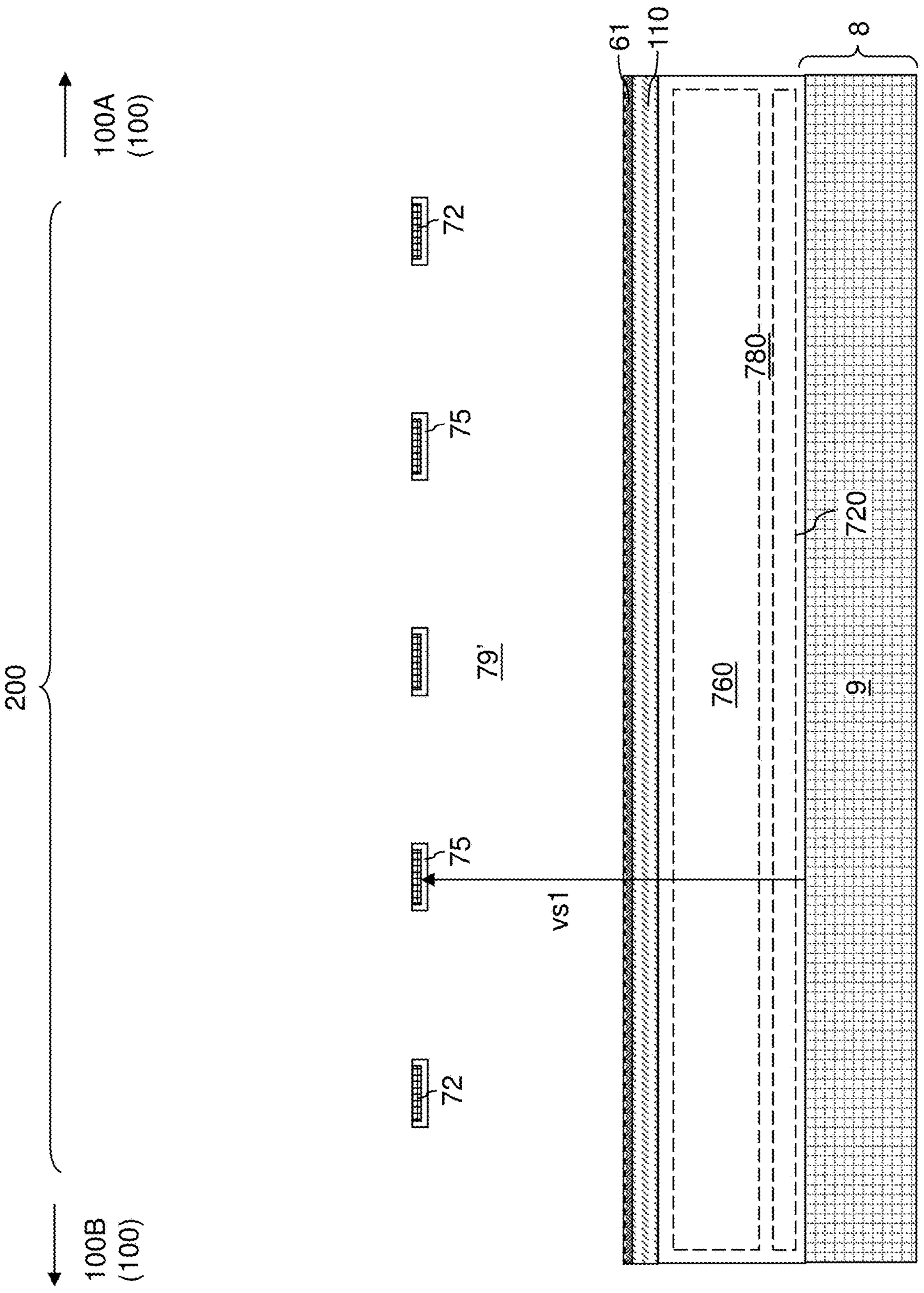
FIG. 24D is a vertical cross-sectional view of the exemplary structure along the vertical plane D-D' of FIG. 24B.
Figure 24E:
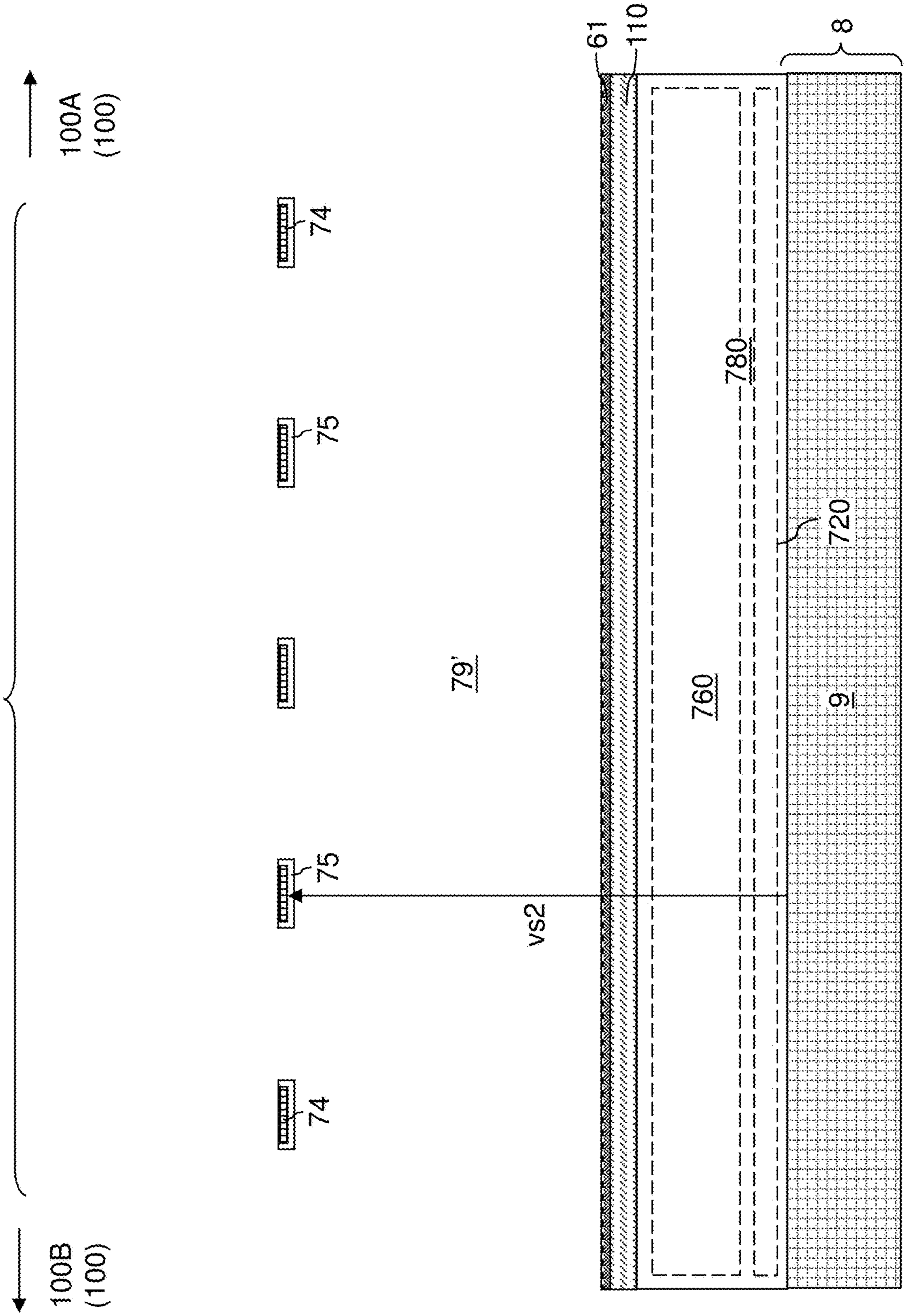
FIG. 24E is a vertical cross-sectional view of the exemplary structure along the vertical plane E-E' of FIG. 24B.
Figure 25A:
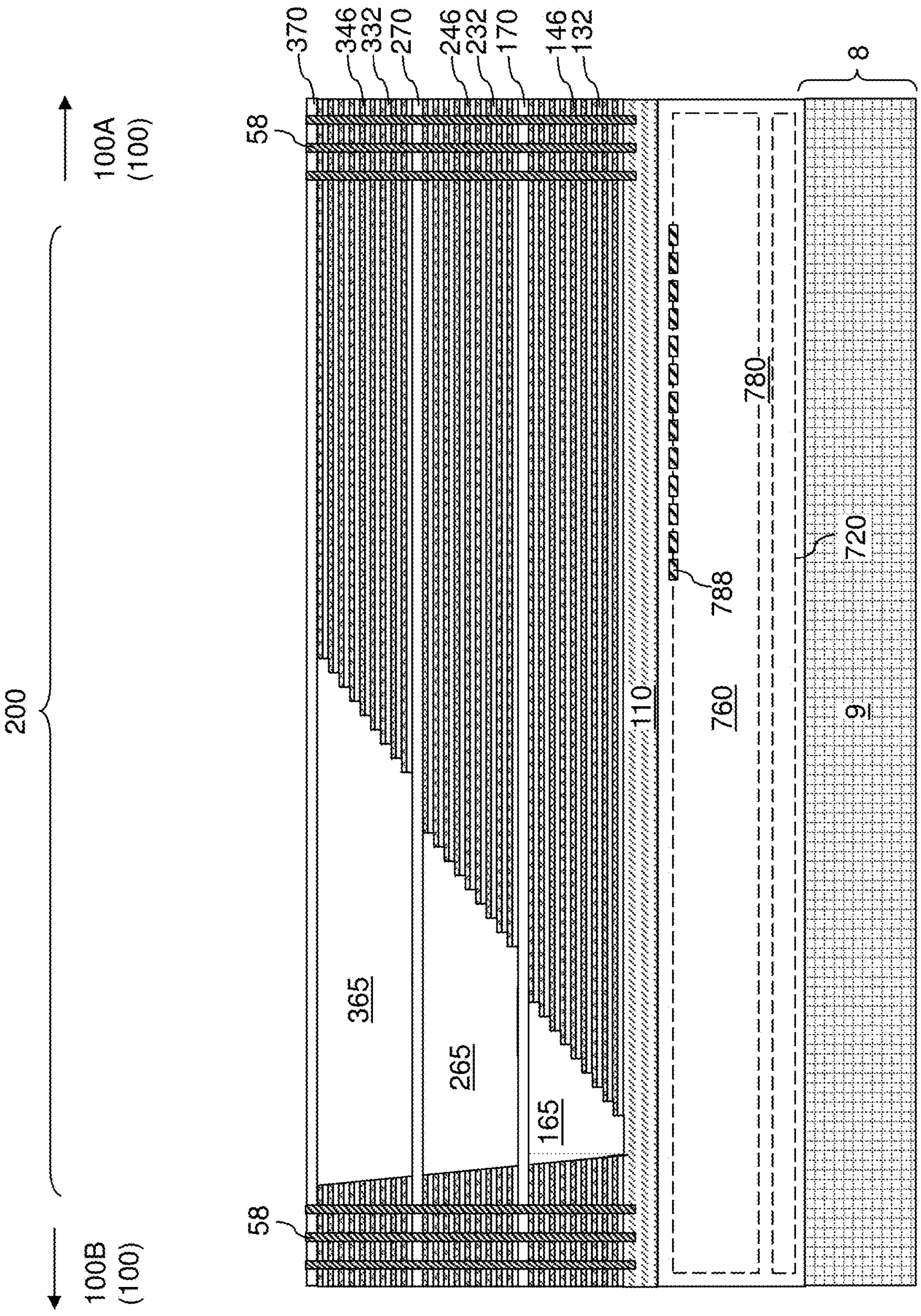
FIG. 25A is a vertical cross-sectional view of the exemplary structure after formation of backside contact via structures in the backside trenches according to an embodiment of the present disclosure.
Figure 25B:
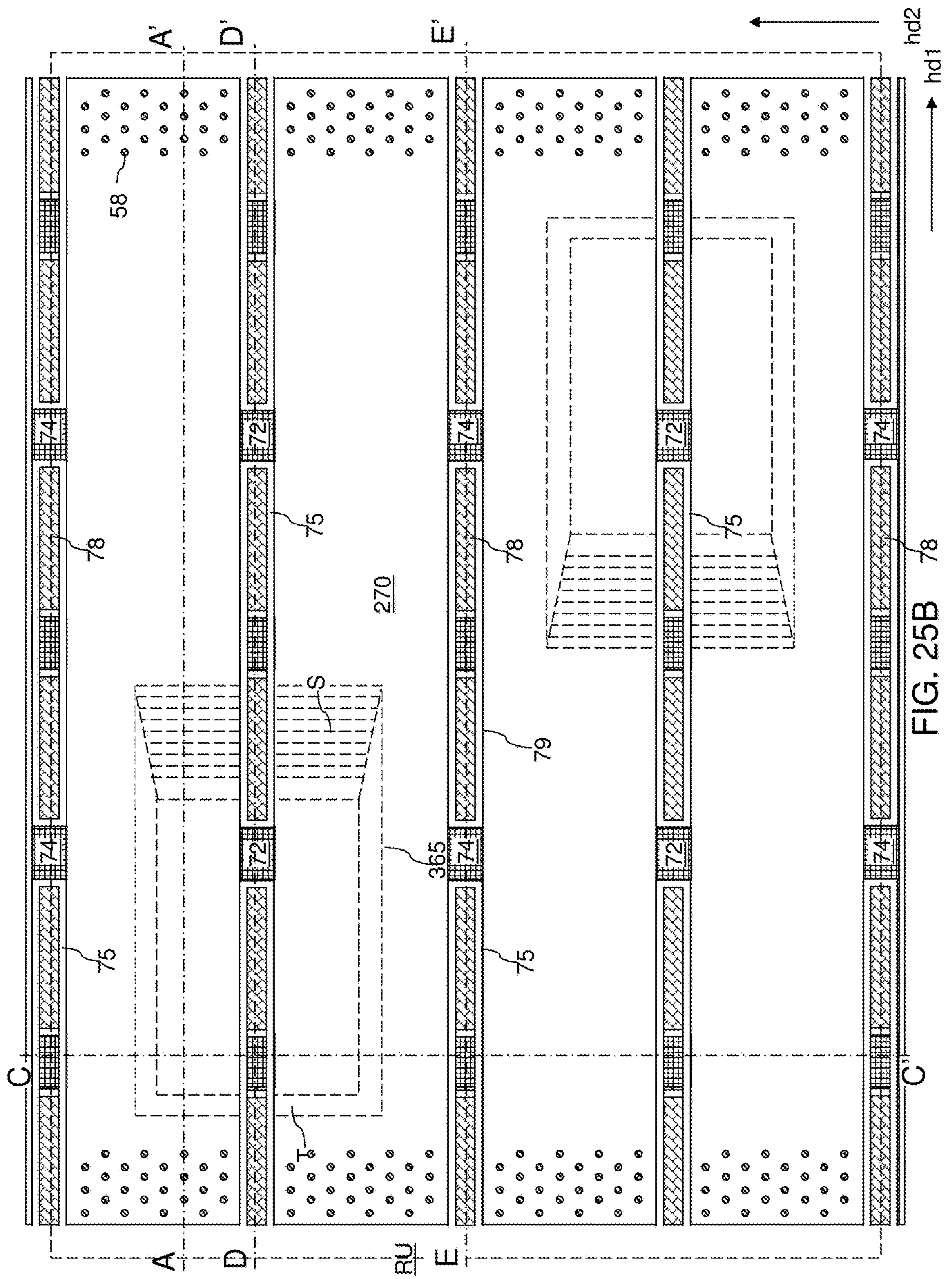
FIG. 25B is a top-down view of the exemplary structure of FIG. 25A. The vertical plane A-A' is the plane of the vertical cross-sectional view of FIG. 25A.
Figure 25C:
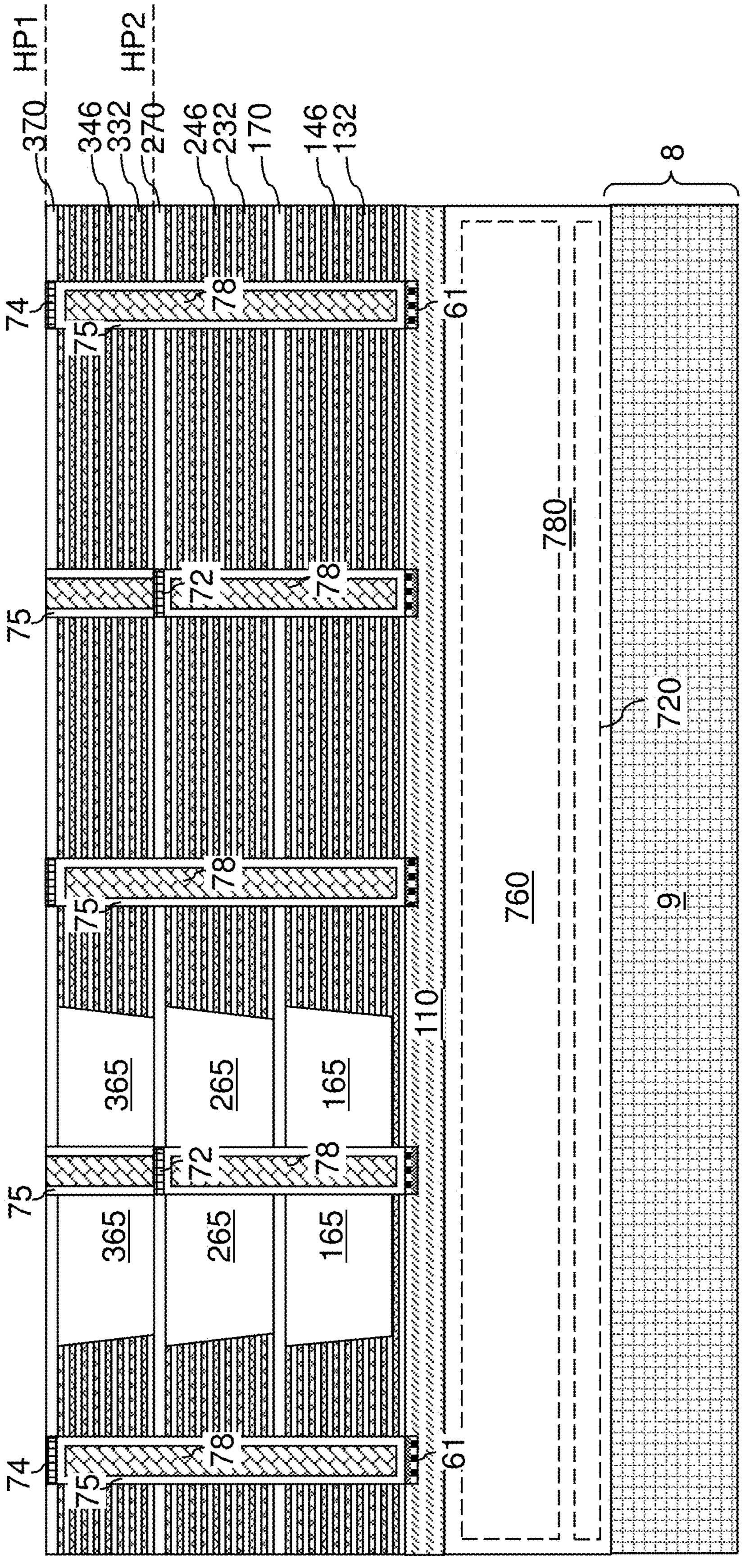
FIG. 25C is a vertical cross-sectional view of the exemplary structure along the vertical plane C-C' of FIG. 25B.
Figure 25D:
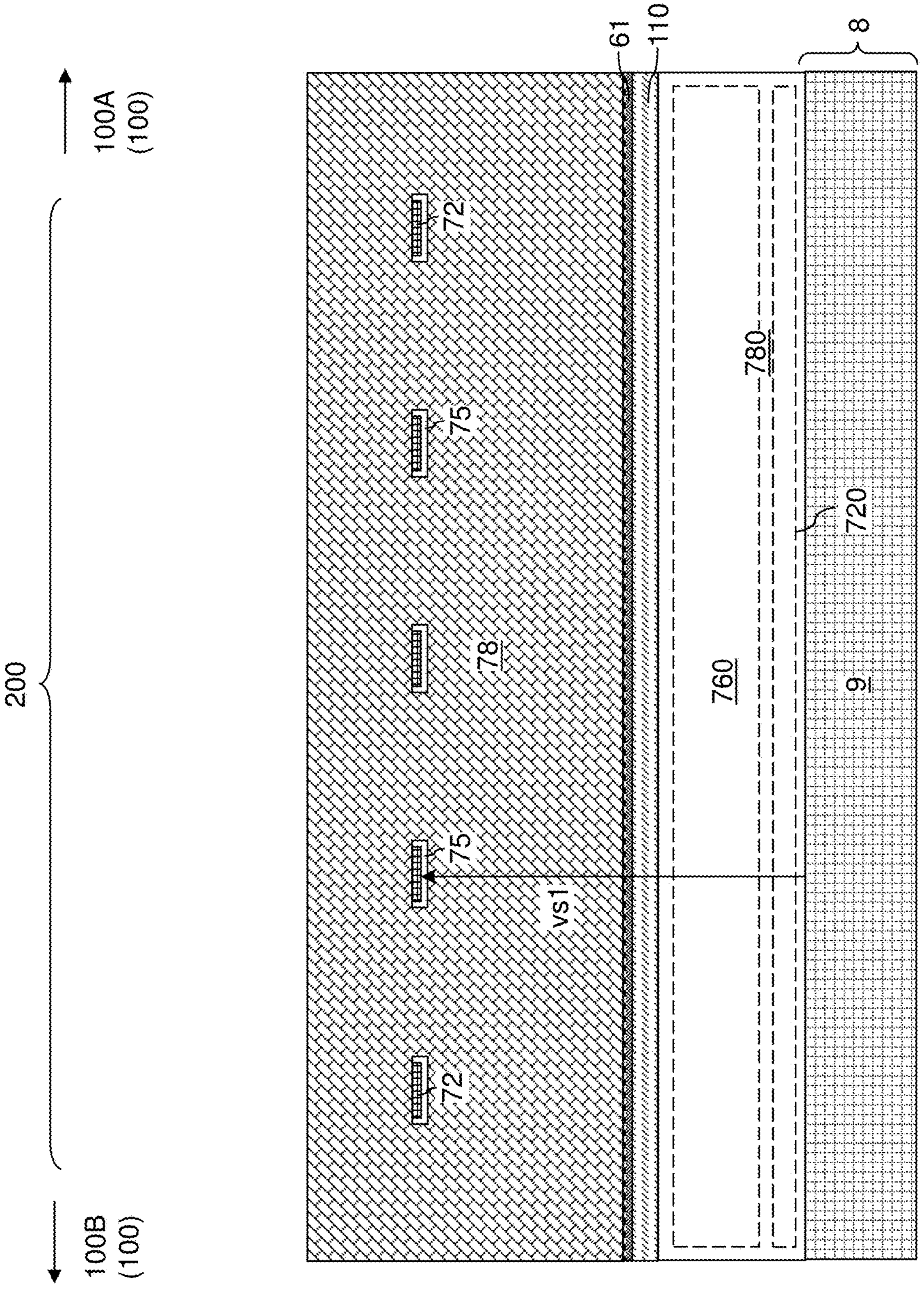
FIG. 25D is a vertical cross-sectional view of the exemplary structure along the vertical plane D-D' of FIG. 25B.
Figure 25E:
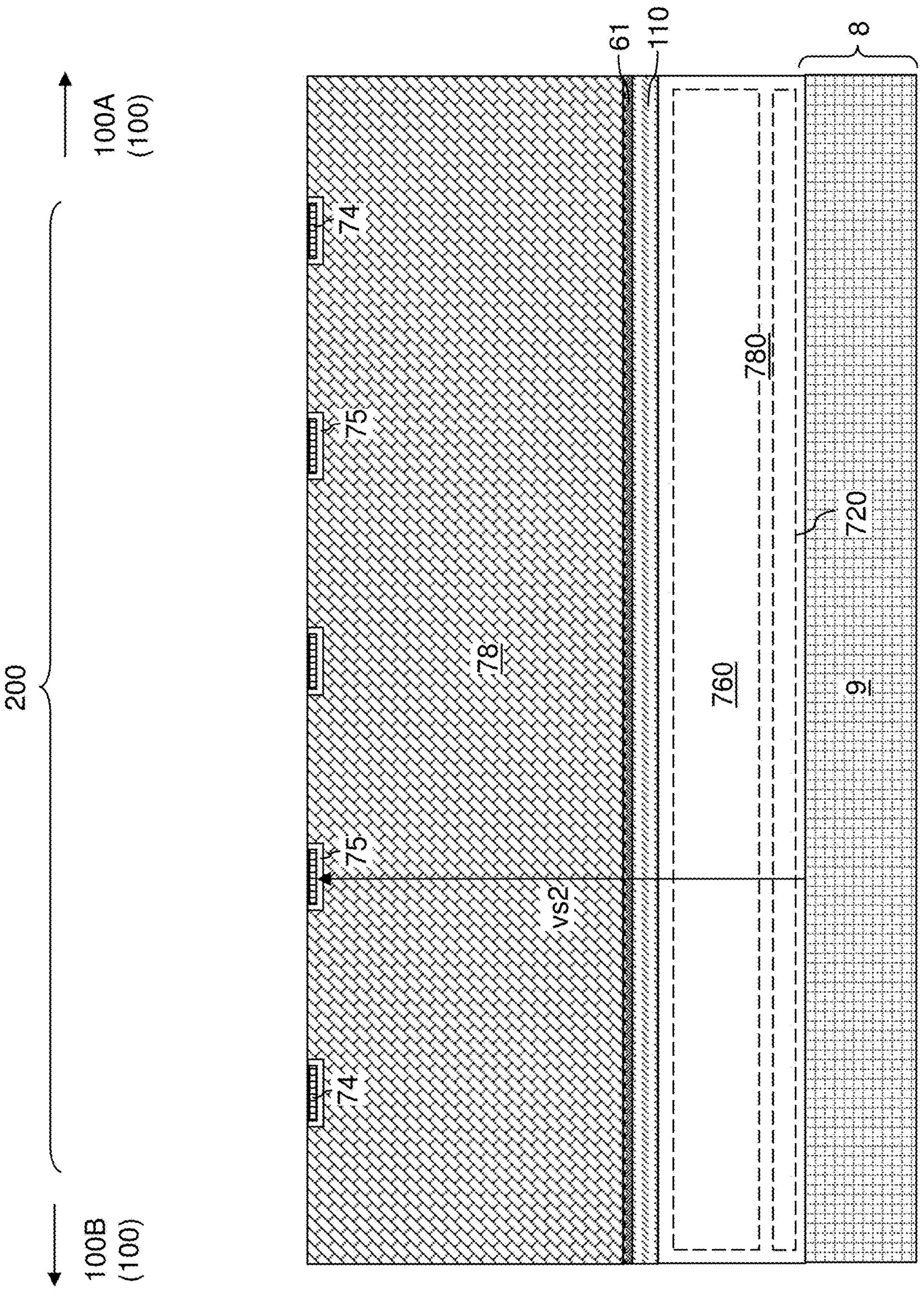
FIG. 25E is a vertical cross-sectional view of the exemplary structure along the vertical plane E-E' of FIG. 25B.

As shown in FIG. 23B, the electrically conductive layers (146, 246, 346) include continuous connection regions 446 that continuously extend through the inter-array region 200 along the first horizontal direction hd1 between the first memory array region 100A and the second memory array region 100B in a space along the second horizontal direction hd2 between the adjacent backside trench 79 and the adjacent respective retro-stepped dielectric material portion (165, 265, 365).

Referring to FIGS. 23A-23E, dopants of the second conductivity type can be implanted into surface portions of the semiconductor material layer 110 that underlie the backside trenches 79. In one embodiment, an angled ion implantation process with a tilt angle along the first horizontal direction hd1 may be performed to form a continuously-extending implanted region underneath each backside trench 79. A source region 61 can be formed within each implanted portion of the semiconductor material layer 110.

Referring to FIGS. 24A-24E, an insulating material layer can be conformally deposited in the backside cavities 79' and over the third insulating cap layers 370. An anisotropic etch process can be performed to remove horizontally-extending portions of the insulating material layer that are not masked by any overlying structure. Each remaining portion of the insulating material layer that remains in a respective backside trench 79 constitutes a backside insulating spacer 75.

Each backside insulating spacer 75 comprise an insulating material such as silicon oxide, silicon nitride, and/or a dielectric metal oxide. The lateral thickness of vertically-extending portions of the backside insulating spacers 75 may be in a range from 5 nm to 100 nm, such as from 10 nm to 50 nm, although lesser and greater thicknesses may also be employed. Each backside insulating spacer 75 may comprise a plurality of horizontally-extending bridge portions contacting a backside surface of a respective one of the second backside bridge support structures 74 or a backside surface of a respective one of the first backside bridge support structures 72. Further, Each backside insulating spacer 75 may comprise vertically-extending bridge portions contacting a sidewall of a respective one of the second backside bridge support structures 74 or a backside surface of a respective one of the first backside bridge support structures 72.

Generally, a backside insulating spacer 75 can be formed within each contiguous volume formed by removal of the second sacrificial trench fill structures 73. Each backside insulating spacer 75 contacts sidewalls of a respective pair of alternating stacks of insulating layers (132, 232, 332) and electrically conductive layers (146, 246, 346) that are laterally spaced apart along the second horizontal direction hd2 by a respective backside trench 79. In one embodiment, each backside insulating spacer 75 located within a respective first backside trench 791 contacts bottom surfaces of first backside support bridge structures 72. Each backside insulating spacer 75 located within a respective second backside trench 792 contacts bottom surfaces of second backside support bridge structures 74.

Referring to FIGS. 25A-25E, at least one conductive material can be conformally deposited in remaining volumes of the backside cavities 79' directly on physically exposed top surfaces of the source regions 61. The at least one conductive material may comprise a metallic barrier liner material (such as TiN, TaN, WN, or MoN) and a metallic fill material (such as W, Ti, Ta, Mo, Ru, Co, etc.). Excess portions of the at least one conductive material may be removed from above the first horizontal plane HP1 by a planarization process, which may employ a chemical mechanical polishing (CMP) process and/or a recess etch process. Each remaining portion of the at least one conductive material filling a respective backside cavity constitutes a backside contact via structure 76.

Each first backside trench 791 is filled with a first backside trench fill structure (72, 75, 76), and each second backside trench fill structure 792 is filled with a second backside trench fill structure (74, 75, 76).

Generally, each of the first backside trench fill structures (72, 75, 76) and the second backside trench fill structures (74, 75, 76) comprises a respective backside contact via structure 76 that is laterally surrounded by a respective backside insulating spacer 75. Source regions 61 can be embedded within the semiconductor material layer 110, and can contact a bottom surface of a respective one of the backside contact via structures 76. Each backside contact via structure 76 within a respective first backside trench fill structure (72, 75, 76) contacts top surfaces of each first backside support bridge structure 72 within the respective first backside trench fill structure (72, 75, 76). Each backside contact via structure 76 within a respective second backside trench fill structure (74, 75, 76) is not in direct contact with any second backside support bridge structure 74 within the respective second backside trench fill structure (74, 75, 76).

Referring to FIGS. 26A-26E, a contact-level dielectric layer 380 may be formed over the third insulating cap layer 370. Various additional contact via structures can be formed through the exemplary structure. The additional contact structures may comprise drain contact via structures 88 that are formed through the contact-level dielectric layer 380 and directly on a top surface of a respective one of the drain regions 63. The additional contact via structures may also comprise layer contact via structures 86 that vertically extend through the contact-level dielectric layer 380 and at least one retro-stepped dielectric material portion (165, 265, 365) and directly on a top surface of a respective one of the electrically conductive layers (146, 246, 346). The additional contact via structures may also comprise through-memory-level connection via structures 488 that are formed though a respective one of the alternating stacks {(132, 146), (232, 246), (332, 346)} and directly on a top surface of a respective one of the metal pads 788, which are components of the lower-level metal interconnect structures 780. Bit lines (not shown) extending in the second horizontal direction hd2 are then formed in electrical contact drain contact via structures 88.

Figure 27:
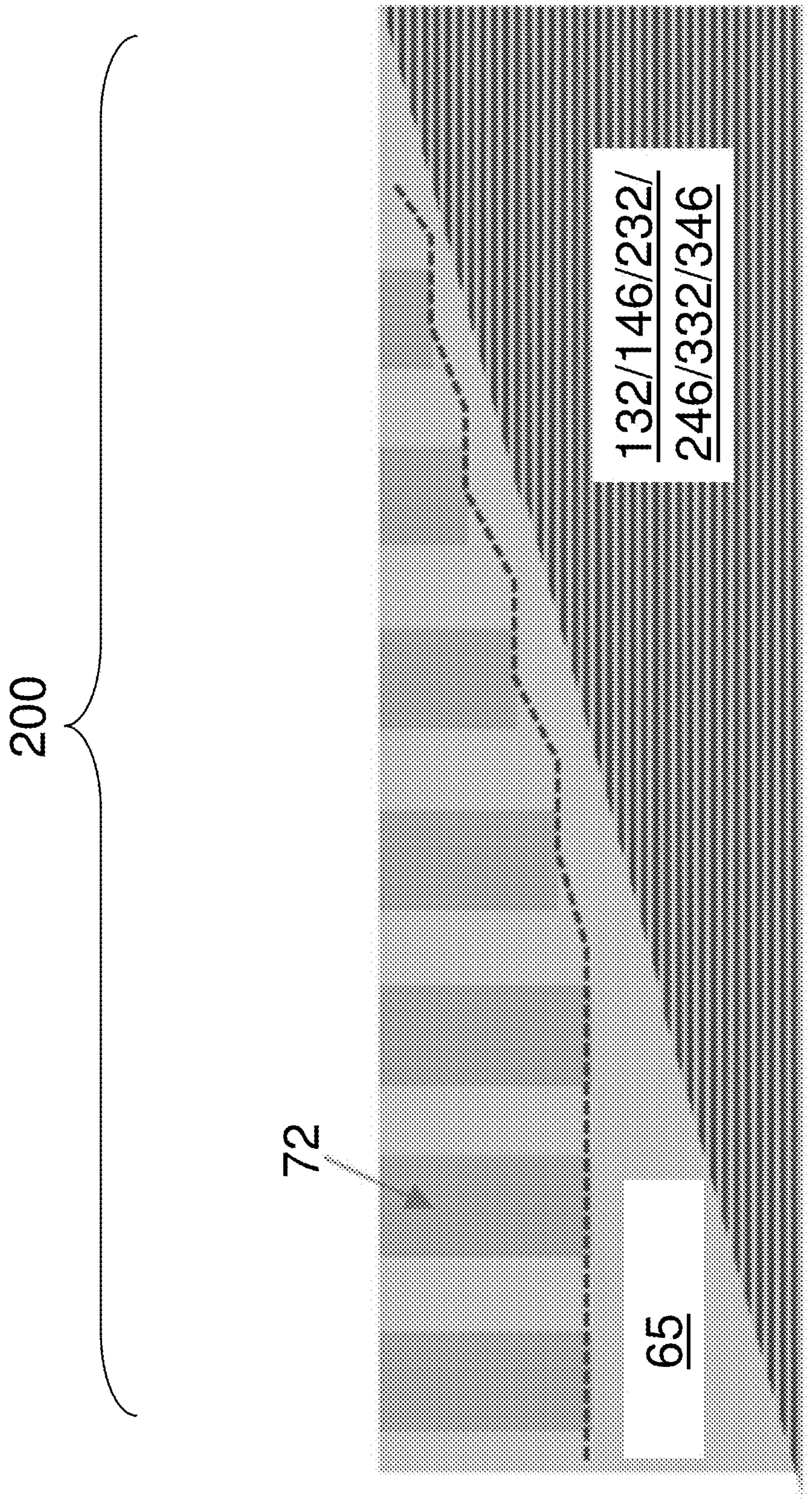
FIG. 27 is a vertical cross-sectional view of the exemplary structure of an alternative embodiment.

Referring to FIG. 27, in an embodiment in which the first backside bridge support structures 72 comprise amorphous silicon, the bottom surfaces of the first backside bridge support structures 72 may be located at different vertical levels above the stepped surfaces of the electrically conductive layers (146, 246, 346) in the in the inter-array region 200. For example, the bottom surfaces of the first backside bridge support structures 72 may be located on the top surface of the retro-stepped dielectric liner 65 located on the stepped surfaces. Thus, the retro-stepped dielectric liner 65 separates the first backside bridge support structures 72 from the stepped surfaces of the electrically conductive layers (146, 246, 346) to prevent short circuits between them. In this embodiment, the first backside bridge support structures 72 comprise depth variable support structures having respective bottom surfaces located at different vertical levels from the substrate 8. These depth variable support structures may be formed by a separate lithography and reactive ion etching process.

In another alternative embodiment, the first and second backside bridge support structures (72, 74) may be formed using the method described in U.S. patent application Ser. No. 17/819,081 filed on Aug. 11, 2022 and incorporated herein by reference in its entirety. In this alternative method, a respective sacrificial stopping material layer is formed over the second and third tiers. A row of discrete recesses is formed in the first and second sacrificial trench fill structures (71, 73) using the sacrificial stopping material layer as an etch stop. A respective backside bridge support structure material may be deposited into the discrete recesses and over the sacrificial stopping material layer. The backside bridge support structure material is then planarized with the top of the respective alternative stack in the respective tier by a CMP process. The sacrificial stopping material layer acts as a CMP polishing stop and is removed during and/or after the CMP process. The CMP process leaves the discrete first and second backside bridge support structures (72, 74) in the respective discrete recesses located above the first and second sacrificial trench fill structures (71, 73).

Referring to all drawings and according to various embodiments of the present disclosure, a semiconductor structure is provided, which comprises: alternating stacks of insulating layers (132, 232, 332) and electrically conductive layers (146, 246, 346) located over a substrate 8, wherein each of the alternating stacks laterally extends along a first horizontal direction hd1, wherein the alternating stacks are laterally spaced apart from each other along a second horizontal direction hd2 by backside trenches 79 that laterally extend along the first horizontal direction hd1, and wherein the backside trenches 79 comprise first backside trenches 791 and second backside trenches 792 that are interlaced along the second horizontal direction hd2 perpendicular to the first horizontal direction hd1; first backside trench fill structures (72, 75, 76) located in the first backside trenches 791, wherein each of the first backside trench fill structures (72, 75, 76) comprises a respective set of first backside support bridge structures 72 located at a first vertical spacing vs1 from the substrate 8; and second backside trench fill structures (74, 75, 76) located in the second backside trenches 792, wherein each of the second backside trench fill structures (74, 75, 76) comprises a respective set of second backside support bridge structures 74 located at a second vertical spacing vs2 from the substrate 8 that is different from the first vertical spacing vs1, and wherein the second backside trenches 792 do not include the first backside support trench fill structures 72 located at the first vertical spacing vs1 from the substrate 8.

In one embodiment, the first backside trenches 791 do not include the second backside support trench fill structures 74 located at the second vertical spacing vs2 from the substrate 2. In one embodiment, the first and the second backside support trench fill structures (72, 74) comprise a doped semiconductor material, such as boron doped silicon (e.g., p-type amorphous silicon or polysilicon).

Figure 26A:
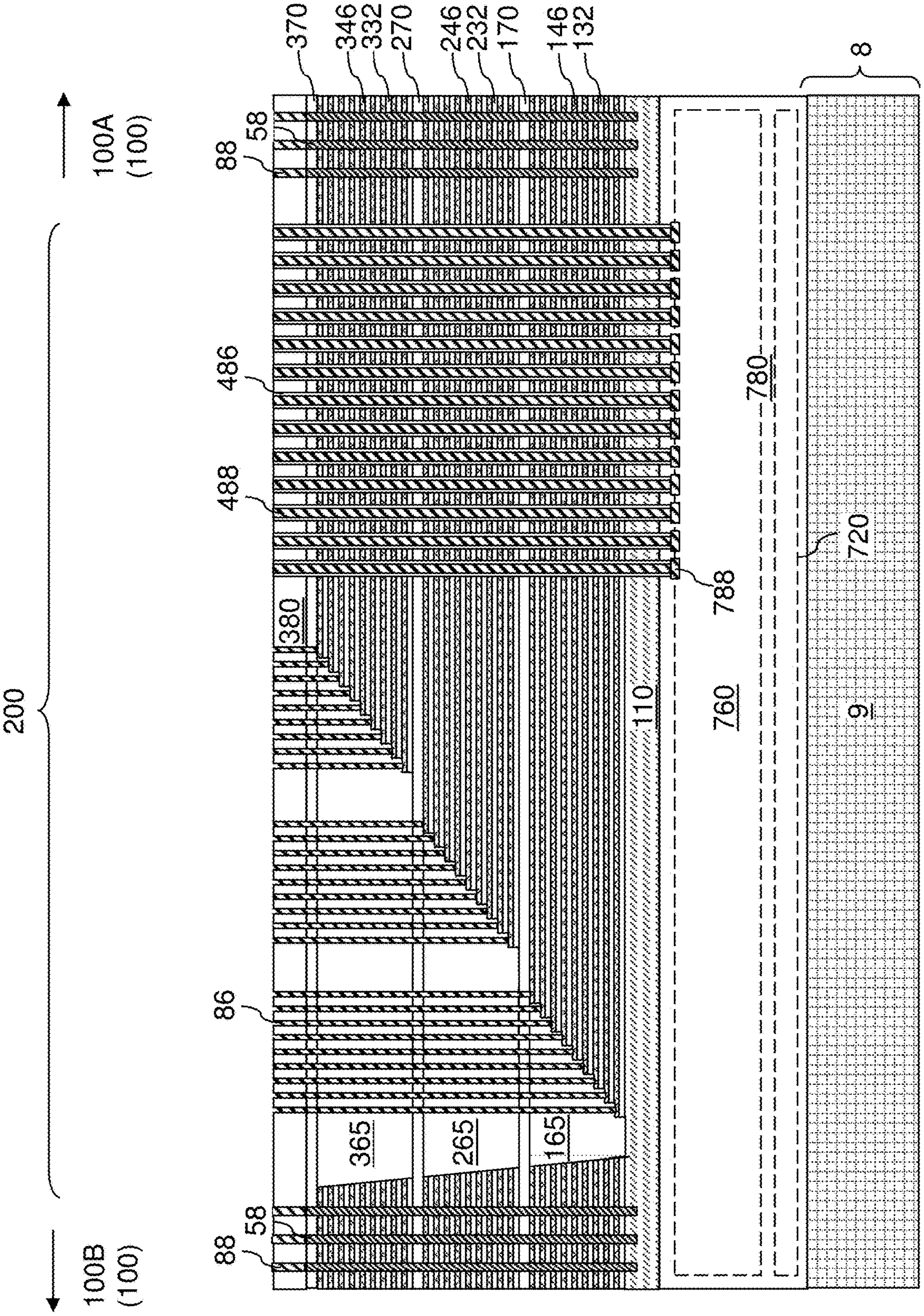
FIG. 26A is a vertical cross-sectional view of the exemplary structure after formation of a contact-level dielectric layer and additional contact via structures according to an embodiment of the present disclosure.
Figure 26B:
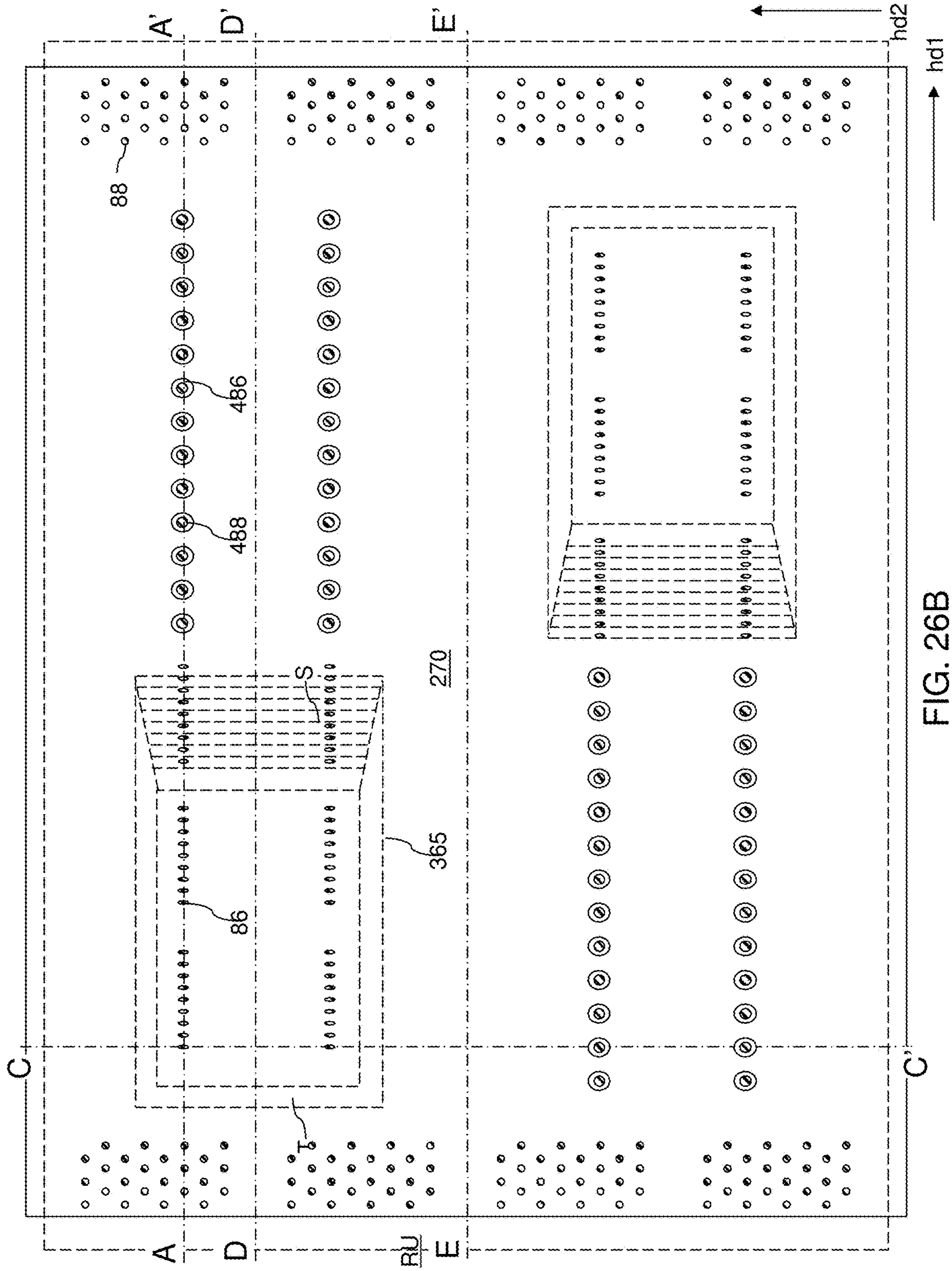
FIG. 26B is a top-down view of the exemplary structure of FIG. 26A. The vertical plane A-A' is the plane of the vertical cross-sectional view of FIG. 26A.
Figure 26C:
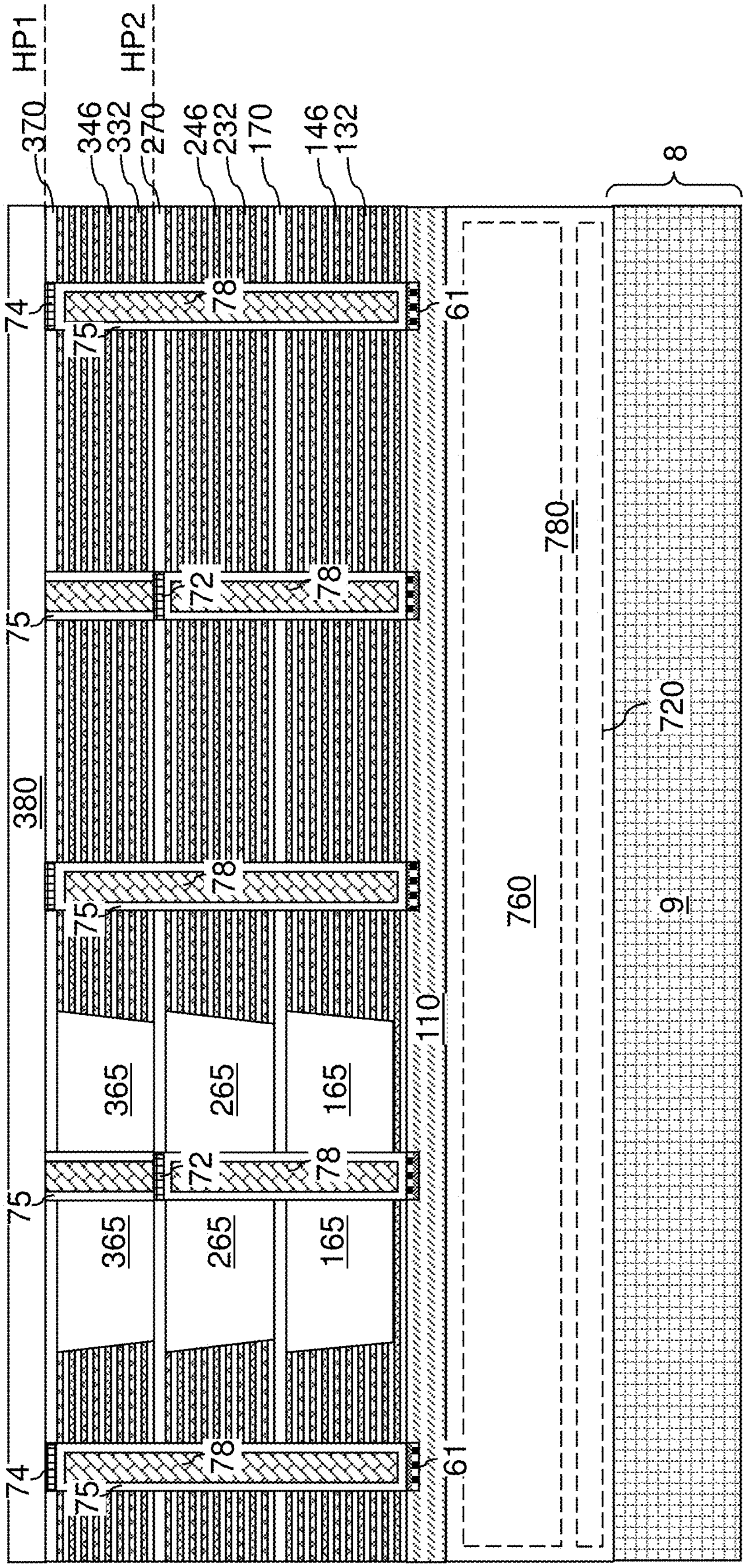
FIG. 26C is a vertical cross-sectional view of the exemplary structure along the vertical plane C-C' of FIG. 26B.
Figure 26D:
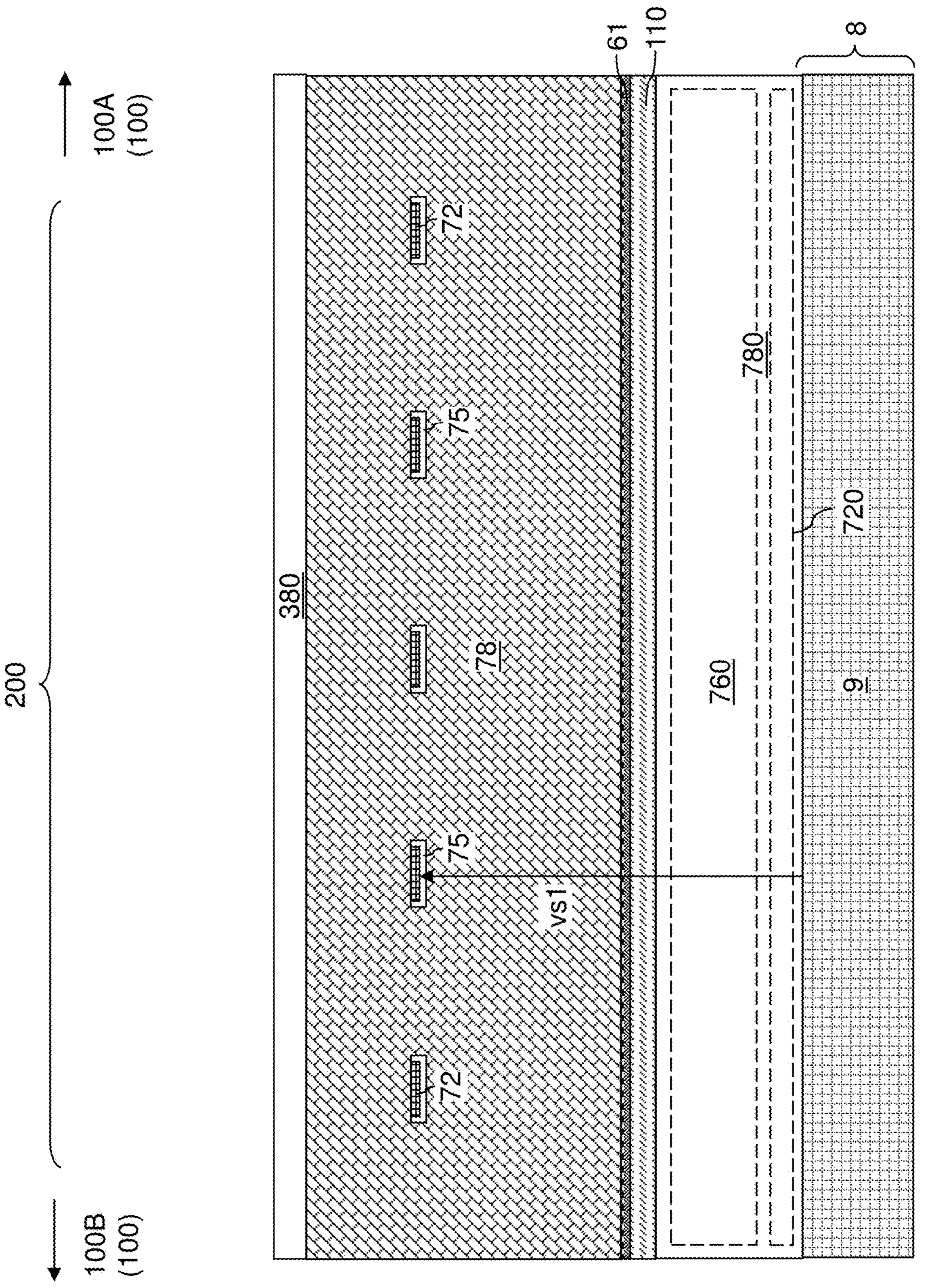
FIG. 26D is a vertical cross-sectional view of the exemplary structure along the vertical plane D-D' of FIG. 26B.
Figure 26E:
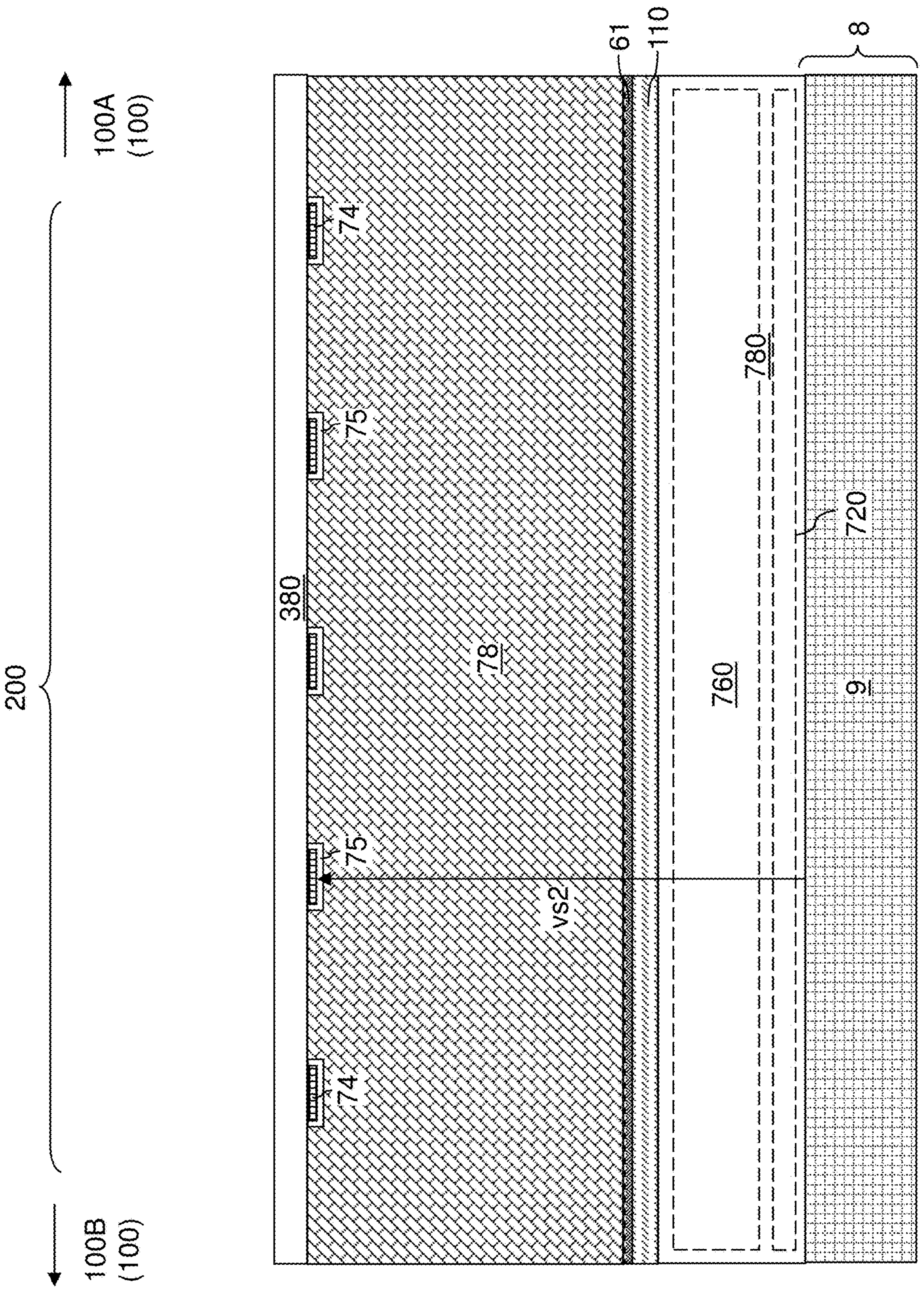
FIG. 26E is a vertical cross-sectional view of the exemplary structure along the vertical plane E-E' of FIG. 26B.

In one embodiment shown in FIG. 26B, vertical plane C-C' extending in the second horizontal direction hd2 passes through a plurality of the first and the second backside support trench fill structures (72, 74). The view across the vertical plane C-C' is shown in FIG. 26C.

In one embodiment, each of the alternating stacks of insulating layers (132, 232, 332) and electrically conductive layers (146, 246, 346) comprises a respective insulating cap layer 370 having a respective top surface within a first horizontal plane HP1 in which top surfaces of the second backside support bridge structures 74 are located.

In one embodiment, each of the alternating stacks of insulating layers (132, 232, 332) and electrically conductive layers (146, 246, 346) comprise a respective additional insulating cap layer 270 having a respective top surface within a second horizontal plane HP2 in which top surfaces of the first backside support bridge structures 72 are located.

In one embodiment, each set of first backside support bridge structures 72 contacts sidewalls of a respective pair of insulating cap layers 370 among the insulating cap layers 370. In one embodiment, the insulating cap layers 370 have a greater thickness than the second backside support bridge structures 74.

In one embodiment, each of the first backside trench fill structures (72, 75, 76) and the second backside trench fill structures (74, 75, 76) comprises a respective backside insulating spacer 75 contacting sidewalls of a respective pair of alternating stacks among the alternating stacks.

In one embodiment, each of the first backside trench fill structures (72, 75, 76) and the second backside trench fill structures (74, 75, 76) comprises a respective backside contact via structure 76 that is laterally surrounded by the respective backside insulating spacer 75. In one embodiment, the semiconductor structure comprises: a semiconductor material layer 110 located above, or within, the substrate 8; and source regions 61 embedded within the semiconductor material layer 110 and contacting a bottom surface of a respective one of the backside contact via structures 76.

In one embodiment, each backside contact via structure 76 within a respective first backside trench fill structure (72, 75, 76) contacts top surfaces of each first backside support bridge structure within the respective first backside trench fill structure (72, 75, 76). In one embodiment, each backside contact via structure 76 within a respective second backside trench fill structure (74, 75, 76) is not in direct contact with any second backside support bridge structure 74 within the respective second backside trench fill structure (74, 75, 76).

In one embodiment, each backside insulating spacer 75 located within a respective first backside trench fill structure (72, 75, 76) contacts bottom surfaces of each first backside support bridge structure within the respective first backside trench fill structure (72, 75, 76); and each backside insulating spacer 75 located within a respective second backside trench fill structure (74, 75, 76) contacts bottom surfaces of each second backside support bridge structure 74 within the respective second backside trench fill structure (74, 75, 76). In one embodiment, the semiconductor structure comprises: memory openings 49 vertically extending through a respective alternating stack among the alternating stacks; and memory opening fill structures 58 located within a respective one of the memory openings 49 and comprising a respective vertical stack of memory elements (such as portions of memory material layer 54 located at levels of the electrically conductive layers (146, 246, 346)) and a respective vertical semiconductor channel 60.

In one embodiment, each of the alternating stacks laterally extends along the first horizontal direction hd1 through a first memory array region 100A and a second memory array region 100B that are laterally spaced apart by an inter-array region 200; and the memory opening fill structures 58 are located in the first memory array region and the second memory array region. Each of the alternating stacks comprises a respective plurality of sets of stepped surfaces in the inter-array region 200; and lateral extents of electrically conductive layers (146, 246, 346) within a respective alternating stack decreases with a vertical distance from the substrate 8 at each set of stepped surfaces.

In one embodiment, each set of stepped surfaces underlies, and contacts, a respective retro-stepped dielectric material portion (165, 265, 365); and the respective retro-stepped dielectric material portion (165, 265, 365) contacts only one backside trench fill structure selected from the first backside trench fill structures (72, 75, 76) and the second backside trench structures (74, 75, 76).

In one embodiment, the semiconductor structure comprises layer contact via structures 86 vertically extending through a respective subset of the retro-stepped dielectric material portions (165, 265, 365) and contacting a top surface of a respective one of the electrically conductive layers (146, 246, 346).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:

alternating stacks of insulating layers and electrically conductive layers located over a substrate, wherein each of the alternating stacks laterally extends along a first horizontal direction, wherein the alternating stacks are laterally spaced apart from each other along a second horizontal direction by backside trenches that laterally extend along the first horizontal direction, and wherein the backside trenches comprise first backside trenches and second backside trenches that are interlaced along the second horizontal direction perpendicular to the first horizontal direction;

first backside trench fill structures located in the first backside trenches, wherein each of the first backside trench fill structures comprises a respective set of first backside support bridge structures located at a first vertical spacing from the substrate; and second backside trench fill structures located in the second backside trenches, wherein each of the second backside trench fill structures comprises a respective set of second backside support bridge structures located at a second vertical spacing from the substrate that is different from the first vertical spacing, and wherein the second backside trenches do not include the first backside support trench fill structures located at the first vertical spacing from the substrate;

wherein:

each of the first backside trench fill structures and the second backside trench fill structures further comprises a respective backside insulating spacer contacting sidewalls of a respective pair of alternating stacks of the alternating stacks;

each of the first backside trench fill structures and the second backside trench fill structures further comprises a respective backside contact via structure that is laterally surrounded by the respective backside insulating spacer;

each backside contact via structure within a respective first backside trench fill structure contacts top surfaces of each first backside support bridge structure within the respective first backside trench fill structure; and each backside contact via structure within a respective second backside trench fill structure is not in direct contact with any second backside support bridge structure within the respective second backside trench fill structure.

2. A semiconductor structure, comprising:

alternating stacks of insulating layers and electrically conductive layers located over a substrate, wherein each of the alternating stacks laterally extends along a first horizontal direction, wherein the alternating stacks are laterally spaced apart from each other along a second horizontal direction by backside trenches that laterally extend along the first horizontal direction, and wherein the backside trenches comprise first backside trenches and second backside trenches that are interlaced along the second horizontal direction perpendicular to the first horizontal direction;

first backside trench fill structures located in the first backside trenches, wherein each of the first backside trench fill structures comprises a respective set of first backside support bridge structures located at a first vertical spacing from the substrate; and second backside trench fill structures located in the second backside trenches, wherein each of the second backside trench fill structures comprises a respective set of second backside support bridge structures located at a second vertical spacing from the substrate that is different from the first vertical spacing, and wherein the second backside trenches do not include the first backside support trench fill structures located at the first vertical spacing from the substrate;

wherein:

each of the first backside trench fill structures and the second backside trench fill structures further comprises a respective backside insulating spacer contacting sidewalls of a respective pair of alternating stacks of the alternating stacks;

each of the first backside trench fill structures and the second backside trench fill structures further comprises a respective backside contact via structure that is laterally surrounded by the respective backside insulating spacer;

each backside insulating spacer located within a respective first backside trench fill structure contacts bottom surfaces of each first backside support bridge structure within the respective first backside trench fill structure; and each backside insulating spacer located within a respective second backside trench fill structure contacts bottom surfaces of each second backside support bridge structure within the respective second backside trench fill structure.

3. A semiconductor structure, comprising:

alternating stacks of insulating layers and electrically conductive layers located over a substrate, wherein each of the alternating stacks laterally extends along a first horizontal direction, wherein the alternating stacks are laterally spaced apart from each other along a second horizontal direction by backside trenches that laterally extend along the first horizontal direction, and wherein the backside trenches comprise first backside trenches and second backside trenches that are interlaced along the second horizontal direction perpendicular to the first horizontal direction;

first backside trench fill structures located in the first backside trenches, wherein each of the first backside trench fill structures comprises a respective set of first backside support bridge structures located at a first vertical spacing from the substrate; and second backside trench fill structures located in the second backside trenches, wherein each of the second backside trench fill structures comprises a respective set of second backside support bridge structures located at a second vertical spacing from the substrate that is different from the first vertical spacing, and wherein the second backside trenches do not include the first backside support trench fill structures located at the first vertical spacing from the substrate;

wherein:

each of the alternating stacks of insulating layers and electrically conductive layers comprises a respective insulating cap layer having a respective top surface within a first horizontal plane in which top surfaces of the second backside support bridge structures are located; and each of the alternating stacks of insulating layers and electrically conductive layers comprise a respective additional insulating cap layer having a respective top surface within a second horizontal plane in which top surfaces of the first backside support bridge structures are located.

4. The semiconductor structure of claim 3, wherein:

each set of first backside support bridge structures contacts sidewalls of a respective pair of insulating cap layers of the insulating cap layers; and the insulating cap layers have a greater thickness than the second backside support bridge structures.

5. A semiconductor structure, comprising:

alternating stacks of insulating layers and electrically conductive layers located over a substrate, wherein each of the alternating stacks laterally extends along a first horizontal direction, wherein the alternating stacks are laterally spaced apart from each other along a second horizontal direction by backside trenches that laterally extend along the first horizontal direction, and wherein the backside trenches comprise first backside trenches and second backside trenches that are interlaced along the second horizontal direction perpendicular to the first horizontal direction;

first backside trench fill structures located in the first backside trenches, wherein each of the first backside trench fill structures comprises a respective set of first backside support bridge structures located at a first vertical spacing from the substrate;

second backside trench fill structures located in the second backside trenches, wherein each of the second backside trench fill structures comprises a respective set of second backside support bridge structures located at a second vertical spacing from the substrate that is different from the first vertical spacing, and wherein the second backside trenches do not include the first backside support trench fill structures located at the first vertical spacing from the substrate;

memory openings vertically extending through a respective alternating stack of the alternating stacks; and memory opening fill structures located within a respective one of the memory openings and comprising a respective vertical stack of memory elements and a respective vertical semiconductor channel.

6. The semiconductor structure of claim 5, wherein:

each of the alternating stacks laterally extends along the first horizontal direction through a first memory array region and a second memory array region that are laterally spaced apart by an inter-array region;

the memory opening fill structures are located in the first memory array region and the second memory array region;

each of the alternating stacks comprises a respective plurality of sets of stepped surfaces in the inter-array region;

lateral extents of electrically conductive layers within a respective alternating stack decreases with a vertical distance from the substrate at each set of stepped surfaces;

each set of stepped surfaces underlies and contacts a respective retro-stepped dielectric material portion; and the respective retro-stepped dielectric material portion contacts only one backside trench fill structure selected from the first backside trench fill structures and the second backside trench structures.

7. The semiconductor structure of claim 6, further comprising layer contact via structures vertically extending through a respective subset of the retro-stepped dielectric material portions and contacting a top surface of a respective one of the electrically conductive layers.

* * * * *